(12) United States Patent
Hegblom et al.

(10) Patent No.: US 12,034,273 B2
(45) Date of Patent: Jul. 9, 2024

(54) VERTICAL-CAVITY SURFACE-EMITTING LASER WITH DENSE EPI-SIDE CONTACTS

(71) Applicant: Lumentum Operations LLC, San Jose, CA (US)

(72) Inventors: Eric R. Hegblom, Sunnyvale, CA (US); Albert Yuen, Palo Alto, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 18/166,089

(22) Filed: Feb. 8, 2023

(65) Prior Publication Data

US 2023/0187905 A1 Jun. 15, 2023

Related U.S. Application Data

(63) Continuation of application No. 16/795,172, filed on Feb. 19, 2020, now Pat. No. 11,581,705.
(Continued)

(51) Int. Cl.
  *H01S 5/042* (2006.01)
  *H01S 5/02* (2006.01)
  (Continued)

(52) U.S. Cl.
  CPC ........ *H01S 5/18308* (2013.01); *H01S 5/0208* (2013.01); *H01S 5/04256* (2019.08);
  (Continued)

(58) Field of Classification Search
  CPC .............. H01S 5/18308; H01S 5/0208; H01S 5/04256; H01S 5/18305; H01S 5/18313;
  (Continued)

(56) References Cited

U.S. PATENT DOCUMENTS

| 6,069,908 A | 5/2000 | Yuen et al. |
| 6,257,739 B1 | 7/2001 | Sun et al. |

(Continued)

FOREIGN PATENT DOCUMENTS

| CN | 102136677 A | 7/2011 |
| CN | 102439806 A | 5/2012 |

(Continued)

OTHER PUBLICATIONS

Chirovsky L.M.F., et al., "Implant-Apertured and Index-Guided Vertical-Cavity Surface-Emitting Lasers (I2-VCSEL's)," IEEE Photonics Technology Letters, May 1999, vol. 11 (5), pp. 500-502.
(Continued)

*Primary Examiner* — Yuanda Zhang
(74) *Attorney, Agent, or Firm* — Harrity & Harrity, LLP

(57) ABSTRACT

An emitter may include a substrate, a conductive layer on at least a bottom surface of a trench, and a first metal layer to provide a first electrical contact of the emitter on an epitaxial side of the substrate. The first metal layer may be within the trench such that the first metal layer contacts the conductive layer within the trench. The emitter may further include a second metal layer to provide a second electrical contact of the emitter on the epitaxial side of the substrate, and an isolation implant to block lateral current flow between the first electrical contact and the second electrical contact.

20 Claims, 36 Drawing Sheets

Related U.S. Application Data

(60) Provisional application No. 62/830,963, filed on Apr. 8, 2019.

(51) Int. Cl.
*H01S 5/183* (2006.01)
*H01S 5/40* (2006.01)
*H01S 5/42* (2006.01)

(52) U.S. Cl.
CPC ...... *H01S 5/18305* (2013.01); *H01S 5/18313* (2013.01); *H01S 5/18341* (2013.01); *H01S 5/18358* (2013.01); *H01S 5/4025* (2013.01); *H01S 5/423* (2013.01)

(58) Field of Classification Search
CPC ............ H01S 5/18341; H01S 5/18358; H01S 5/4025; H01S 5/423
See application file for complete search history.

(56) References Cited

U.S. PATENT DOCUMENTS

| | | | |
|---|---|---|---|
| 6,862,309 | B2 | 3/2005 | DeBrabander et al. |
| 8,609,447 | B2 | 12/2013 | Shouji et al. |
| 8,705,585 | B2 | 4/2014 | Sato et al. |
| 8,891,569 | B2 | 11/2014 | Gerlach |
| 10,199,794 | B1 | 2/2019 | Yuen |
| 10,630,048 | B2 | 4/2020 | Yuen |
| 11,581,705 | B2 | 2/2023 | Hegblom et al. |
| 2003/0218666 | A1 | 11/2003 | Holm et al. |
| 2005/0286595 | A1 | 12/2005 | Guenter et al. |
| 2006/0281309 | A1* | 12/2006 | Trezza ............... H01S 5/04257 257/E21.705 |
| 2009/0295902 | A1 | 12/2009 | Sato et al. |
| 2011/0274131 | A1 | 11/2011 | Takaki et al. |
| 2012/0051384 | A1 | 3/2012 | Geske et al. |
| 2013/0051421 | A1 | 2/2013 | Traut et al. |
| 2017/0070027 | A1 | 3/2017 | Kondo et al. |
| 2017/0373471 | A1 | 12/2017 | Kropp et al. |
| 2018/0059430 | A1 | 3/2018 | Mor |
| 2018/0269655 | A1 | 9/2018 | Koyama et al. |
| 2019/0237940 | A1 | 8/2019 | Wong et al. |
| 2020/0203927 | A1 | 6/2020 | Lee et al. |
| 2020/0303904 | A1 | 9/2020 | Park |

FOREIGN PATENT DOCUMENTS

| | | |
|---|---|---|
| CN | 103403986 A | 11/2013 |
| CN | 109524880 A | 3/2019 |
| WO | 2010137389 A1 | 12/2010 |

OTHER PUBLICATIONS

Grabherr M., et al., "High-Power VCSEL's: Single Devices and Densely Packed 2-D-Arrays," IEEE Journal of Selected Topics in Quantum Electronics, May/Jun. 1999, vol. 5 (3), pp. 495-502.

Hegblom E.R., et al., "Small Efficient Vertical Cavity Lasers with Tapered Oxide Apertures," Electronics Letters, Apr. 30, 1998, vol. 34 (9), pp. 895-897.

Ju Y-G., et al., "Densely Packed Pie Shaped Vertical-Cavity Surface-Emitting Laser Array Incorporating a Tapered One-Dimensional Wet Oxidation," IEEE Photonics Technology Letters, May 2000, vol. 12 (5), pp. 462-464.

Krishnamoorthy A.V., et al., "16×16 VCSEL Array Flip-Chip Bonded to CMOS VLSI Circuit," IEEE Photonics Technology Letters, Aug. 2000, vol. 12 (8), pp. 1073-1075.

Lin C-K., et al., "High-Speed 985 nm Bottom-Emitting VCSEL Arrays for Chip-to-Chip Parallel Optical Interconnects," IEEE Journal of Selected Topics in Quantum Electronics, Sep./Oct. 2007, vol. 13 (5), pp. 1332-1339.

Morgan R.A., et al., "Two-Dimensional Matrix Addressed Vertical Cavity Top-Surface Emitting Laser Array Display," IEEE Photonics Technology Letters, Aug. 1994, vol. 6(8), pp. 913-917.

Seurin J-F., et al., "High-power High-efficiency 20 VCSEL Arrays," Vertical-Cavity Surface-Emitting Lasers XII, Proceedings of SPIE, Jan. 29, 2008, vol. 6908, pp. 690808 (1-14).

Thibeault B-J., et al., "Reduced Optical Scattering Loss in Vertical-Cavity Lasers Using a Thin (300 A) Oxide Aperture," IEEE Photonics Technology Letters, May 1996, vol. 8 (5), pp. 593-595.

\* cited by examiner

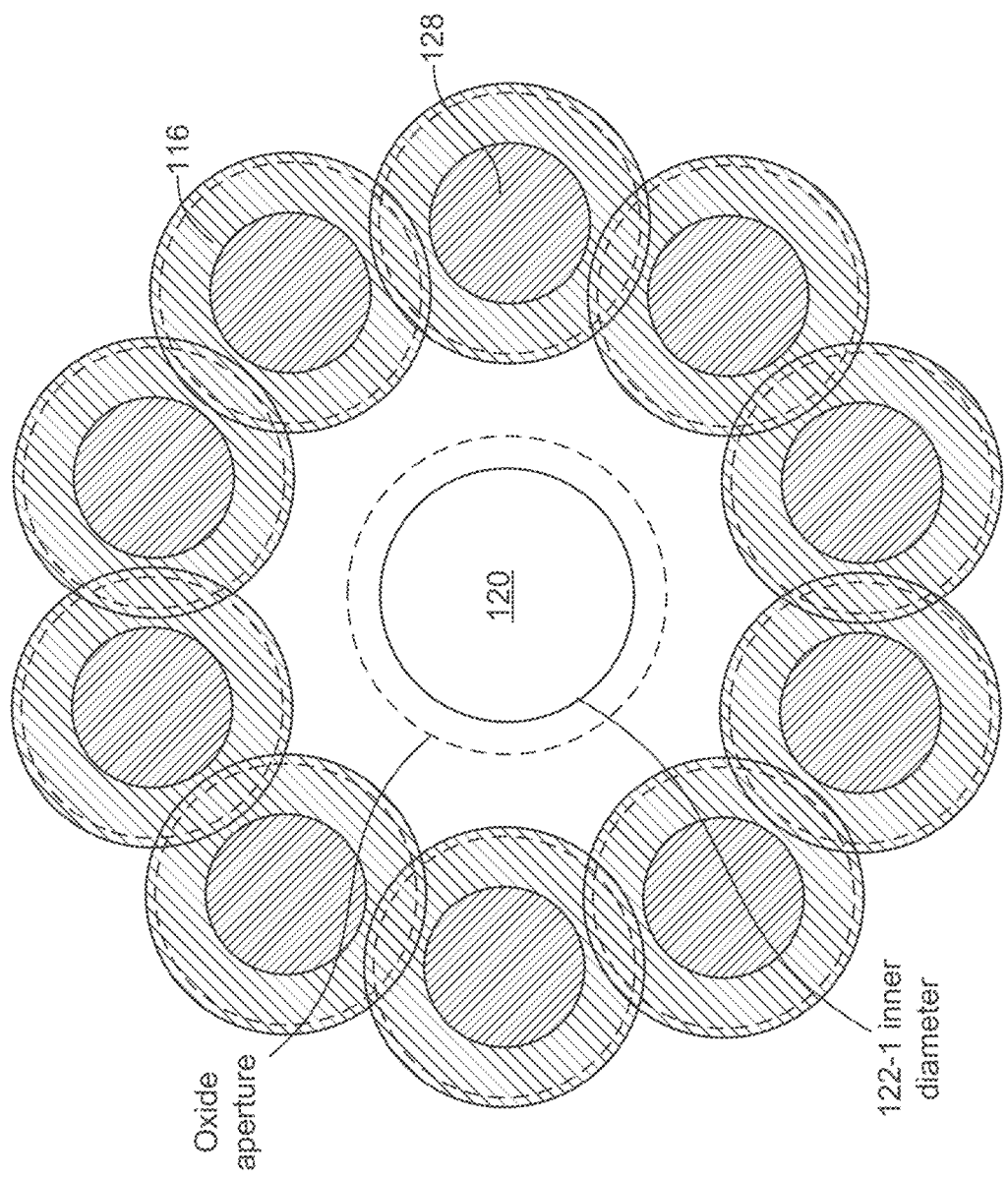
FIG. 7.5

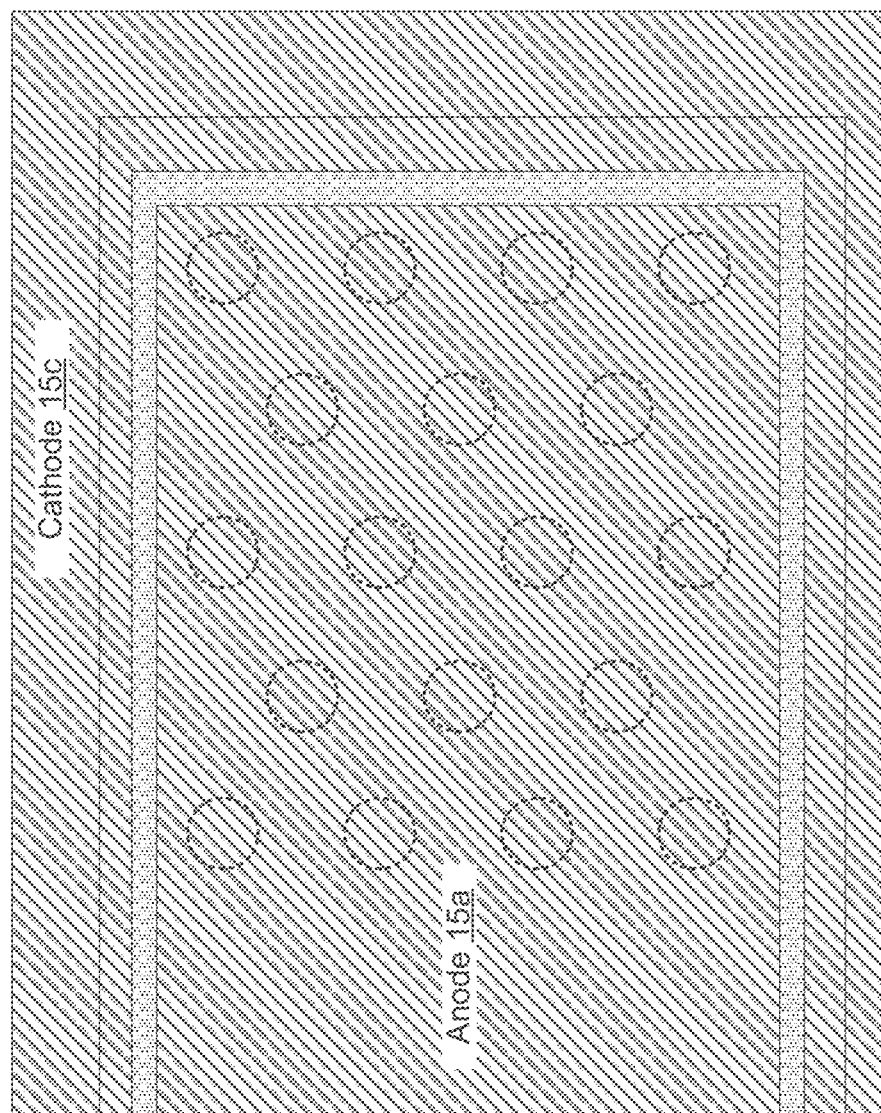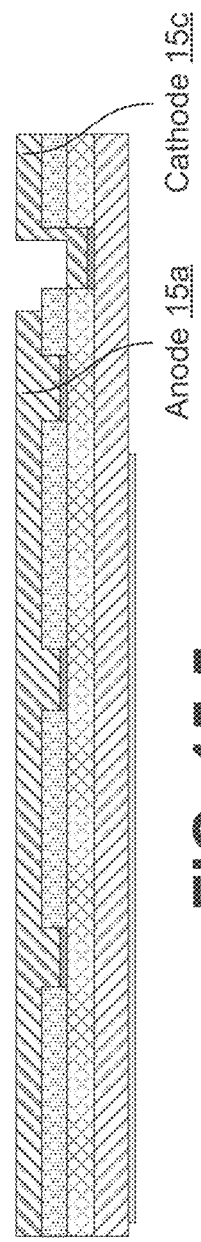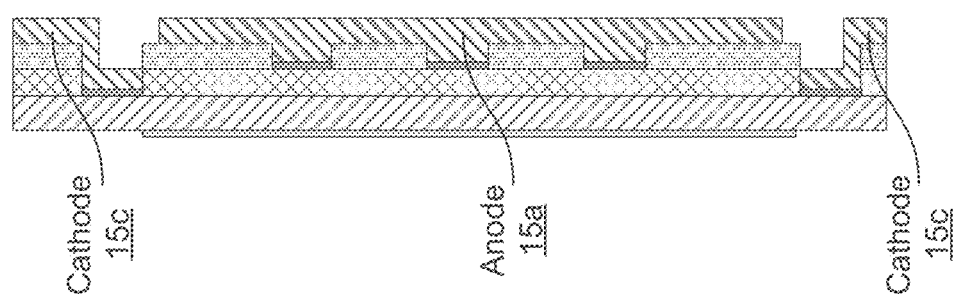
FIG. 15.5 PRIOR ART

|  | A1: NC | A2: +V | A3: NC | A4: +V |
|---|---|---|---|---|
| C1: GND | 0 | 1 | 0 | 1 |
| C2: NC | 0 | 0 | 0 | 0 |
| C3: GND | 0 | 1 | 0 | 1 |
| C4: NC | 0 | 0 | 0 | 0 |

|  | A1: NC | A2: +V | A3: NC | A4: NC |
|---|---|---|---|---|
| C1: NC | 0 | 0 | 0 | 0 |
| C2: NC | 0 | 0 | 0 | 0 |
| C3: GND | 0 | 1 | 0 | 0 |
| C4: NC | 0 | 0 | 0 | 0 |

NC : Not connected
GND: Grounded
+V : Powered
1 = Emitter On

FIG. 27

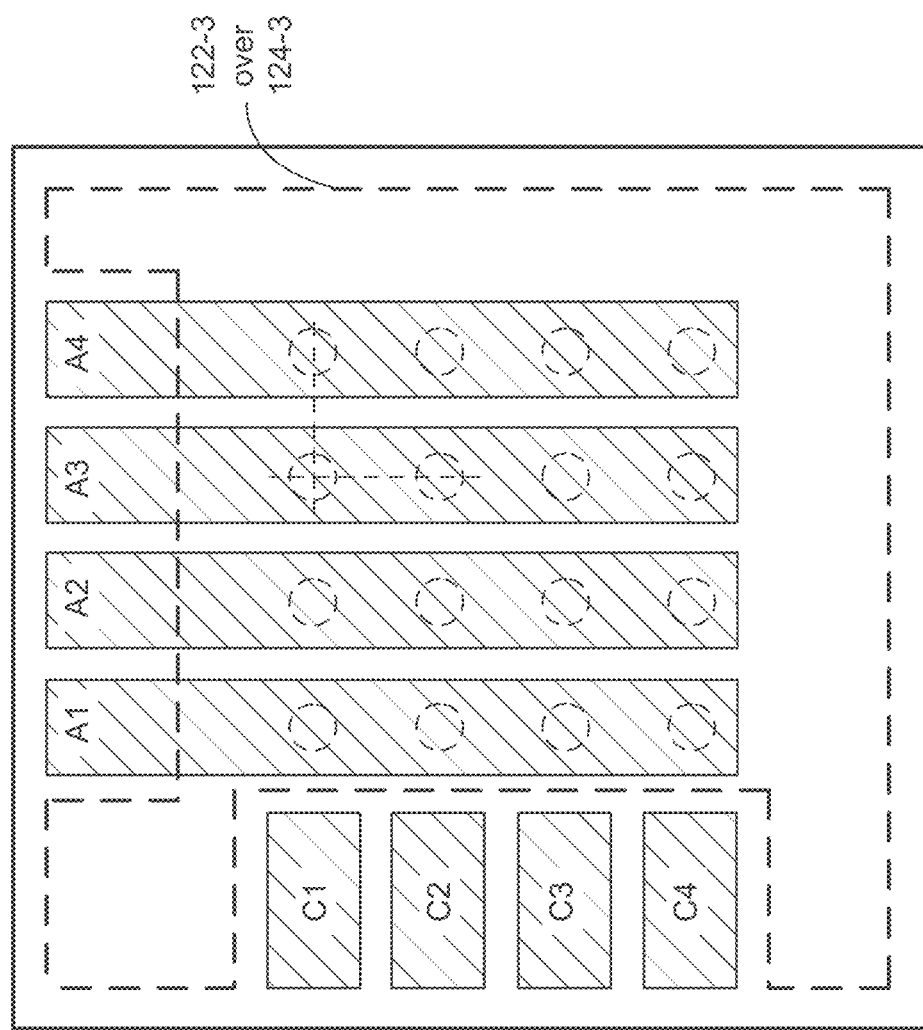
FIG. 32.5

VERTICAL-CAVITY SURFACE-EMITTING LASER WITH DENSE EPI-SIDE CONTACTS

RELATED APPLICATIONS

This application is a continuation of U.S. patent application Ser. No. 16/795,172, filed Feb. 19, 2020 (now U.S. Pat. No. 11,581,705), which claims priority to U.S. Provisional Patent Application No. 62/830,963, filed on Apr. 8, 2019, the contents of which are incorporated herein by reference in their entireties.

TECHNICAL FIELD

The present disclosure relates to a vertical-cavity surface-emitting laser (VCSEL) and, more particularly, to a VCSEL with dense contacts on an epitaxial side of a substrate.

BACKGROUND

A VCSEL array can be employed in a variety of applications, such as a variety of three-dimensional (3D) sensing applications. In some cases, a VCSEL array may include a high number of emitters, typically with separate connections for different groups of emitters.

SUMMARY

According to some possible implementations, an emitter may include: a substrate; a conductive layer on at least a bottom surface of a trench; a first metal layer to provide a first electrical contact of the emitter on an epitaxial side of the substrate, wherein the first metal layer is within the trench such that the first metal layer contacts the conductive layer within the trench; a second metal layer to provide a second electrical contact of the emitter on the epitaxial side of the substrate; and an isolation implant to block lateral current flow between the first electrical contact and the second electrical contact.

According to some possible implementations, a method may include: forming a conductive layer on at least a bottom surface of a trench; forming a first metal layer associated with providing a first electrical contact on an epitaxial side of a substrate of an emitter, wherein the first metal layer is formed within the trench such that the first metal layer contacts the conductive layer within the trench; forming a second metal layer associated with providing a second electrical contact on the epitaxial side of the substrate; and forming an isolation implant associated with blocking lateral current flow between the first electrical contact and the second electrical contact.

According to some possible implementations, a VCSEL may include: a substrate; a conductive layer on at least a bottom surface of a trench; a first metal layer that contacts the conductive layer within the trench, wherein the first metal layer is to provide a first electrical contact of the VCSEL on an epitaxial side of the substrate; a second metal layer over the first metal layer, wherein the second metal layer is to provide a second electrical contact of the VCSEL on the epitaxial side of the substrate; and an isolation implant that surrounds an aperture of the VCSEL and is between the aperture and an interior sidewall of the trench, wherein the isolation implant is to block lateral current flow between the first electrical contact and the second electrical contact.

BRIEF DESCRIPTION OF THE DRAWINGS

FIGS. 24-27 are diagrams illustrating examples associated with a row-column addressable array of VCSELs having dense electrical contacts on an epitaxial side of a substrate, as described herein.

DETAILED DESCRIPTION

Figure 1:
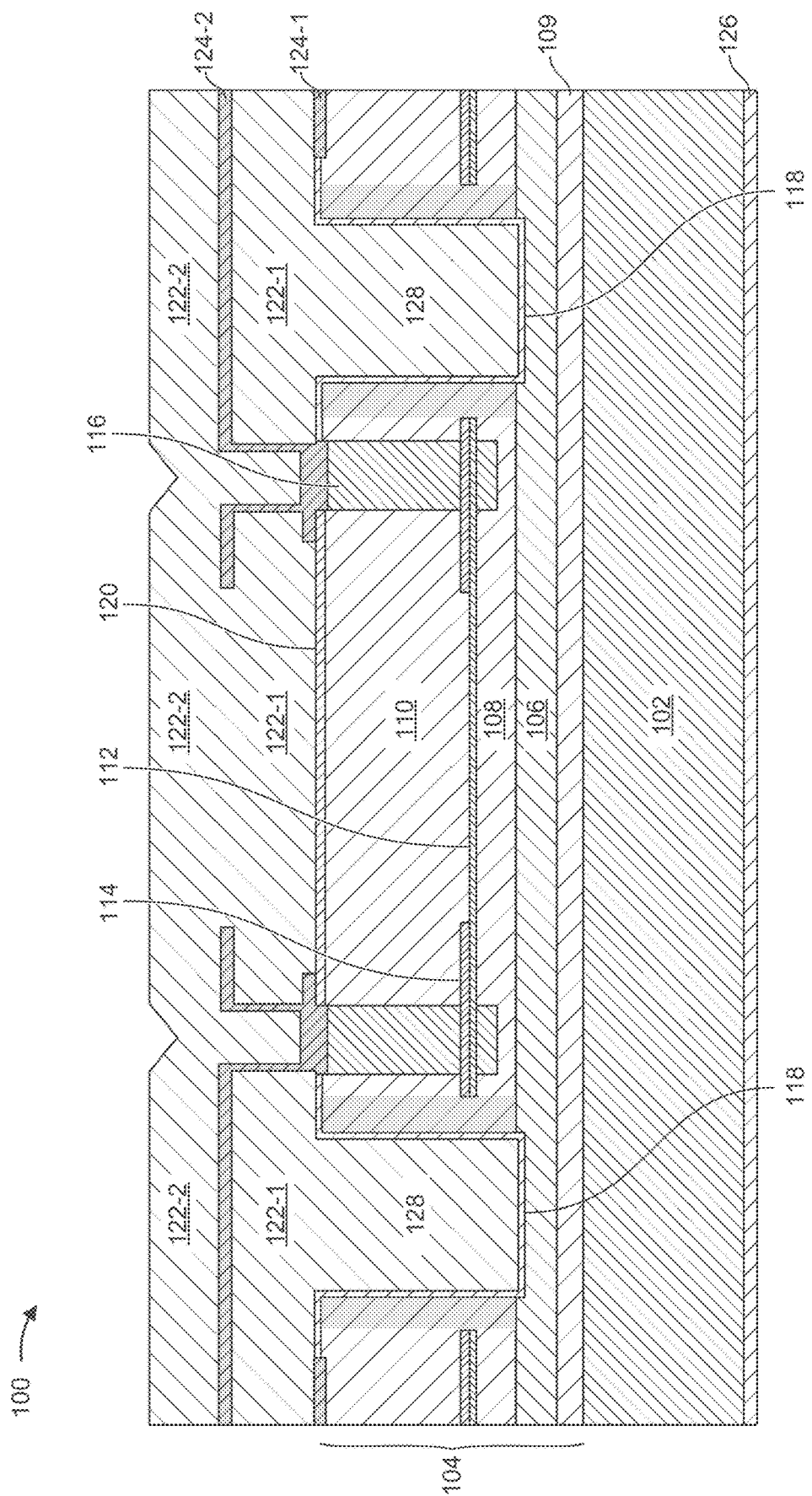
FIGS. 1-8 are diagrams illustrating examples associated with VCSELs including dense electrical contacts on an epitaxial side of a substrate, as described herein.

The following detailed description of example implementations refers to the accompanying drawings. The same reference numbers in different drawings may identify the same or similar elements.

A VCSEL array may be used in a variety of 3D sensing applications, such as a structured light application, a time-of-flight (ToF) application, a LIDAR application, and/or the like. In some such applications, a VCSEL array may include a high number of VCSELs (e.g., more than fifty emitters). In these applications, VCSELs in a given emitter group in the VCSEL array may need to be driven with a common electrode (rather than individually), and it may be desirable to maintain a relatively tight pitch (e.g., less than approximately 90 microns (µm)) between a given pair of VCSELs in the VCSEL array (e.g., as demanded for a structured light application, as desired in a ToF application in order to maximize efficiency in usage of die area). However, as described below, a conventional VCSEL structure has a number of disadvantages when used in such an application.

Some implementations described herein provide a VCSEL with dense electrical contacts (anode and cathode contacts) on an epitaxial side of a substrate (a side of the substrate on which an epitaxial structure is grown, herein referred to as an epi-side). The VCSEL with dense epi-side contacts alleviates a number of issues that result from use of a conventional VCSEL structure for tightly packed emitters driven by a common electrode, as described in further detail below. Further, the VCSEL with dense epi-side contacts facilitates a number of useful VCSEL configurations, such as connection of VCSEL arrays in series, series connection of concentric VCSEL arrays, and fabrication of a row-column addressable VCSEL array, as described in further detail below.

In some implementations, a VCSEL with dense epi-side contacts provides improved power conversion efficiency (e.g., in a VCSEL array comprising bottom-emitting VCSELs) and simpler fabrication of a VCSEL array comprising VCSELs (e.g., bottom-emitting VCSELs or top-emitting VCSELs) connected electrically in series on the same chip (e.g., as compared to a VCSEL array comprising VCSELs with a conventional structure).

In some implementations, the VCSEL with dense epi-side contacts improves uniformity and power conversion efficiency of a dense array of bottom-emitting VCSELs (e.g., a VCSEL array with center-to-center spacing that is less than approximately 90 μm) by allowing use of a substrate with little or no carrier concentration (e.g., a semi-insulating substrate) and, consequently, providing lower optical absorption than a substrate with a typical carrier concentration levels.

In some implementations, the VCSEL with dense epi-side contacts allows a chip of a VCSEL array to be bonded without wirebonds, which would otherwise add to inductance and, hence, add significant parasitic voltage (e.g., particularly when emitters are rapidly switched simultaneously, as required for a ToF or LIDAR application).

In some implementations, the VCSEL with dense epi-side contacts improves power conversion efficiency of a VCSEL array with a higher optical power per emitter (e.g., greater than approximately 20 milliwatts (mW)) and which also needs to maintain lower numerical aperture (NA) (e.g., less than approximately 0.2) or a lower $M^2$ (product of beam waist and beam divergence) (e.g., similar to smaller emitters which emit less power).

In some implementations, the VCSEL with dense epi-side contacts improves uniformity, improves power conversion efficiency, and enables simple fabrication of VCSEL arrays which are connected electrically in series monolithically (e.g., a bottom-emitting VCSEL array or a top-emitting VCSEL array). In some implementations, a series arrangement may allow a driver for the VCSEL arrays to operate at a relatively higher voltage, but relatively lower current, which reduces voltage from inductive and resistive losses transferring power between the driver and the VCSEL array.

In some implementations, the VCSEL with dense epi-side contacts improves reliability and uniformity of large VCSEL arrays by better controlling current between relatively hotter and relatively colder regions of the VCSEL array.

In some implementations, the VCSEL with dense epi-side contacts provides a compact design that enables realization of a VCSEL array that is row/column addressable.

In some implementations, the VCSEL with dense epi-side contacts enables a VCSEL array with tight center-to-center emitter spacing (e.g., less than 90 μm) with both electrical contacts (an anode contact and a cathode contact) around each VCSEL on an epitaxial side of a substrate. The design permits this tight center-to-center spacing to be retained even for large arrays (e.g., a VCSEL with hundreds of emitters) arranged in, for example, a grid, a hexagonal close packed structure, or an arbitrary fashion.

A VCSEL array including VCSELs with dense epi-side contacts differs from an arrangement in which a VCSEL array of high density with a high number of emitters (e.g., more than fifty emitters) has only one electrical contact (e.g., anode) on the epi-side of the substrate. Additionally, the VCSEL array including VCSELs with dense epi-side contacts differs from a prior art arrangement in which a VCSEL array has both anode and cathode contacts for each emitter on the epi-side of the wafer, but also has a wide center-to-center spacing (e.g., greater than approximately 90 μm, and typically approximately 250 μm). Further, the VCSEL array including VCSELs with dense epi-side contacts differs from an arrangement in which a VCSEL has cathode and anode contacts on the epi-side and having a small pitch (e.g., 30 μm), but which has VCSELs arranged in a circle or ring pattern and have a feature (e.g., a mesa type structure) that prevents such arrays from being scaled to arrays with hundreds of emitters (e.g., arranged in a grid or another fashion) while retaining the small pitch in two orthogonal dimensions.

FIG. 1 is a diagram illustrating an example cross-section of a VCSEL 100 including dense electrical contacts on an epitaxial side of a substrate. VCSEL 100 may be included in an array of VCSELs 100, as described in further detail below. Notably, while VCSEL 100 is illustrated as a bottom-emitting VCSEL (i.e., a VCSEL that emits light through the substrate), a VCSEL with dense epi-side contacts may also be implemented as a top-emitting VCSEL (i.e., a VCSEL that emits light through an epitaxial side of the substrate), as described below.

As shown in FIG. 1, VCSEL 100 may include a substrate 102, an epitaxial structure 104 (e.g., including a contact layer 106, a bottom mirror 108, a top mirror 110, an active region 112, an oxidation layer 114, and an isolation implant 116), a bottom conductive layer 118, a top conductive layer 120, a set of metal layers 122 (e.g., a first metal layer 122-1 and a second metal layer 122-2, a set of isolation layers 124 (e.g., a first isolation layer 124-1 and a second isolation layer 124-2), an anti-reflective (AR) coating 126, and one or more trenches 128 (shown as being filled with first metal layer 122-1). In some implementations, VCSEL 100 may be manufactured using a series of procedures. For example, one or more layers of VCSEL 100 may be created using one or more growth procedures, one or more deposition procedures, one or more etching procedures, one or more oxidation procedures, one or more implantation procedures, one or more metallization procedures, and/or the like.

Substrate 102 includes a substrate upon which epitaxial structure 104 is grown. In some implementations, substrate layer may be formed from a semiconductor material, such as gallium arsenide (GaAs), indium phosphide (InP), and/or another type of semiconductor material.

Epitaxial structure 104 includes a set of layers grown on or above substrate 102. For example, epitaxial structure 104 may include epitaxial layers forming an optical resonator including a pair of reflectors (e.g., a pair of DBRs, a pair of dielectric mirrors, and/or the like), an active gain medium (herein referred to as an active region), one or more epitaxial layers that form one or more apertures (e.g., for optical and/or electrical confinement), and/or the like, as described below. In some implementations, epitaxial structure 104 may include a set of AlGaAs layers grown on substrate 102 (e.g., a GaAs substrate). In some implementations, epitaxial structure 104 may be grown on substrate 102 using a metal-organic chemical vapor deposition (MOCVD) technique, a molecular beam epitaxy (MBE) technique, and/or the like. As shown, epitaxial structure 104 of VCSEL 100 may include contact layer 106, bottom mirror 108, p-n-p-n blocking layer 109, top mirror 110, active region 112, and oxidation layer 114.

Figure 2:
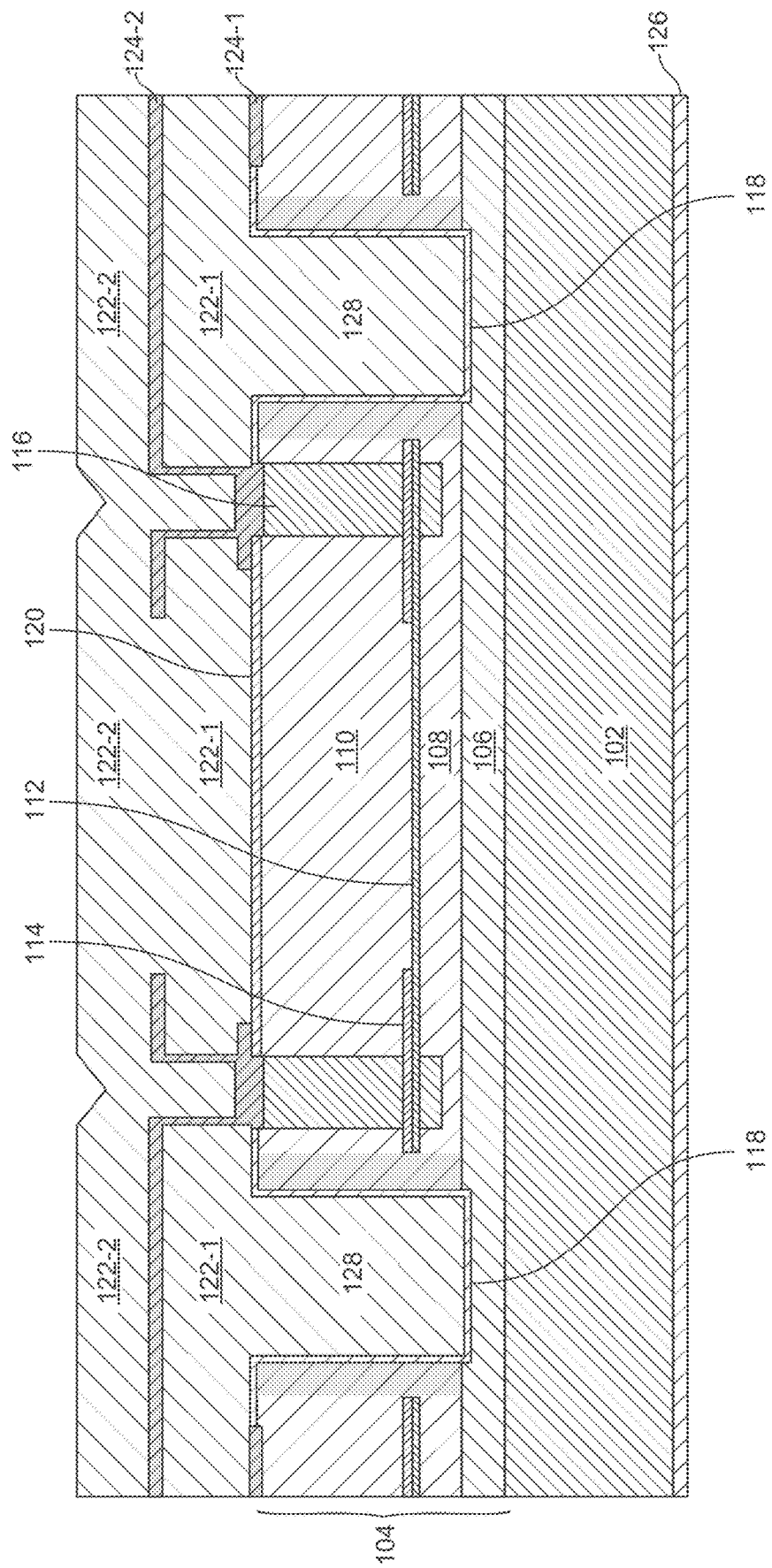

Contact layer 106 includes a layer associated with providing electrical contact to bottom mirror 108. In some implementations, contact layer 106 may be formed from, for example, n-doped AlGaAs, and may have a thickness in range from approximately 0.07 μm to approximately 2 μm. As shown, in some implementations, contact layer 106 may be formed with epitaxial structure 104 (i.e., within the semiconductor epitaxial layers of VCSEL 100). As further shown, in some implementations, a bottom of one or more trenches 128 may reside within contact layer 106. In some implementations, contact layer 106 may reside within bottom mirror 108 or below bottom mirror 108. In some implementations, as shown in FIG. 1, contact layer 106 may be within or below bottom mirror 108, and above a set of p-n-p-n blocking layers 109, belonging to epitaxial structure 104, which are layers not designed to provide additional reflectivity. Notably, if p-n-p-n blocking layers 109 are designed to provide additional reflectivity, p-n-p-n blocking layers 109 may be considered part of bottom mirror 108. Alternatively, in some implementations, contact layer 106 may be formed on substrate 102 and below bottom mirror 108, an example of which is illustrated in FIG. 2.

Bottom mirror 108 includes a bottom reflector (e.g., a reflector proximal to substrate 102) of an optical resonator of VCSEL 100. For example, bottom mirror 108 may include a semiconductor DBR, a dielectric mirror (placed below the contact layer 106), and/or the like. In some implementations, bottom mirror 108 may have a thickness in a range from approximately 3.5 μm to approximately 9 μm (e.g., 5 μm).

Top mirror 110 includes a top reflector (e.g., a reflector distal to substrate 102) of an optical resonator of VCSEL 100. For example, top mirror 110 may include a semiconductor DBR, a dielectric mirror, and/or the like. In some implementations, top mirror 110 may have a thickness in a range from approximately 2 μm to approximately 6 μm (e.g., 4 μm).

Figure 9:
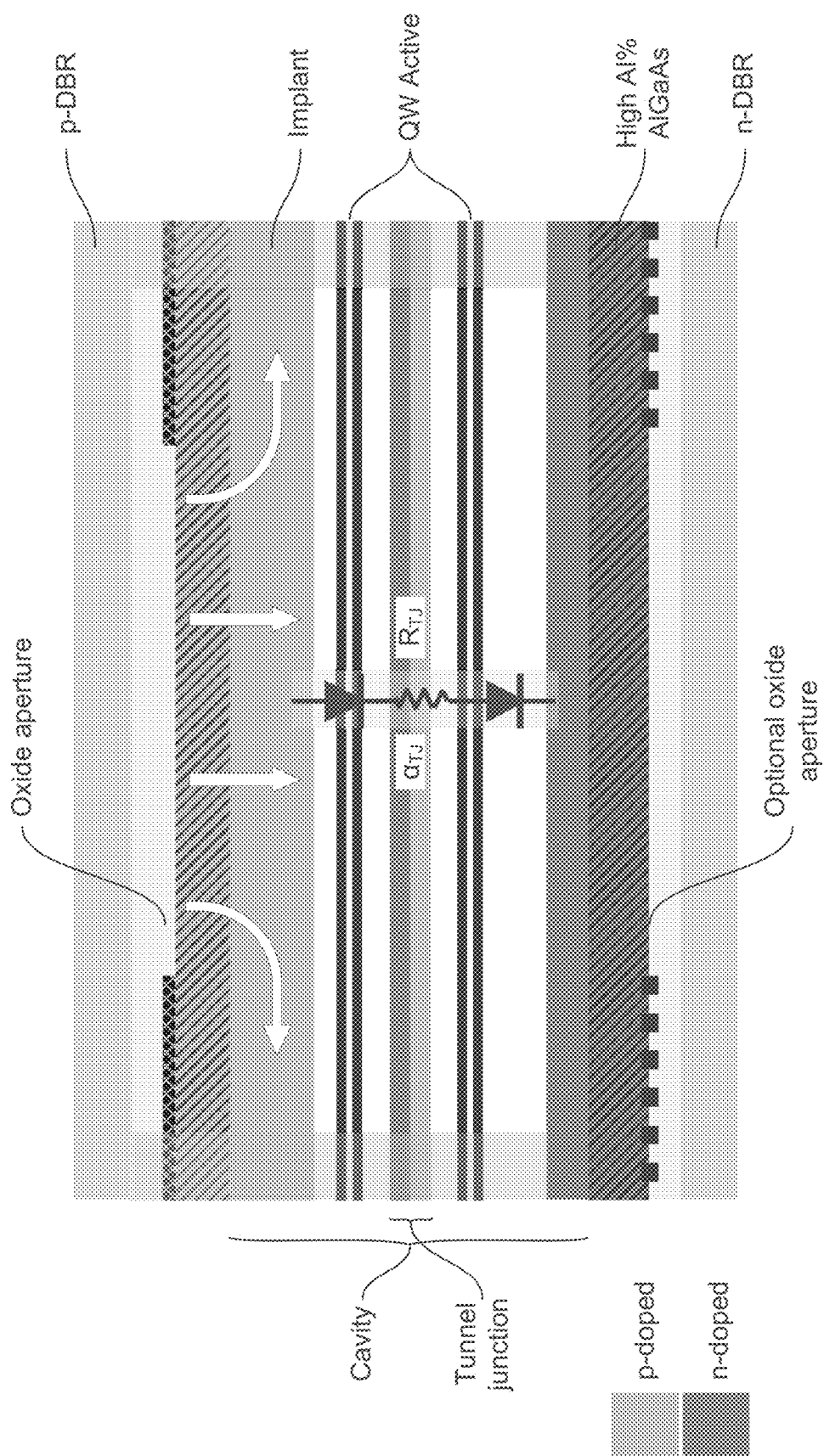
FIG. 9 is a diagram illustrating an example of an active region including multiple p-i-n junctions connected vertically in series with tunnel junctions between each p-i-n junction.

Active region 112 includes one or more layers where electrons and holes recombine to emit light and define the emission wavelength range of the VCSEL 100. For example, active region 112 may include one or more quantum wells. In some implementations, active region 112 may include one or more cavity spacer layers between top mirror 110 and bottom mirror 108. The optical thickness of active region 112 (including cavity spacer layers) and optical thickness of top mirror 110 and bottom mirror 108 define the resonant cavity wavelength of the VCSEL 100, which may be designed within an emission wavelength range of the active region to enable lasing. In some implementations, active region 112 may have a thickness in a range from approximately 0.06 μm to approximately 0.5 μm (e.g., 0.15 μm, or 0.30 μm). In some implementations, active region 112 may include a single p-i-n junction, as illustrated in FIG. 1. Alternatively, active region 112 may include multiple (e.g., two or three) p-i-n junctions connected vertically in series with tunnel junctions between each p-i-in junction, an example of which is shown in FIG. 9.

Oxidation layer 114 includes a set of oxidized layers that provides optical and electrical confinement. In some implementations, oxidation layer 114 may be formed as a result of oxidation of one or more epitaxial layers of epitaxial structure 104. For example, oxidation layer 114 may be an aluminum oxide ($Al_2O_3$) layer formed as a result of oxidation of one or more epitaxial layers (e.g., AlGaAs layers, aluminum arsenide (AlAs) layers, and/or the like). In some implementations, as shown in FIG. 1, oxidation layer 114 may be near (e.g., adjacent to, but below, top mirror 110). In some implementations, oxidation layer 114 may have a thickness in a range from approximately 0.007 μm to approximately 0.04 μm (e.g., 0.02 μm).

In some implementations, trenches 128 etched around VCSEL 100 (e.g., illustrated in VCSEL 100 as being filled with first metal layer 122-1) may allow steam to access the epitaxial layer(s) from which oxidation layer 114, and an associated oxide aperture, are formed. Oxidation layer 114 may define the oxide aperture (e.g., an optically active aperture). In some implementations, the oxide aperture may be a non-circular shape, but a circle of approximately the same area may have a diameter in a range from approximately 1 μm to approximately 150 μm (e.g., 5 μm, or 8 μm). In some implementations, a size of the oxide aperture may depend on a width of one or more trenches 128 that surround VCSEL 100. For example, one or more trenches 128 may be etched to expose the epitaxial layer from which oxidation layer 114 is formed. Here, oxidation of the epitaxial layer may occur for a particular distance toward a center of VCSEL 100, thereby forming oxidation layer 114 and the oxide aperture.

Isolation implant 116 includes a material that provides electrical isolation. For example, isolation implant 116 may include an ion implanted material (e.g., created using an ion implantation process), such as a hydrogen/proton implanted material or a similar implanted element that provides reduced conductivity. In some implementations, isolation implant 116 may act to prevent lateral current flow (i.e., current flow not going through contact layer 106) between the electrical contacts of VCSEL (e.g., between the cathode and anode contacts of VCSEL 100). In some implementations, isolation implant 116 may surround an aperture of VCSEL 100 and may be formed between the aperture and an interior sidewall of trench 128, as shown in FIG. 1. In some implementations, an array of VCSELs 100 may be formed on an electrically conductive substrate (e.g., a doped substrate) and may include an isolation structure between adjacent VCSELs 100 to provide horizontal electrical isolation between the adjacent beta coefficients and/or a buffer structure to provide electrical isolation between VCSEL 100 and the substrate, as described in U.S. Pat. No. 10,199,794, issued on Feb. 5, 2019, which is incorporated by reference herein in its entirety.

Bottom conductive layer 118 includes a layer associated with providing a first electrical contact (e.g., a cathode contact) on an epitaxial side of VCSEL 100. For example, bottom conductive layer 118 may be an ohmic contact metal (e.g., an n-contact metal, such as AuGeNi or PdGe). In some implementations, when the epitaxial layers are reversed in type (with the lower mirror being p-type and the upper mirror n-type), contact layer 106 may be a p-type ohmic contact formed from, for example, ZnAu or an ohmic tunnel contact formed on, for example, highly doped AlGaAs to Au with a diffusion barrier such as Pt or W or Ni, or the like. In some implementations, bottom conductive layer 118 may be on at least a bottom surface of trench 128. For example, as shown in FIG. 1, bottom conductive layer 118 may on the bottom surface of trench 128, as well as along sidewalls of trench 128 and/or around a perimeter of trench 128 at the top of trench 128. In some implementations, bottom conductive layer 118 may have a thickness in a range from approximately 0.05 μm to approximately 0.5 μm (e.g., 0.3 μm).

Top conductive layer 120 includes a layer associated with providing a second electrical contact (e.g., an anode contact) on an epitaxial side of VCSEL 100. For example, top conductive layer 120 may be an ohmic contact metal (e.g., a p-contact metal). In the case of a bottom-emitting VCSEL, as shown in FIG. 1, top conductive layer 120 may be formed on a top surface of epitaxial structure 104 over an emission area of VCSEL. In some implementations, top conductive layer 120 may have a thickness in a range from approximately 0.05 μm to approximately 0.5 μm (e.g., 0.2 μm). In the case of a top-emitting VCSEL, top conductive layer 120 may have a ring shape, a slotted ring shape, a tooth wheel shape, or another type of circular or non-circular shape (e.g., depending on a design of the VCSEL), as noted below.

Metal layer 122 (e.g., first metal layers 122-1, second metal layer 122-2, and/or the like) includes a metallic layer associated with providing electrical contacts of VCSEL 100 on an epitaxial side of substrate 102. For example, portions of first metal layer 122-1 and/or second metal layer 122-2 may provide a first electrical contact (e.g., a cathode contact) on the epi-side of VCSEL 100, while other portions of first metal layer 122-1 and/or second metal layer 122-2 may provide a second electrical contact (e.g., an anode contact) on the epi-side of VCSEL 100. In some implementations, portions of first metal layer 122-1 and second metal layer 122-2 may be separated by portions of one or more isolation layers 124. In some implementations, first metal layer 122-1 and/or second metal layer 122-2 may be relatively thick (e.g., with a thickness of at least approximately 1 μm, but typically less than approximately 5 μm) in order to carry sufficient current, and may be plated. In some implementations, a seed metal (e.g., Ti/Au or TiWAu) for first metal layer 122-1 may be overlaid on bottom conductive layer 118, while a seed metal for second metal layer 122-2 may be overlaid on top conductive layer 120. As shown in FIG. 1, first metal layer 122-1 may be formed within trench 128 such that first metal layer 122-1 contacts bottom conductive layer 118 within trench 128. In some implementations, as shown in FIG. 1, a portion of first metal layer 122-1 may contact a portion of second metal layer 122-2 over an emission area of VCSEL 100. Alternatively, in some implementations, first metal layer 122-1 is not present over the emission area of VCSEL 100, as described below.

Isolation layer 124 (e.g., first isolation layer 124-1, second isolation layer 124-2, and/or the like) includes an electrical isolation layer (e.g., a dielectric layer, such as $SiO_2$ or SiN or may additionally include a polymer layer, like polyimide) to electrically isolate, for example, a portion of a given metal layer 122 from a portion of another metal layer 122 (e.g., to isolate a portion of first metal layer 122-1 from a portion of second metal layer 122-2) or from another portion of the given metal layer 122 (e.g., to isolate a first portion of first metal layer 122-1 from a second portion of first metal layer 122-1). In some implementations, a given isolation layer 124 may include one or more vias for electrically connecting portions of one or more layers 122. In some implementations, a portion of a given isolation layer 124 may be disposed between portions of a given metal layer 122 (e.g., in openings other than emission openings) to electrically isolate one portion of the given metal layer 122 from another portion of the given metal layer 122.

AR coating 126 includes a thin-film coating (e.g., a dielectric thin-film coating) designed to reduce optical reflectivity (reflectance) of an optical surface of substrate 102 (e.g., a bottom surface of substrate 102 in VCSEL 100).

Trench 128 includes an opening that allows oxygen (e.g., dry oxygen, wet oxygen) to access the epitaxial layer from which oxidation layer 114 is formed. In some implementations, as shown in FIG. 1, trench 128 may be formed such that a bottom trench 128 is on or within contact layer 106. Here, bottom conductive layer 118 may be formed within trench 128 such that bottom conductive layer 118 contacts contact layer 106 at least at the bottom surface of trench 128, thereby providing electrical contact to bottom mirror 108 through trench 128 (e.g., through the portion of first metal layer 122-1 and bottom conductive layer 118 within trench 128). In some implementations, as shown in FIG. 1, a portion of first metal layer 122-1 may be formed over trench 128 (e.g., such that trench 128 is filled with first metal layer 122-1). In some implementations, trench 128 may have a width of less than approximately 10 μm and, in some cases, may be less than approximately 2 μm (e.g., in order to minimize emitter-to-emitter pitch in an array of VCSELs 100). Generally, a width of trench 128 may be less than a depth of trench 128.

Figure 3:
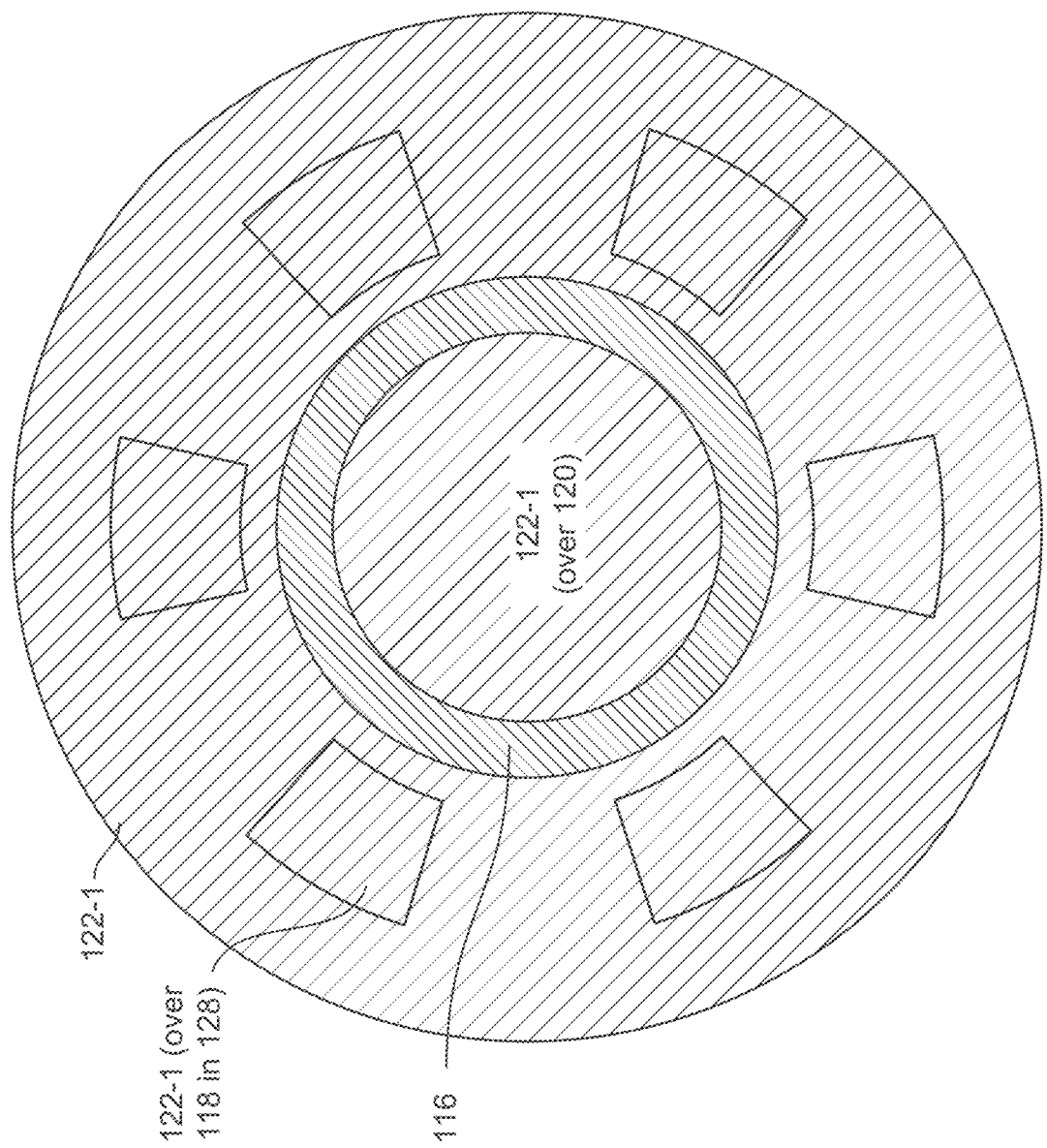

FIG. 3 is a diagram of an example plan view illustrating a region of isolation implant 116 and the surrounding first metal layer 122-1 for a single VCSEL 100. Edges of trenches 128 into which first metal layer 122-1 drops to make connection with bottom conduction layer 118 in association with providing a first epi-side contact are also shown. As further shown, electrically isolated portions of first metal layer 122-1 may be formed over top conductive layer 120 (in the center circular portion of VCSEL 100) in association with providing a second epi-side contact. Notably, in this example, a significant portion of first metal layer 122-1 may be used for electrically connecting first epi-side contacts (e.g., cathodes) of groups of VCSELs 100 in an array of VCSELs 100, while second metal layer 122-2 (not shown) may be used for electrically connecting second epi-side contacts (e.g., anodes) of the groups of VCSELs 100 in the array of VCSELs 100. In some implementations, to facilitate tiling of VCSELs 100 in a honeycomb structure and/or sharing of trenches 128 between VCSELs 100 for a tight pitch, trenches 128 may have a shape other than the trapezoidal shape shown in FIG. 3, such as a hexagonal shape, a circular shape, or another type of shape with six-fold symmetry.

One notable feature of the design of VCSEL 100 in, for example, FIG. 1 is that a material for providing a first epi-side contact (e.g., which can be bottom conductive layer 118 or a seed layer of first metal layer 122-1) is formed directly against a surface of a sidewall of trench 128, which can be either a semiconductor material of the epitaxy or an oxidized semiconductor of the epitaxy. Here, the material for providing the first epi-side contact may include a metallic and/or a conductive non-metallic layer, such as silicon (e.g., amorphous or polycrystalline), graphite, indium tin oxide, titanium nitride, titanium oxide, nickel oxide, platinum silicide, and/or the like. In some implementations, this direct contact of the first epi-side contact material to the semiconductor or native oxidized semiconductor also may extend around a perimeter of trench 128 on a top surface of epitaxial structure 104, as shown in FIGS. 1 and 2.

This design of VCSEL 100 permits bottom conductive layer 118 (e.g., the ohmic contact), the seed metal for first metal layer 122-1, and first metal layer 122-1 to be fabricated without requiring any photolithographic features within trench 128. Because trench 128 may be several microns deep and of narrower width than depth, forming lithographic features within trench 128 is challenging, and may not be possible (e.g., especially when emitter to emitter spacing is small, such as less than 40 μm).

Notably, the layers formed along a sidewall of trench 128 (e.g., which can include bottom conductive layer 118, the seed metal of first metal layer 122-1, or first metal layer 122-1) may electrically short top mirror 110 to bottom mirror 108. However, placement of isolation implant 116 around the oxide aperture of VCSEL 100, but inside of the inner radius of trench 128, blocks lateral current flow (i.e., current flow not going through contact layer 106) between the electrical contacts of VCSEL 100. Thus, any electrical short along the trench sidewall to bottom mirror 108 does not interfere with functionality of VCSEL 100.

For some other top-emitting VCSEL arrangements, sidewalls (and a bottom) of a trench used for oxidation have been covered with a dielectric passivation layer. Coverage of the sidewalls of the trench with a dielectric passivation could also be done for VCSEL 100, but sidewall coverage typically requires conformal coating that will also coat the bottom of the trench. In VCSEL 100, a bottom of trench 128 needs to be accessed for electrical contact, which conventionally would require photolithography within trench 128 and force a width of trench 128 to be relatively large (e.g., 13 μm or more). However, such a width of trench 128 does not permit dense (e.g., less than approximately 30 μm) emitter to emitter spacing and, therefore, the dielectric passivation approach is not preferred.

Notably, VCSEL 100 is shown with an oxide aperture (e.g., defined by oxidation layer 114). However, electrical and optical confinement need not be restricted to an oxide aperture. For example, in some implementations, electrical and optical confinement may be provided with an n-p-n blocking structure or isolation implantation. In such cases, the means for electrical and optical confinement would occupy approximately the same region of VCSEL as the oxide aperture of VCSEL 100.

In some implementations, second electrical contact (e.g., anode contact) is made on an upper surface of epitaxial structure 104 (e.g., centered nominally over the oxide aperture of VCSEL 100). Here, top conductive layer 120 associated with the second electrical contact (e.g., p-metal associated with an anode) and bottom conductive layer 118 associated with the first electrical contact (e.g., n-contact metal associated with the cathode) may be laterally separated by only a few microns (e.g., less than approximately 3 μm, such as 1 μm). Such a small gap may be needed in order to permit formation of a high-density VCSEL array. However, the gap required may be too small for individual bond pads to each VCSEL 100 of an array of VCSELs 100 on a submount (e.g., when the VCSEL array is flip-clip mounted). Rather, such gaps need to be tens of microns with conventional technology. Instead, groups of VCSELs 100 in an array of VCSELs 100 may share a single first electrical contact (e.g., a single cathode contact) and a single second electrical contact (e.g., a single anode contact). In some implementations, the first electrical contacts of VCSELs 100 may be cathodes that are electrically connected in parallel by first metal layer 122-1. In a given VCSEL 100 in such an array, a portion of first metal layer 122-1 may be above (and connect to) top conductive layer 120 to promote a planar top surface (e.g., as required for flip-chip mounting). However, in such a case, the portion of first metal layer 122-1 that lies above top conductive layer 120 does not make electrical contact to the portion of the first metal layer 122-1 connected the cathode of VCSEL 100. For example, the portion of first metal layer 122-1 that lies above top conductive layer 120 may be isolated from the portion of the first metal layer 122-1 that connects the cathode by second isolation layer 124-2, as shown in FIG. 1. In such an implementation, second metal layer 122-2 is formed above the first metal layer 122-1 and above second isolation layer 124-2 so that second metal layer 122-2 does not contact first metal layer 122-1 other than in regions where vias are formed over the anode contact to each VCSEL 100 (e.g., and possibly other vias around bond pads).

In some implementations, isolation implant 116 may be formed around the oxide aperture of VCSEL 100 and beneath a gap in first metal layer 122-1 in order to allow first metal layer 122-1 to serve as a mask for implantation. As a result, a need for thick photoresist to mask the implant is eliminated. This is particularly advantageous for a bottom-emitting VCSEL 100 because the implant generally needs to go deeper than for a top-emitting VCSEL 100 (e.g., since a top mirror 110 is typically thicker in a bottom-emitting VCSEL 100) in order to better reflect the light through substrate 102. A deep proton implant of, for example, several hundred kiloelectron volts (keV) may require more than six microns (e.g., and up to 10 μm) of photoresist, which is challenging, and in some cases not possible, to pattern with a narrow opening (e.g., with a width of possibly less than 2 μm). In contrast, plating (e.g., gold plating) has a substantially greater stopping power than photoresist, and a 2 μm thickness of gold plating, for example, may be sufficient to stop a high energy proton implant from substantially reaching a semiconductor of VCSEL 100. In some implementations, plating can be patterned with a thinner photoresist, which can accommodate relatively small (e.g., approximately 2 μm) feature sizes. When plating is used to substantially mask isolation implant 116, isolation implant 116 may extend slightly (e.g., approximately 0.5 μm or less) under the plating in some cases (e.g., when implantation is performed at an angle, when there is a lateral straggle as the implant travels into the semiconductor, when a thickness of the plating does not abruptly change at the gap in first metal layer 122-1) and, therefore, may not completely stop the implant from reaching the semiconductor in some cases. However, such extension of the implant under first metal layer 122-1 should not impact operation of VCSEL 100.

Figure 4:
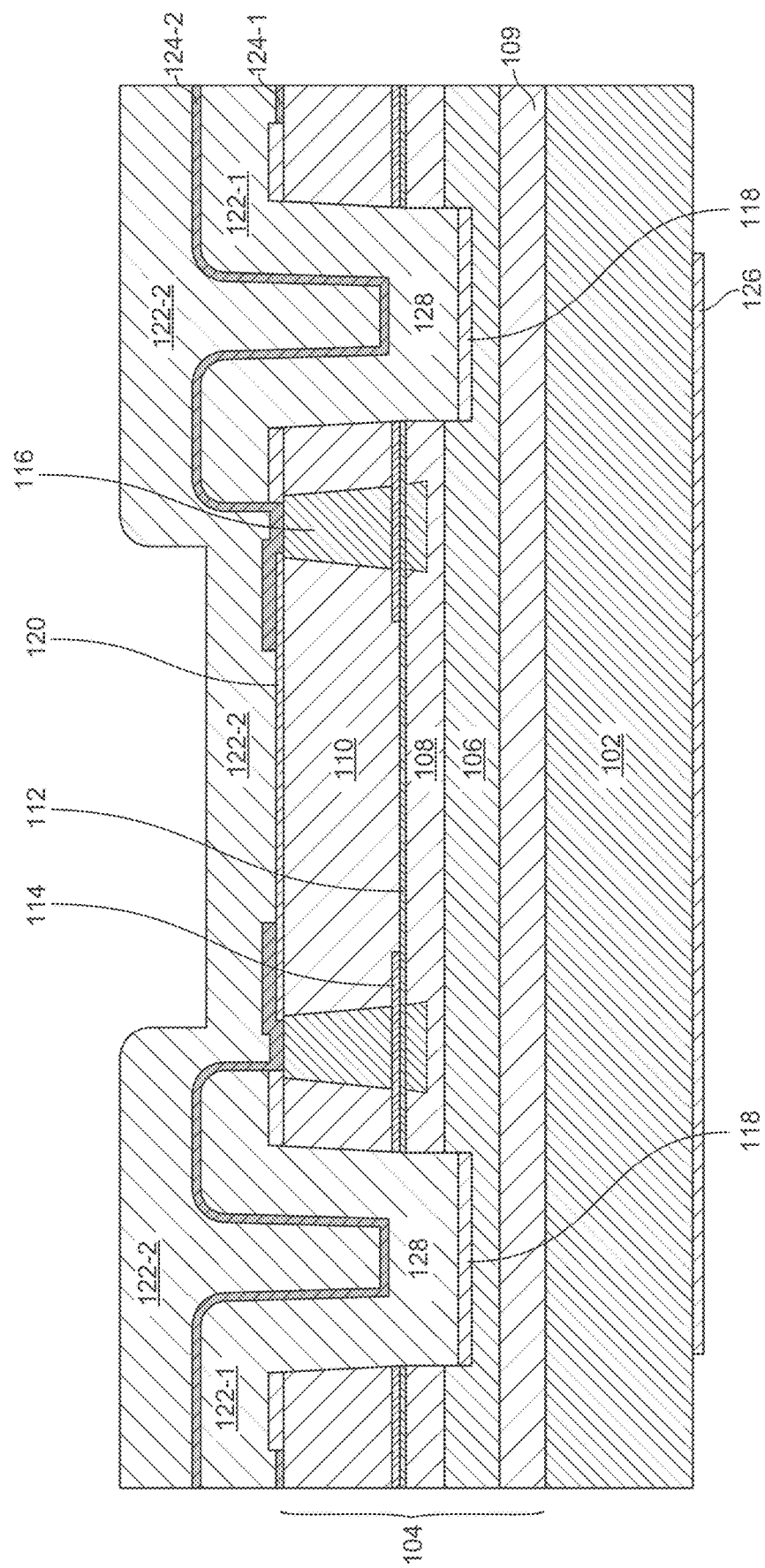
Figure 5:
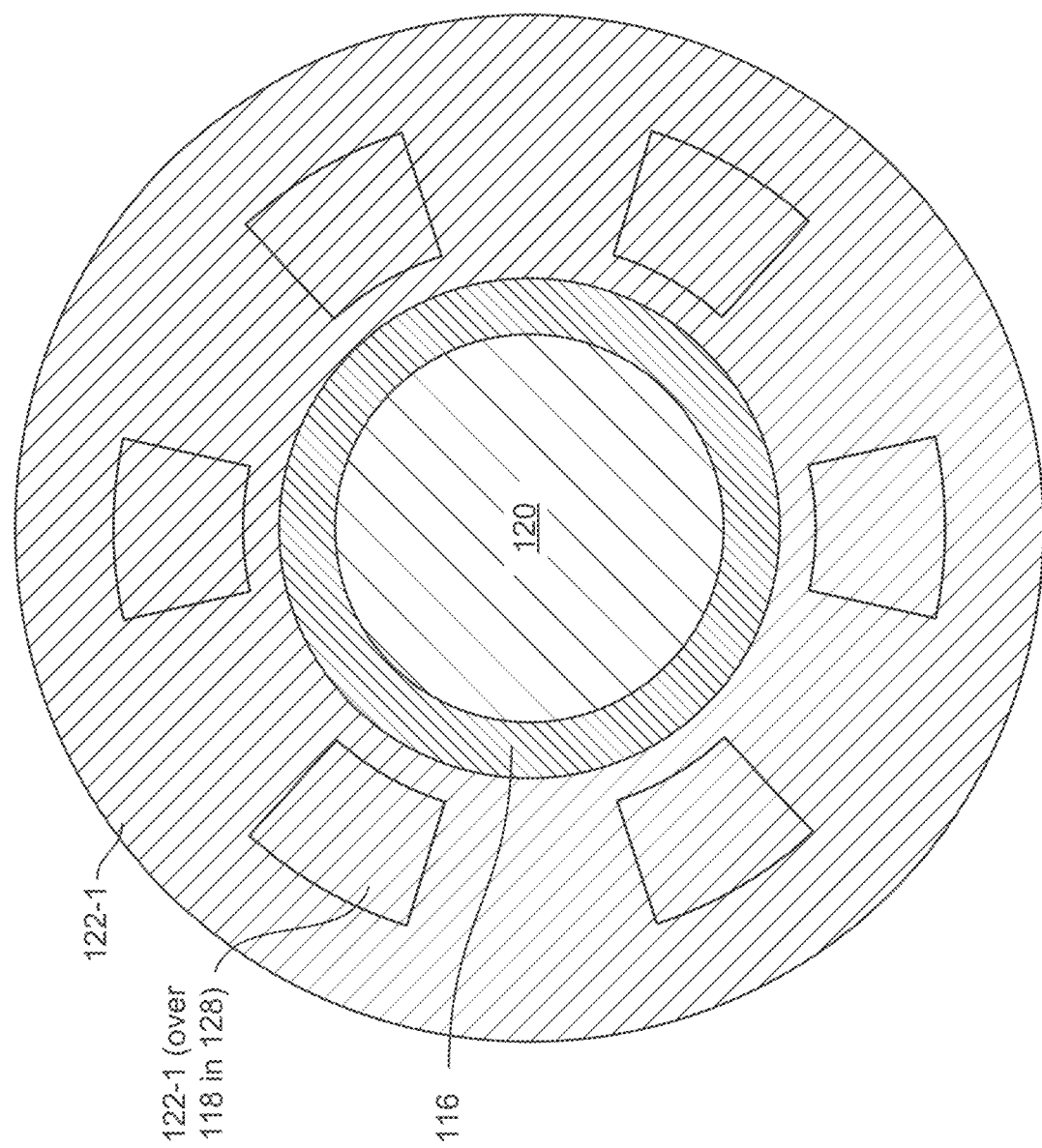

FIGS. 4 and 5 illustrate a cross-section and a plan view, respectively, of an alternate design for VCSEL 100 having similar features to those of the design shown in FIG. 1. In this example, isolation implant 116 is formed within an inner diameter of first metal layer 122-1, and is formed outside the inner diameter of the oxide aperture. Here, first metal layer 122-1 may be used to mask the implantation from bottom conductive layer 118, but a photoresist may be used to mask the implantation from an emission area of VCSEL 100 (e.g., over the oxide aperture). By using this design, there is no need to define narrow features (e.g., features having a width of less than approximately 2 μm) in the implant photoresist, even though a resulting region of implantation may be that narrow. Similar to the design shown in FIG. 1, isolation implant 116 lies around the oxide aperture, but inside the inner diameter of trenches 128 and blocks lateral current flow between the electrical contacts of VCSEL 100. Additionally, similar to the design shown in FIG. 1, bottom conducting layer 118 is formed directly against a surface of a sidewall of trench 128, which can be either a semiconductor material of the epitaxy or oxidized semiconductor of the epitaxy, as described above. In some implementations, to facilitate tiling of VCSELs 100 in a honeycomb structure and/or sharing of trenches 128 between VCSELs 100 for a tight pitch, trenches 128 may have a shape other than the trapezoidal shape shown in FIG. 5, such as a hexagonal shape, a circular shape, or another type of shape with six-fold symmetry.

Figure 6:
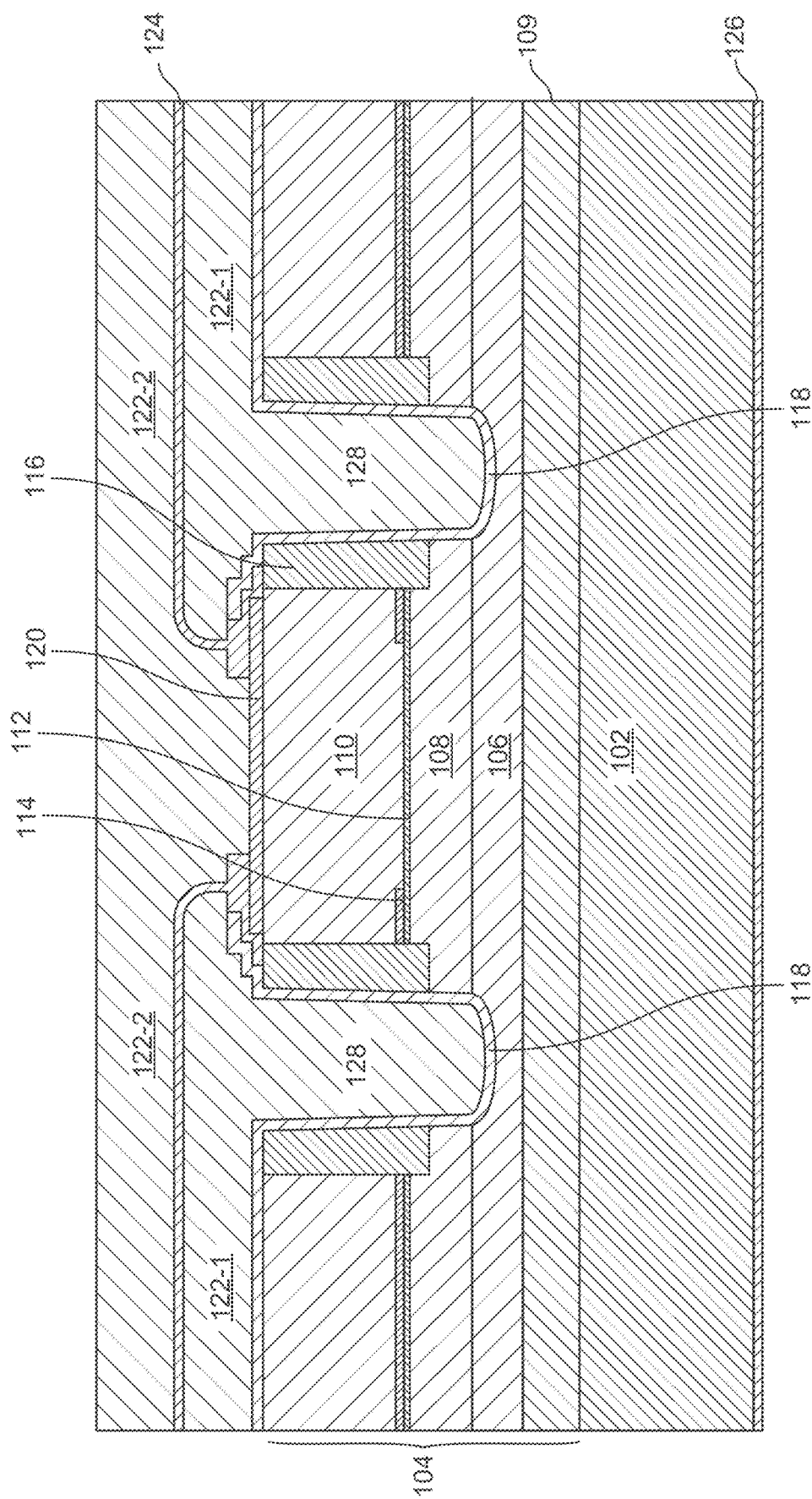
Figure 7:
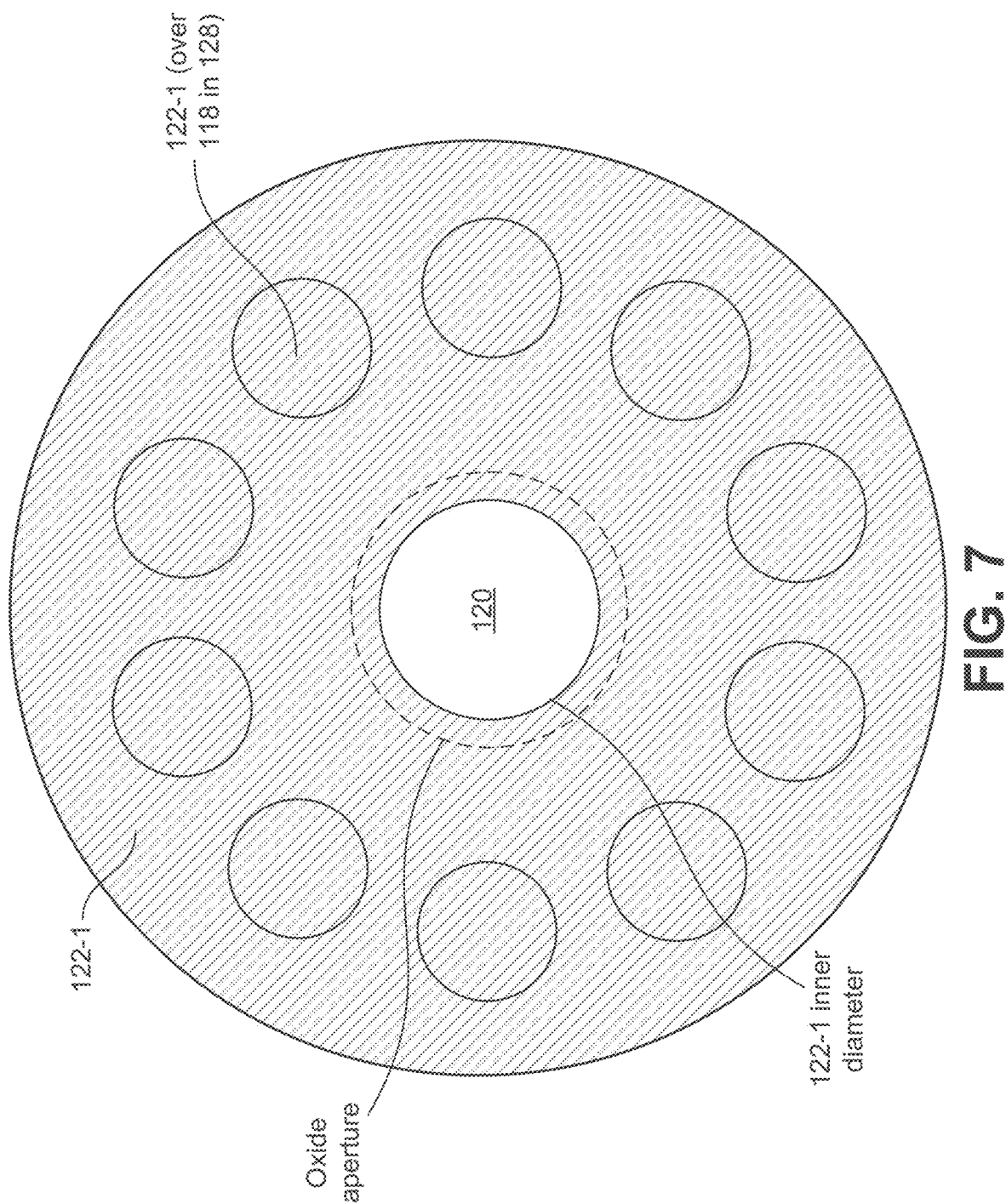

FIGS. 6, 7, and 7.5 illustrate a cross-section and a pair of plan views of another alternate design for VCSEL 100 having similar features to those of the design shown in FIG. 1. Here, isolation implant 116 extends from an upper portion of a sidewall of each trench 128. FIG. 7 shows a plan view at metal layer 122-1, while FIG. 7.5 shows the same plan view, but with metal layer 122-1 being transparent. Notably, trenches 128 are shown in FIGS. 7 and 7.5 as being circular in shape, but could be another shape (e.g., hexagonal, octagonal, and/or the like). In this embodiment, isolation implant 116 lies around the oxide aperture, and surrounds each of the trenches 128, and extends so as to overlap with the ion implant surrounding each adjacent trench 128 and thus blocks lateral current flow between the electrical contacts of VCSEL 100. Additionally, similar to the design shown in FIG. 1, bottom conductive layer 118 is formed directly against a surface of a sidewall of trench 128, which can be either a semiconductor material of the epitaxy or oxidized semiconductor of the epitaxy, as described above.

Figure 8:
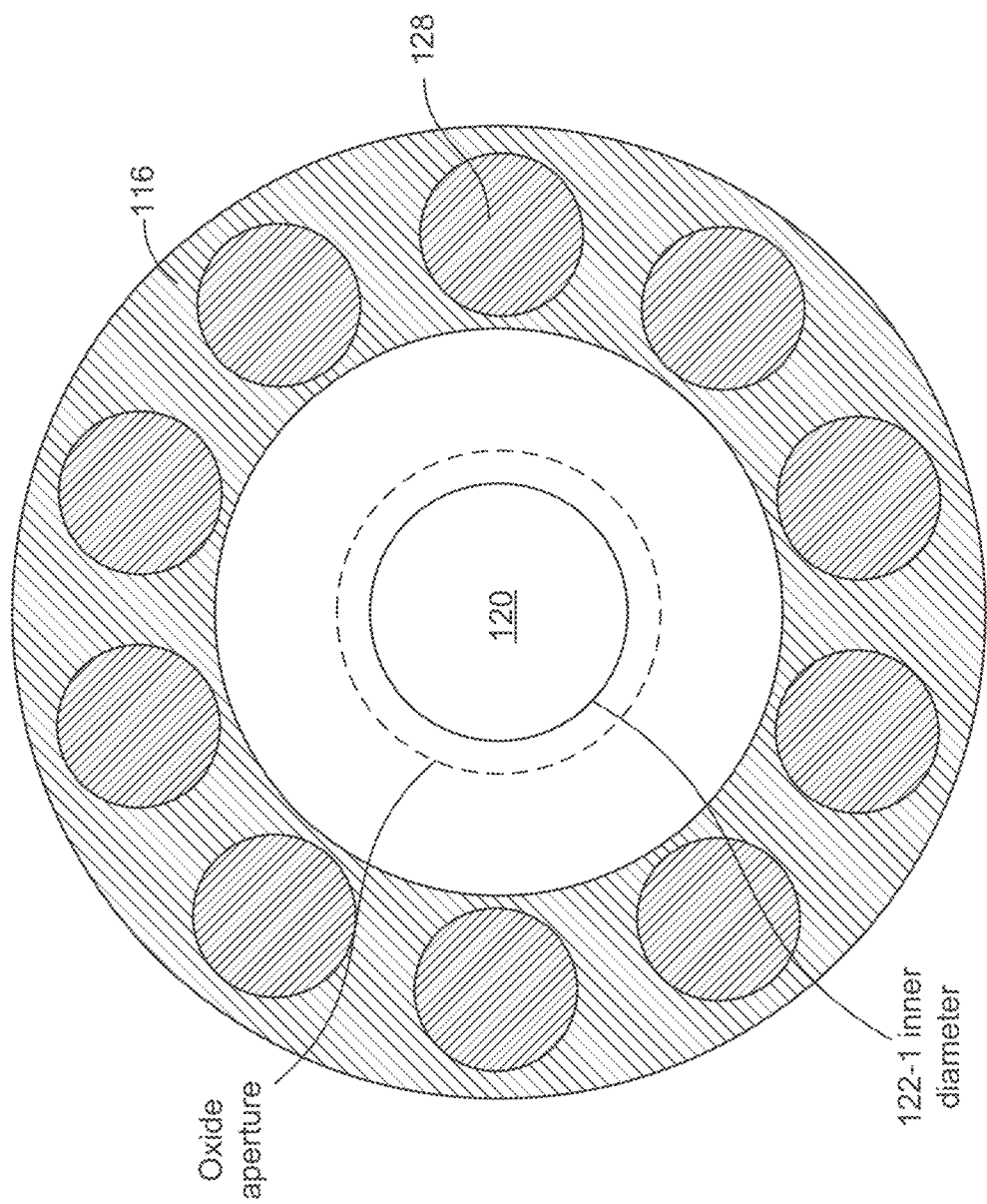

Notably, while FIG. 7 shows regions of isolation implant 116 as rings around each trench 128, these regions of isolation implant 116 may alternatively be formed in a single ring, as illustrated in FIG. 8. In FIG. 8, metal layer 122-1 is transparent, as in FIG. 7.5, but may be similar to that shown in FIG. 7. Further, an inner diameter of first metal layer 122-1 need not be smaller than a diameter of the oxide aperture, but could be larger than the diameter of the oxide aperture. Fabrication of a VCSEL 100 using the design illustrated in FIG. 8 may be more easily performed when ion implantation is performed before trenches 128 are formed. However, a high temperature oxidation step (e.g., typically greater than approximately 380° C.) can significantly anneal out implantation damage. If implantation is performed after oxidation and penetrates a bottom of trench 128, then it may also be possible to etch a wider trench 128 around the original trench 128 in order to reach an undamaged bottom conductive layer 118. The design, however, may require wider and deeper trenches, and may increase difficulty when fabricating closely spaced emitters (e.g., less than approximately 40 μm of spacing). Further detail on features common to the above-described designs for VCSEL 100 are provided below.

The number and arrangement of layers of VCSEL 100 shown in FIGS. 1-9 are provided as examples. In practice, VCSEL 100 may include additional layers, fewer layers, different layers, differently arranged layers, layers of different thicknesses, layers of different relative thicknesses, layers having different patterning, and/or the like, than those shown in FIGS. 1-9. Additionally, or alternatively, a set of layers (e.g., one or more layers) of VCSEL 100 may perform one or more functions described as being performed by another set of layers of VCSEL 100.

In some implementations, as illustrated in association with the above described designs for VCSEL 100, first metal layer 122-1 may be used for electrically connecting first electrical contacts (e.g., cathodes) of VCSELs 100 in an array of VCSELs 100, and second metal layer 122-2 may be used for electrically connecting second electrical contacts (e.g., anodes) of VCSELs 100 in the array of VCSELs 100. However, in some implementations, first metal layer 122-1 may be used for electrically connecting second electrical contacts (e.g., anodes) of VCSELs 100 in an array, and first metal layer 122-1 may be used for electrically connecting first electrical contacts (e.g., cathodes) of VCSELs 100 in the array.

Figure 10:
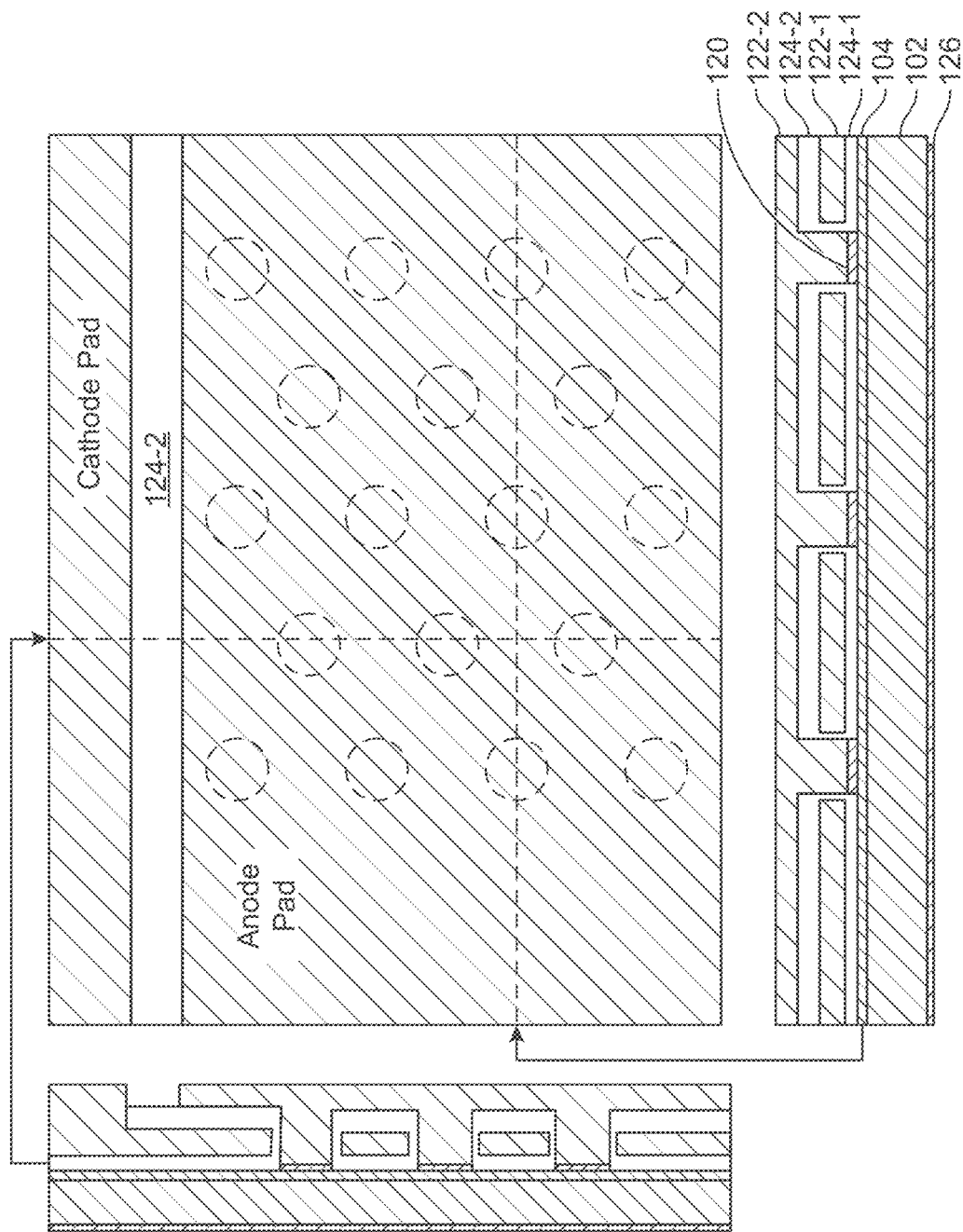
FIGS. 10-16 are diagrams illustrating examples associated with arrays of VCSELs having dense electrical contacts on an epitaxial side of a substrate, as described herein.

FIG. 10 is a diagram illustrating a plan view of an example array of VCSELs 100, along with cross-sections through lines identified in FIG. 10. For purposes of clarity, isolation implants 116, trenches 128, and bottom conductive layers 118 are not shown in FIG. 10. Further, while FIG. 10 illustrates one configuration of layers 124-1, 122-1, 124-2, and 122-2, other configurations are possible as described above. Further, while FIG. 10 illustrates an array of VCSELs 100 that includes 18 emitters, the array may include a different (e.g., higher) number of emitters (e.g., 18 rows and 18 columns of VCSELs 100). Additionally, the arrangement of VCSELs 100 in such an array is not limited to a hexagonal close packed structure as shown in FIG. 10.

Figure 11:
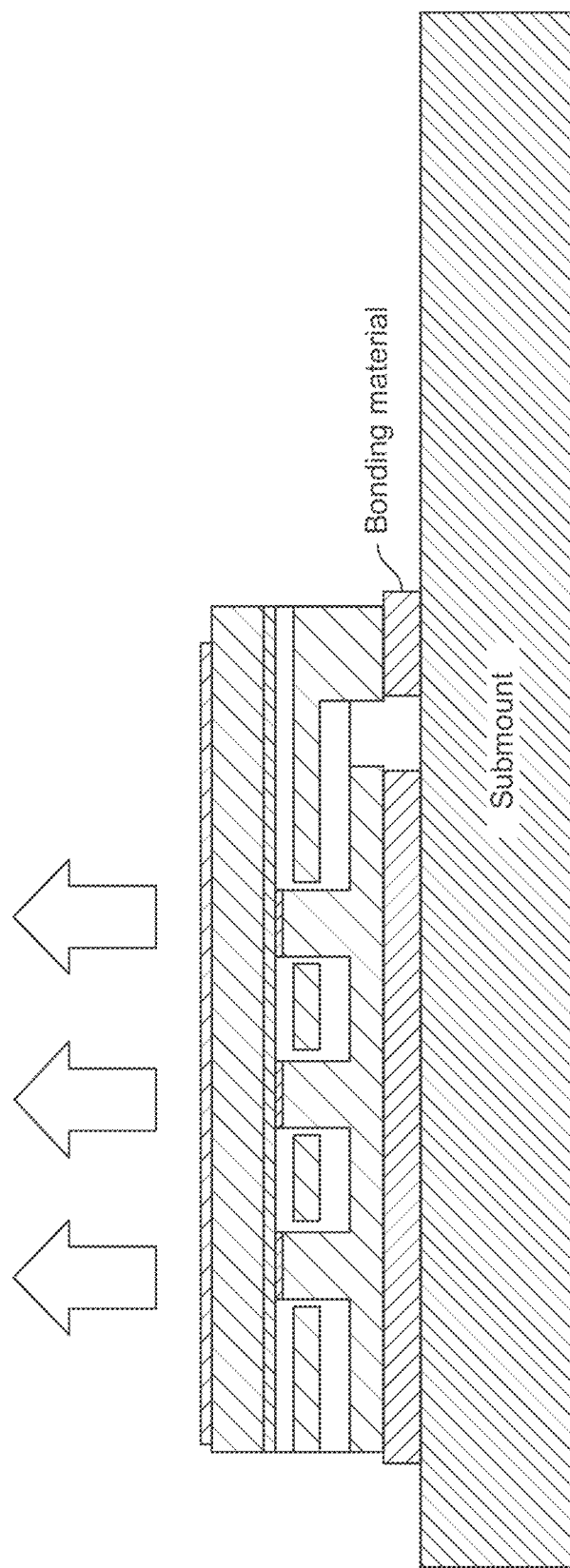

For a large array of VCSELs 100 (e.g., an array including more than 50 emitters) several watts of power may need to be dissipated. A chip including the array of VCSELs 100 may itself be relatively thin (e.g., approximately 100 μm). Therefore, a thermal contact may be needed in order for heat to flow vertically (rather than laterally). Such a thermal contact may need to be made directly under VCSELs 100 in the array. In contrast to an array of conventional VCSELs that is used for data communication, bonding to a heat sink cannot be far away (e.g., more than approximately 50 μm) from an emission area (e.g., because of the high density of emitters and poor lateral heat flow). Thus, for an array of bottom-emitting VCSELs 100, a surface may need to be substantially planar and a material (e.g., typically plated metal) on the surface is to be bonded to a submount. FIG. 11 is a diagram illustrating an example of such bonding using the array layout shown in FIG. 10. In FIG. 11, the array of FIG. 10 is flip chip bonded to the submount (e.g. the dense epi-side contacts are bonded to the substrate). The arrows in FIG. 11 indicate the direction of emission from the bottom emitting VCSELs in the array. In some implementations, the bonding material may be solder, a compression bond, epoxy, and/or the like.

In some implementations, bonding to more than one contact pad can be achieved for an array of VCSELs 100. One benefit of enabling bonding to more than one contact pad is elimination of wirebonds, which would add inductance, and a need for a higher voltage. Another benefit of enabling bonding to more than one contact pad is the ability to have multiple anode contacts (e.g., in case not all VCSELs 100 are driven in parallel). This design flexibility has benefits for applications such as structured light and ToF 3D sensing.

As shown in FIG. 10, in some implementations, there may be a lateral gap between the anode and cathode pads of an array of VCSELs 100. Without impact to emitter-to-emitter spacing (e.g., center-to-center spacing), this gap can be made to be, for example, tens of micrometers (e.g., approximately 30 μm to approximately 200 μm) in order to ensure that the bonding material does not electrically short the cathode and anode pads together. Separation of the cathode and anode pads to accommodate flip-chip bonding and achieve good thermal contact under the emitters is also possible for other layouts.

Figure 12:
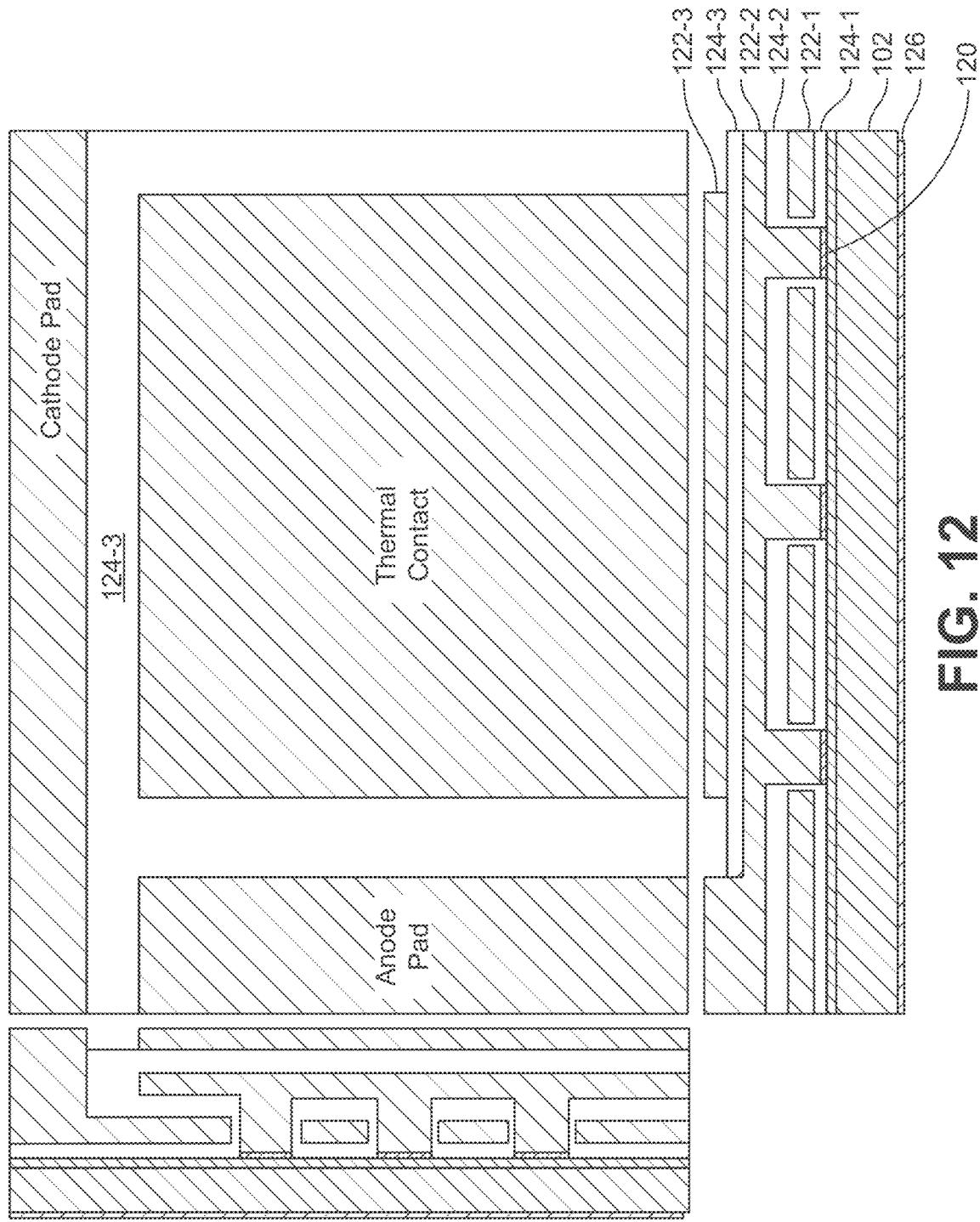
Figure 13:
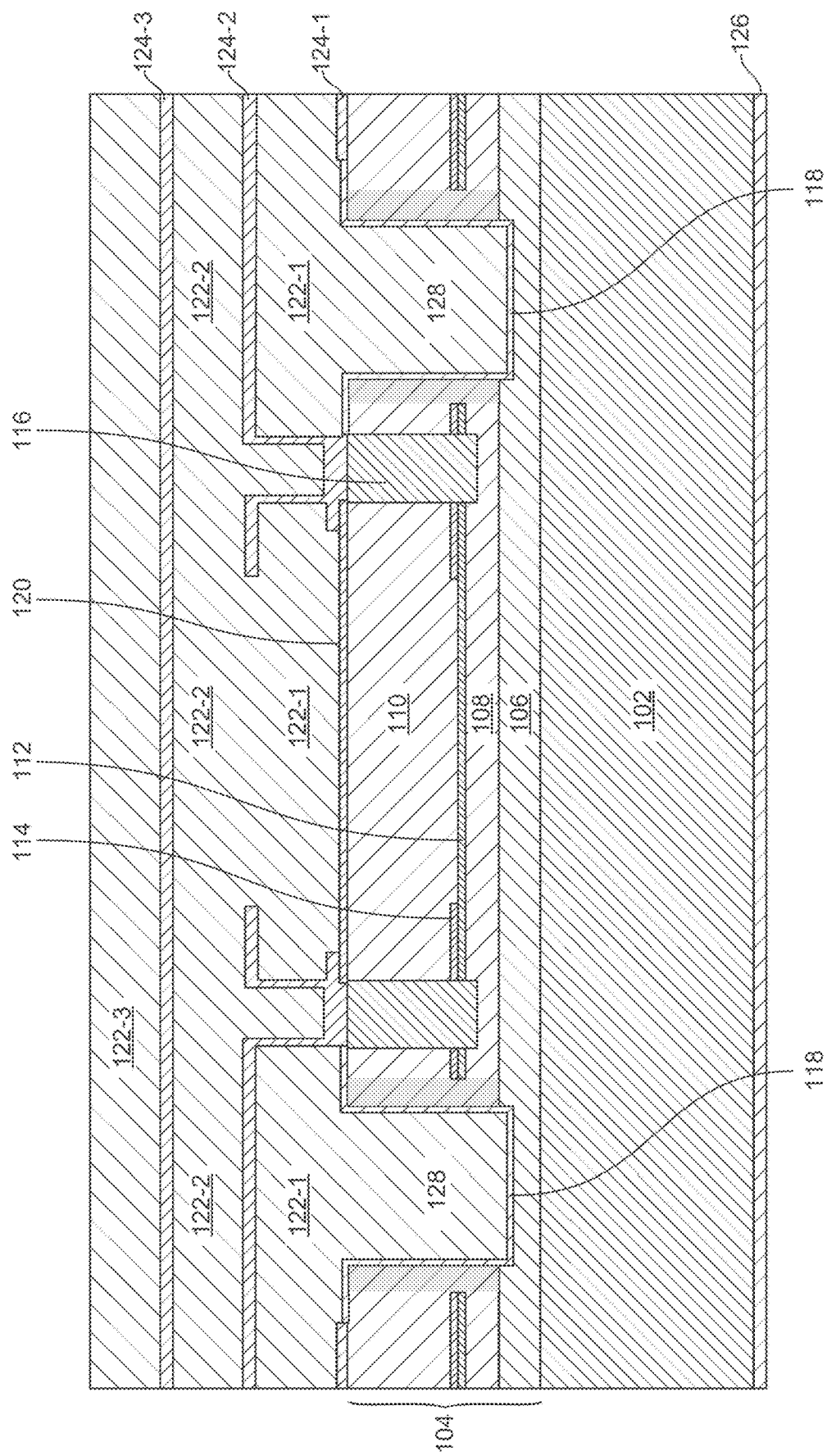
Figure 14:
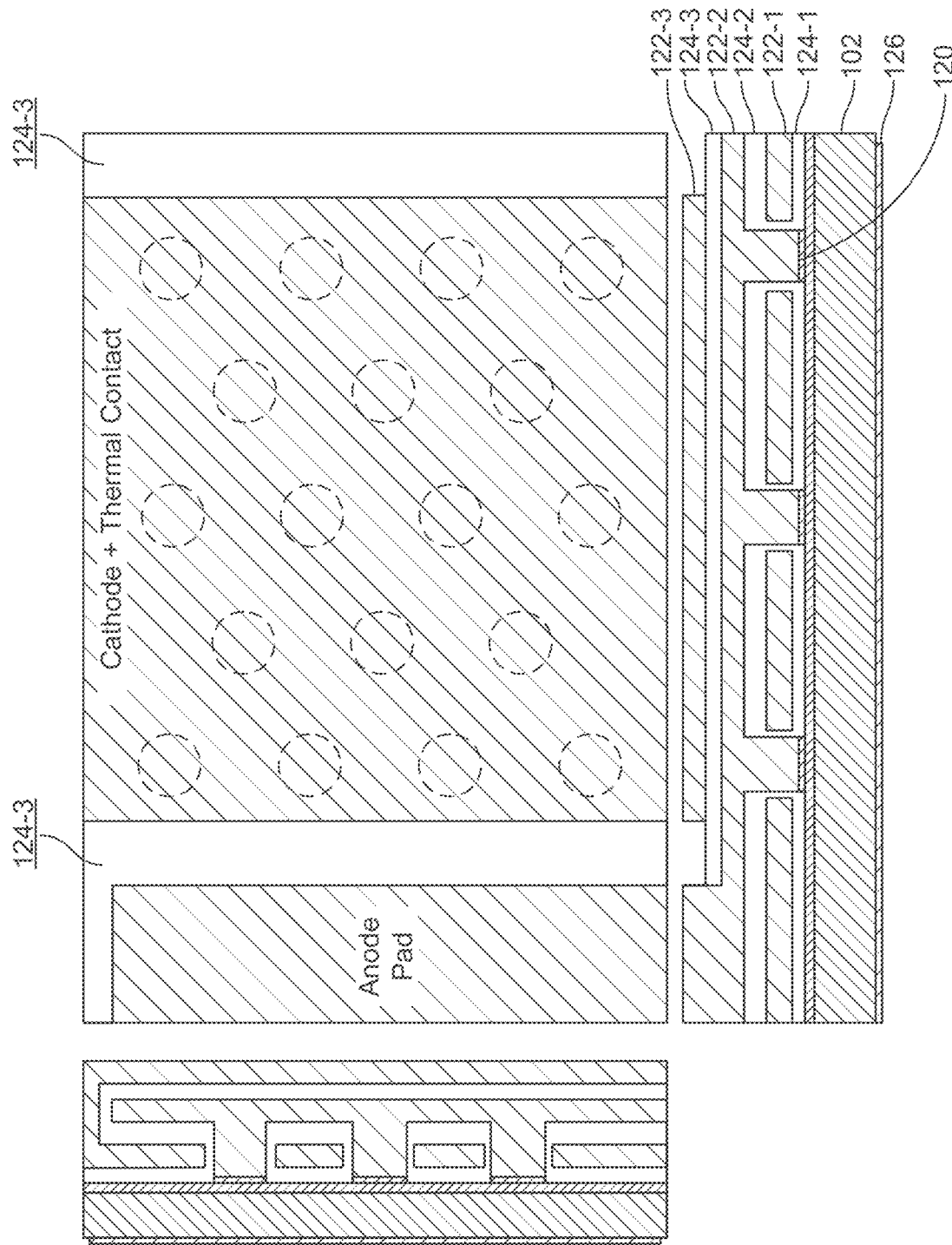

For example, FIG. 12 shows a design with an additional isolation layer (identified as third isolation layer 124-3) and an additional metal layer (identified as third metal layer 122-3) in which the anode pad and the cathode pad are separate from a thermal contact. A cross-section of a VCSEL 100 in an array such as that shown in FIG. 12 is shown in FIG. 13 (which is similar to the design shown in FIG. 2). Using the design of VCSEL 100 shown in FIG. 13, it is possible to combine the cathode pad with the thermal contact, an example of which is shown in FIG. 14. In this way, die area of the array of VCSELs 100 may be reduced.

Figure 15:
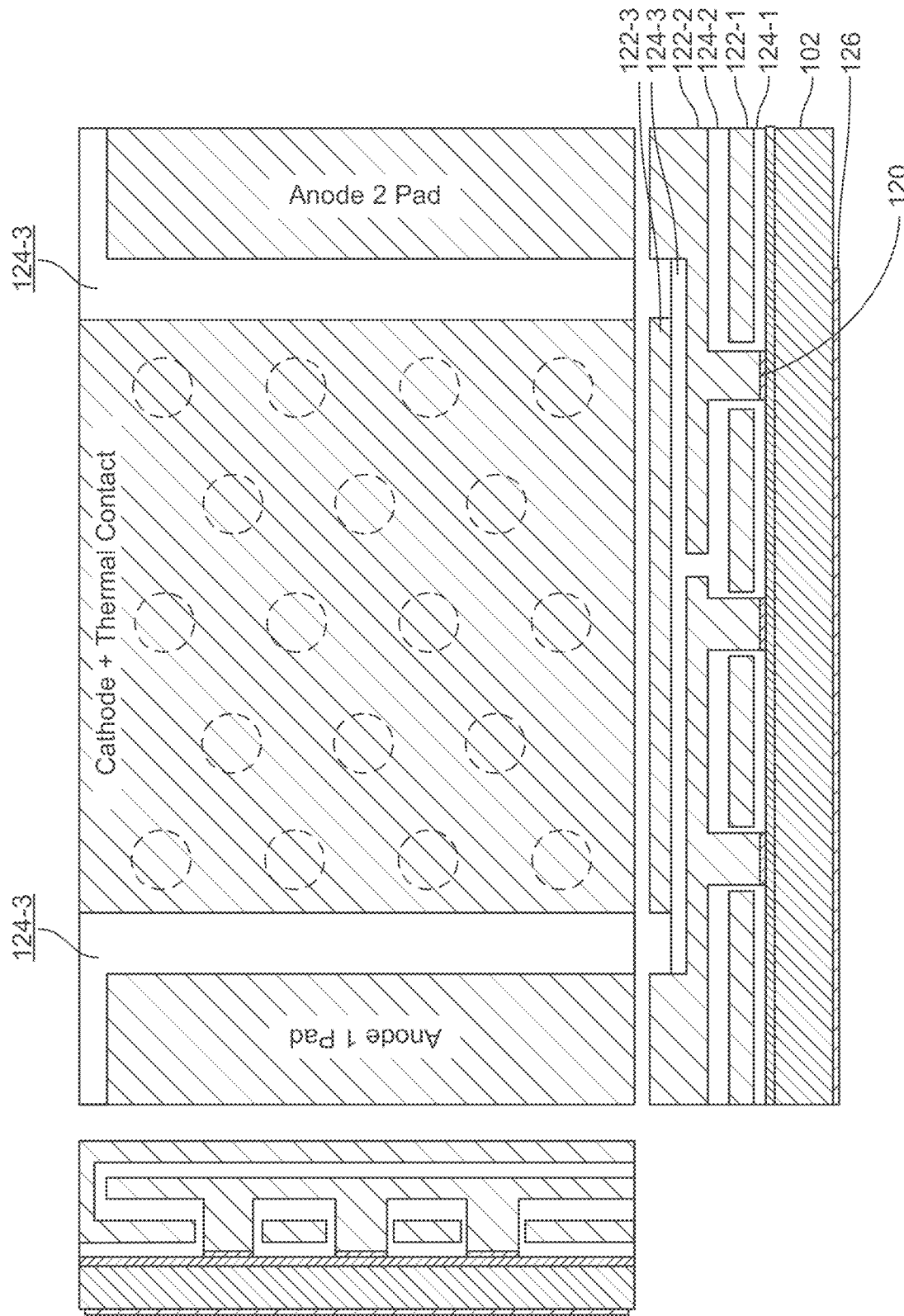

FIG. 15 is a diagram of another example configuration of an array of VCSELs 100 (using the design for VCSEL 100 shown in FIG. 13), in which the cathode pad provides thermal contact and the anode is segmented into multiple regions—anode 1 pad and anode 2 pad connecting to two distinct sub-arrays of emitters. Such a design may be preferable to splitting the anode pad on a top surface, because the anode pad regions can be closely spaced without regard to flip-chip bonding requirements. Notably, it may be possible to fabricate a chip such as that shown in FIG. 15 using only metal layers 122-1 and 122-2 (i.e., without using third metal layer 122-3) and splitting first metal layer 122-1 into the two anode pad regions, but such an implementation may not permit the sub-arrays to be positioned as closely as possible.

In some implementations, to achieve lower inductance, an array of VCSELs 100 may be used in combination with a submount having multiple layers of metal and dielectric (e.g., in contrast to a single metal layer on the submount surface) arranged so that current from one pad (e.g., the anode pad) may flow under return current through the other pad (e.g., the cathode pad), thereby lowering inductance (e.g., as compared to a design in which these current paths are spaced apart laterally as in a submount with a single metal layer).

In some implementations, an array of VCSELs 100 may provide reduced non-uniformity and improved power conversion efficiency as compared to an array of bottom-emitting VCSELs with an electrical contact (e.g., cathode) around a perimeter of the array.

For example, having both electrical contacts on the epi-side of VCSEL 100 permits lower inductance packaging. However, if lower inductance were the only objective, then the epi-side cathode metal need not be dense around individual VCSELs 100. In a prior art layout, as shown in FIG. 15.5, a first electrical contact, such as a cathode 15c, could be formed around a perimeter of all VCSELs in an array, and only a second electrical contact, such as an anode 15a, would be contacting each individual VCSEL. In such a design, no electrical contact is made to a bottom of a trench of the individual VCSELs. However, when the cathode contact to semiconductor is defined well away from the VCSELs, the resistance between the n-side of the VCSELs and the cathode is higher.

In the case of a highly conductive GaAs substrate (e.g., less than 0.002 ohm-cm and a doping of $2 \times 10^{18}/cm^3$ and approximately 100 µm thick), this resistance is small (e.g., approximately 5 milli-ohms for the example values, for a contact along the perimeter of a square). However, the lateral electrical resistance may increase the non-uniformity in optical power per emitter (e.g., as compared to an average power per emitter). Such non-uniformity may be as high as +/−10% depending upon the number of emitters and an operating current. The non-uniformity is larger if the cathode does not surround all sides of the array. Despite the non-uniformity, for a large array requiring several amperes of current, the voltage drop from this resistance does not significantly reduce the power conversion efficiency of the device. The power conversion efficiency is instead reduced by optical loss from substrate doping. For example, a substrate n-doped approximately $2e18/cm^3$ and 100 µm thick has an optical loss (e.g., from free carrier absorption) in the near-infrared range of approximately 10%, which reduces power conversion efficiency by the same percentage.

In a case where the substrate is not conducting (or negligibly conducting), the free-carrier absorption of the substrate may be negligible, but current flows laterally from the perimeter through epitaxial layers to the emitters. The epitaxial layers are typically thinner than the substrate. For example, if lateral conduction is provided by the equivalent of approximately 4 µm of n-doped GaAs epitaxial layers doped $2e18/cm^3$, then the lateral resistance (for contact along the perimeter of a square), is approximately 0.2 ohm. With the lateral resistance being approximately two orders of magnitude higher than for a highly conductive substrate, as noted above, the non-uniformity in the current injected to each emitter may be high enough such that emitters in the center of the array only output 15% of the average optical power per emitter, while emitters at the edge deliver twice the average output power. Such a high non-uniformity is typically unacceptable for most applications. Additionally, for a large array requiring several amperes of current (e.g., 3 amperes), the power conversion efficiency may be reduced by more than 10% in the typical case due to this extra lateral resistance.

Therefore, due to reduced non-uniformity and improved power conversion efficiency, an array of VCSELs 100 as described herein is preferable to a prior art array of bottom-emitting VCSELs with an electrical contact around a perimeter of the array as shown in FIG. 15.5.

There are a number of advantages of using VCSELs 100 having dense epi-side contacts for a bottom-emitting array. For example, in an array of bottom-emitting VCSELs 100, bringing the first and second electrical contacts to each VCSEL 100 through metal layer 122 (i.e., plated metal) has significantly lower resistance than bringing these electrical contracts through a semiconductor (e.g., which may have approximately 1000 times lower conductivity). Therefore, there is no substantial resistance penalty for bringing the electrical contacts through metal layer 122 as compared to conduction through the epitaxial layers of similar thickness. As a result of connection through one or more metal layers 122 to each VCSEL 100, carrier concentration in substrate 102 may be substantially reduced (e.g., below $2 \times 10^{17}/cm^3$) or eliminated, with minimal additional increase in lateral resistance. The reduced free-carrier absorption due to this reduction in carrier concentration will thereby increase electrical-to-optical efficiency of an array of bottom-emitting VCSELs 100. Furthermore, lower electrical resistance to each VCSEL 100 means that non-uniformity in optical power per VCSEL 100 may be improved from, for example, +/−10% (as noted in the example of a highly conductive substrate described above) to less than approximately +/−2%, depending upon a number and size of VCSELs 100 in the array. Both uniformity and efficiency are also improved relative to the example described above in which a metallic cathode extends only around a perimeter of an array of emitters.

Using VCSELs 100 having dense epi-side contacts may also be advantageous for arrays with lengthened effective optical cavity and higher power per emitter. Higher power per emitter is useful in, for example, long distance ToF 3D sensing. One technique for achieving higher power per emitter is to increase a VCSEL diameter. However, larger diameter VCSELs tend to have greater power in higher order modes—which diffract more than lower order modes and contribute to an increase in beam $M^2$ (i.e., the product of a beam waist and beam divergence). For longer distance ToF 3D sensing, a beam generally needs to be collimated. However, a beam with a mixture of modes, or higher $M^2$, is more difficult to collimate and a resulting beam has lower intensity (e.g., as compared to a comparatively more Gaussian like beam with fewer higher order modes).

Other techniques for reducing higher order modes in a VCSEL include adding loss to a perimeter of the mode on a surface of the VCSEL, using a photonic crystal, and increasing an effective optical cavity length. The effective optical cavity length of a VCSEL is a distance equal to a sum of an optical penetration depth into reflectors (e.g., DBR mirrors) of the VCSEL and a length of spacer region between the reflectors. Increasing the effective optical cavity length may be desirable because such an approach does not require sub-micron alignment to the oxide aperture and can be well controlled by epitaxial design and, therefore, is more manufacturable. However, when electrical conduction from an epitaxial surface to a substrate is required, lengthening of the optical cavity will add optical loss to all optical modes (from free carrier absorption) as the optical modes travel along a vertical direction of the doped cavity.

Figure 16:
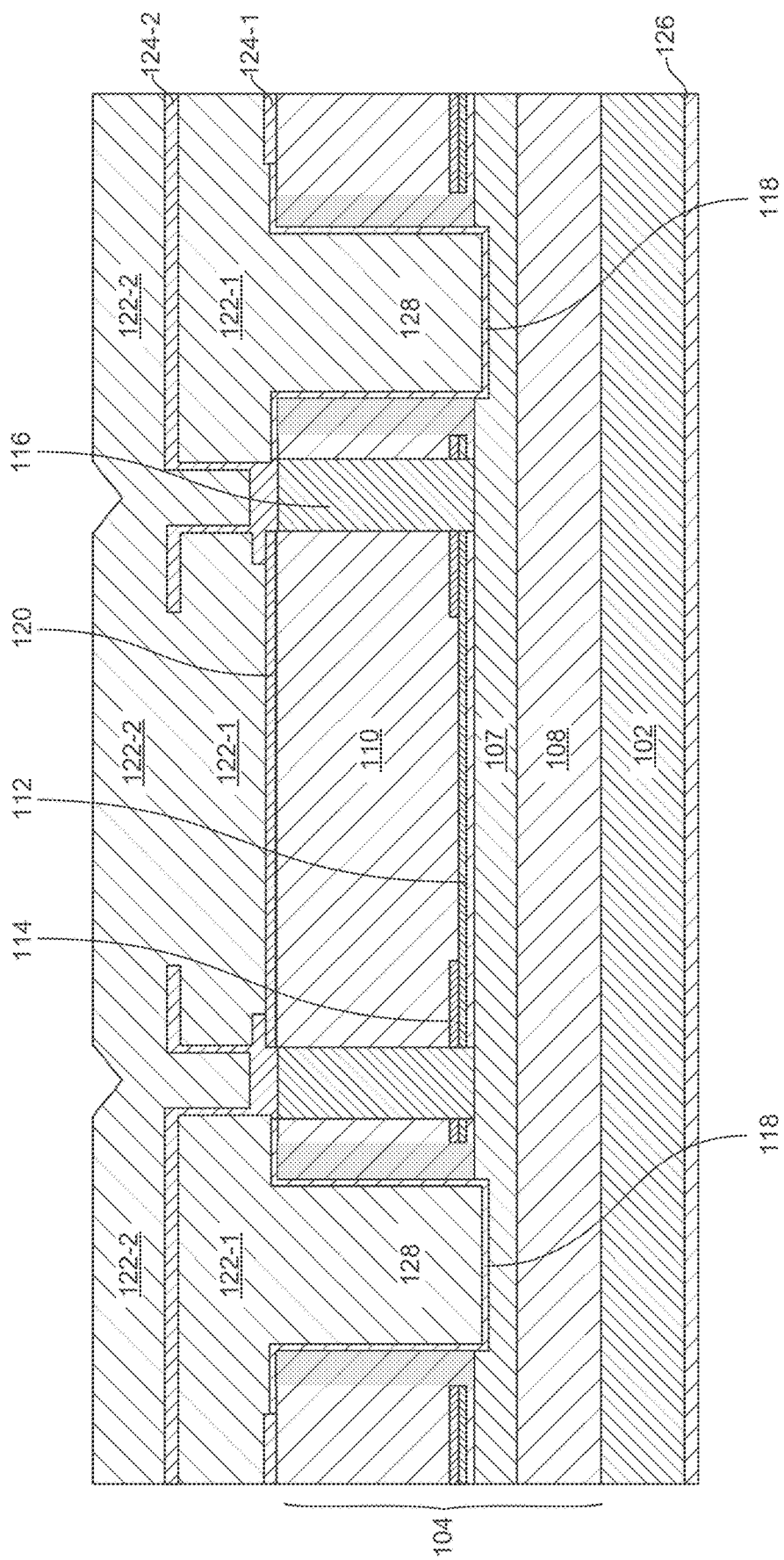

FIG. 16 is a diagram of an example VCSEL 100 with a lengthened effective optical cavity that substantially reduces optical loss. In some implementations, bottom mirror 108 may be constructed with a comparatively lower refractive index contrast, to lengthen the effective optical cavity. In this example, optical loss caused by the lengthened effective optical cavity is reduced by leaving bottom mirror 108 undoped and by making electrical contact with a spacer contact layer 107 formed above bottom mirror 108. In some implementations, spacer contact layer 107 may also be formed so as to increase the effective optical cavity length. In some implementations, spacer contact layer 107 may include a layer that is doped as needed for electrical contact, but includes a portion near bottom mirror 108 that is undoped. In some implementations, such a design may be used with a single p-i-n junction active region 112 or with a multiple p-i-n junction active region similar to that shown in FIG. 9. In some implementations, the dense epi-side contacts of VCSEL 100 make it possible to realize such a VCSEL design for high power VCSEL arrays in which a high number (e.g., more than 50 emitters, hundreds of emitters) are densely packed and spaced (e.g., with a center-to-center spacing of less than approximately 50 μm, such as 20 μm). Notably, such a design may improve power conversion efficiency by approximately 15% (e.g., as compared with a fully doped VCSEL). Of further note, this design advantage is also applicable to an array of top-emitting VCSELs 100. For an array of bottom-emitting VCSELs 100, the improved power conversion efficiency is in addition to the higher efficiency obtained by reducing the substrate optical loss.

The number and arrangement of layers shown in FIGS. 10-16 are provided as examples. In practice, VCSEL 100 may include additional layers, fewer layers, different layers, differently arranged layers, layers of different thicknesses, layers of different relative thicknesses, layers having different patterning, and/or the like, than those shown in FIGS. 10-16. Additionally, or alternatively, a set of layers (e.g., one or more layers) of VCSEL 100 may perform one or more functions described as being performed by another set of layers of VCSEL 100. Further, the number and arrangement of arrays of VCSELs 100 shown in FIGS. 10-16 are provided as examples. In practice, an array of VCSELs 100 may include additional VCSELs 100, fewer VCSELs 100, a different number of VCSELs 100, differently arranged VCSELs 100, differently arranged contact pads, and/or the like, than those shown in FIGS. 10-16.

In some implementations, VCSELs 100 having dense epi-side contacts may be used for monolithically interconnected series VCSEL arrays. In some applications, such as a 3D sensing application, a VCSEL array may need to be driven with currents ranging from several hundred milliamps (mA) (e.g., for segments of a VCSEL array) to several amperes of current (e.g., for an entire VCSEL array) and, in some applications (e.g., ToF sensing), this current may need to be switched rapidly (e.g., on a nanosecond timescale). To ease driver fabrication and reduce inductive voltage spikes, trading higher voltage for lower current is useful. In some implementations, such a trade can be achieved by electrically connecting one array of VCSELs 100 (e.g., driven in parallel) in series to another array of VCSELs 100 (e.g., driven in parallel) on a same chip.

Figure 17:
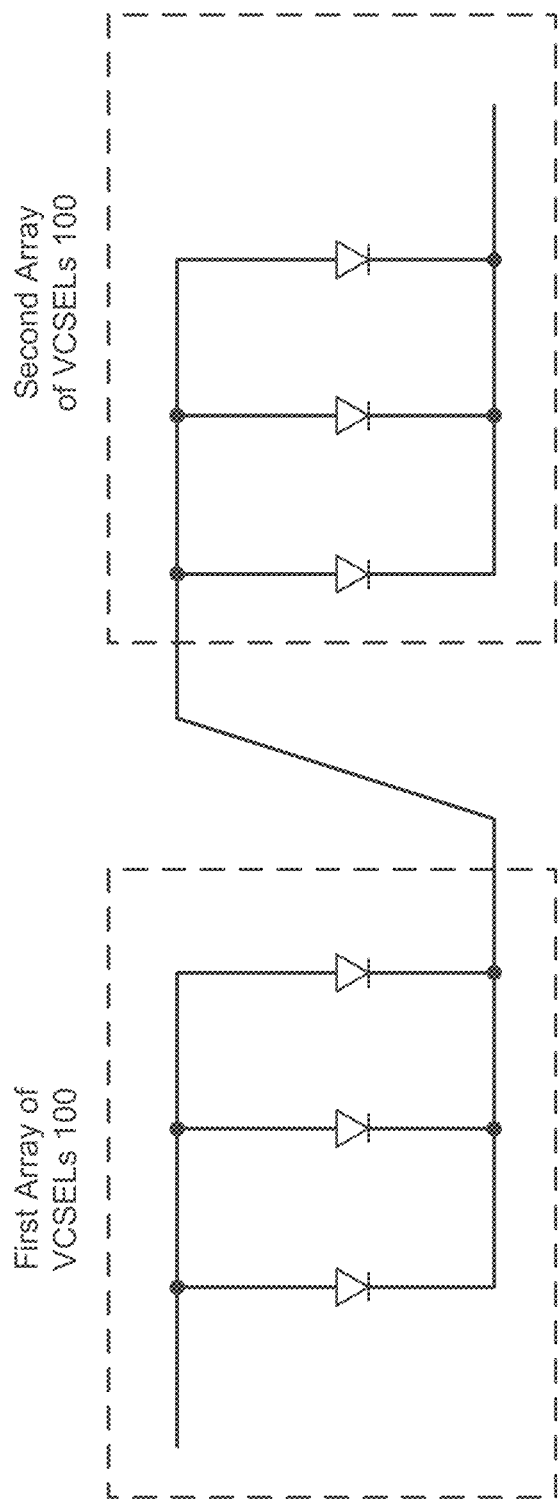
FIGS. 17-20 are diagrams illustrating examples associated with series connected arrays of VCSELs having dense electrical contacts on an epitaxial side of a substrate, as described herein.

FIG. 17 is a schematic diagram illustrating a manner in which a first array of VCSELs 100, driven in parallel, is connected electrically in series to a second array of VCSELs 100, driven in parallel, on a same chip. In such a scenario, the first and second arrays of VCSELs 100 operate with approximately twice the voltage and half the current as compared to driving both arrays in parallel. In some implementations, such a scheme can be implemented on a single chip with wafer-scale fabrication techniques.

Figure 18:
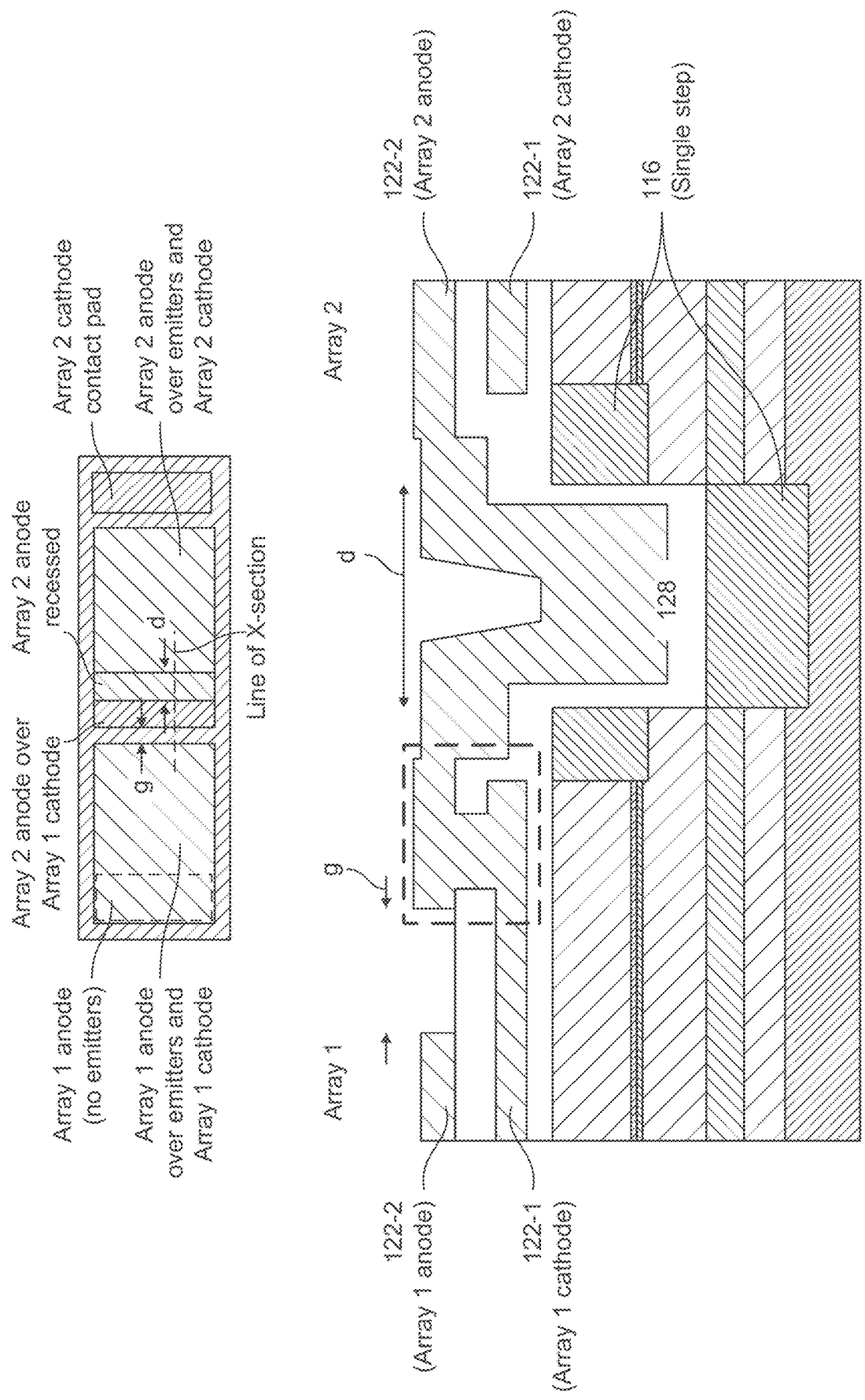
Figure 19:
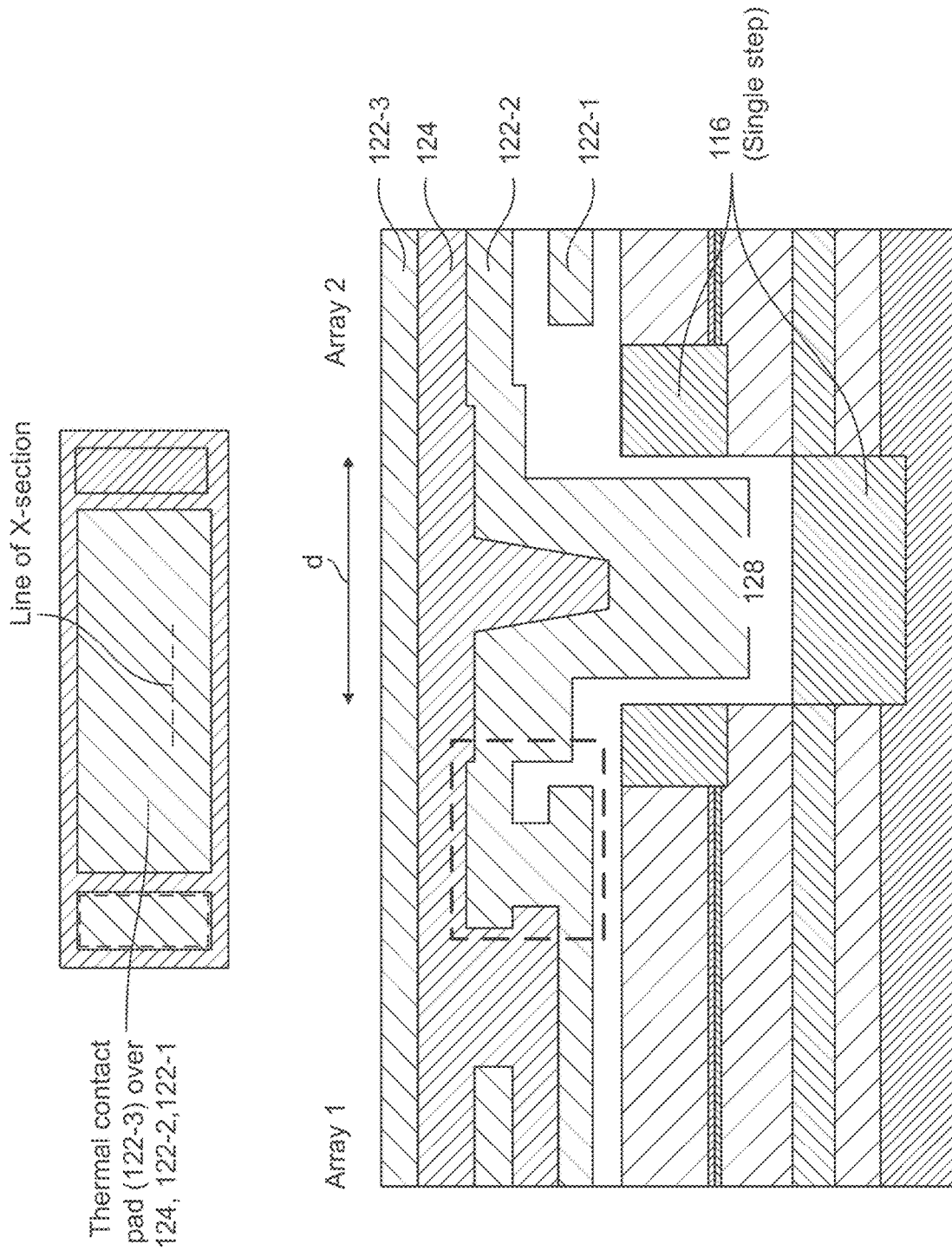

FIGS. 18 and 19 illustrate a technique by which multiple arrays of VCSELs 100 having dense epi-side contacts can be connected in series. For example, as shown in the dashed boxes of FIGS. 18 and 19, a series connection can be created between a given pair of arrays of VCSELs 100 by forming a via to a cathode of a first array of VCSELs 100 (identified as Array 1) and connecting the cathode of the first array of VCSELs 100 to an anode of a second array of VCSELs 100 (identified as Array 2) using second metal layer 122-2. In the example shown in FIG. 18, the first and second arrays of VCSELs 100 can be formed, for example, as illustrated in FIG. 10, and VCSELs 100 within each array can use the designs illustrated in, for example, FIG. 1, FIG. 2, or FIG. 16. In the example shown in FIG. 19, the first and second arrays of VCSELs 100 can be similarly formed, but may include a third isolation layer 124-3 and third metal layer 122-3, as shown in the design for VCSEL 100 in FIG. 13.

In some implementations, as shown in FIGS. 18 and 19, the series connection may be formed by connecting a second metal layer 122-2 on the second array of VCSELs 100 to first metal layer 122-1 on the first array of VCSELs 100. As shown, in some implementations, a trench 128 may be formed between the first and second arrays of VCSELs 100. In some implementations, this trench 128 may serve to isolate the first and second arrays of VCSELs 100 from one another. In some implementations, the isolation trench 128 may be formed during a same step as trenches 128 used for oxidation for VCSELs 100 in the first and second arrays of VCSELs 100. In some implementations, as indicated in FIGS. 18 and 19, isolation implant 116 may be formed around (e.g., at a bottom of, along sides of) the isolation trench 128. In some implementations, a gap in first metal layer 122-1 may be used as a mask for formation of isolation implant 116 around the isolation trench 128. In some implementations, isolation implant 116 around the isolation trench 128 may be formed during a same step as isolation implants 116 of VCSELs 100 in the first and second arrays of VCSELs 100.

In some implementations, the first and second arrays of VCSELs 100 may be isolated from substrate 102 by using a semi-insulating substrate 102, or by forming an insulating layer between epitaxial structure 104 and substrate 102, which can be, for example, a series of p/n/p/n/p blocking layers, or a highly resistive material (e.g., vanadium-doped GaAs).

Notably, no lithography is needed in the isolation trench 128 and, therefore, a width d of the isolation trench may be relatively narrow (e.g., less than approximately 5 μm wide). Further, this series connection design provides flexibility to change a distance of gap g (e.g., a gap between the two metallization regions of the first and second arrays of VCSELs 100), as desired. In some implementations, gap g may need to be relatively small (e.g., less than approximately 10 μm) to bring VCSELs 100 on the first and second arrays of VCSELs 100 close enough so as to work with optics of an associated system, which is possible using the series connection design facilitated by VCSELs 100 having dense epi-side contacts.

In some implementations, for the purpose of flip-chip bonding, if the gap g between the metalized patterns is too narrow (e.g., approximately 10 μm or less) to prevent solder shorting electrical contact pads of the first and second arrays of VCSELs 100, then one or more isolation layers 124 and metal layers 122 may be used to prevent shorting and to permit a direct thermal path vertically using a larger thermal contact pad (see, e.g., FIG. 19)

In some implementations, fabrication of series connected arrays of VCSELs 100 shown in FIGS. 18 and 19 may follow a same fabrication flow as an individual array of VCSELs 100 using the design shown in, for example, in FIG. 2, with only changes to photolithography masks being needed and no additional processing steps.

Figure 20:
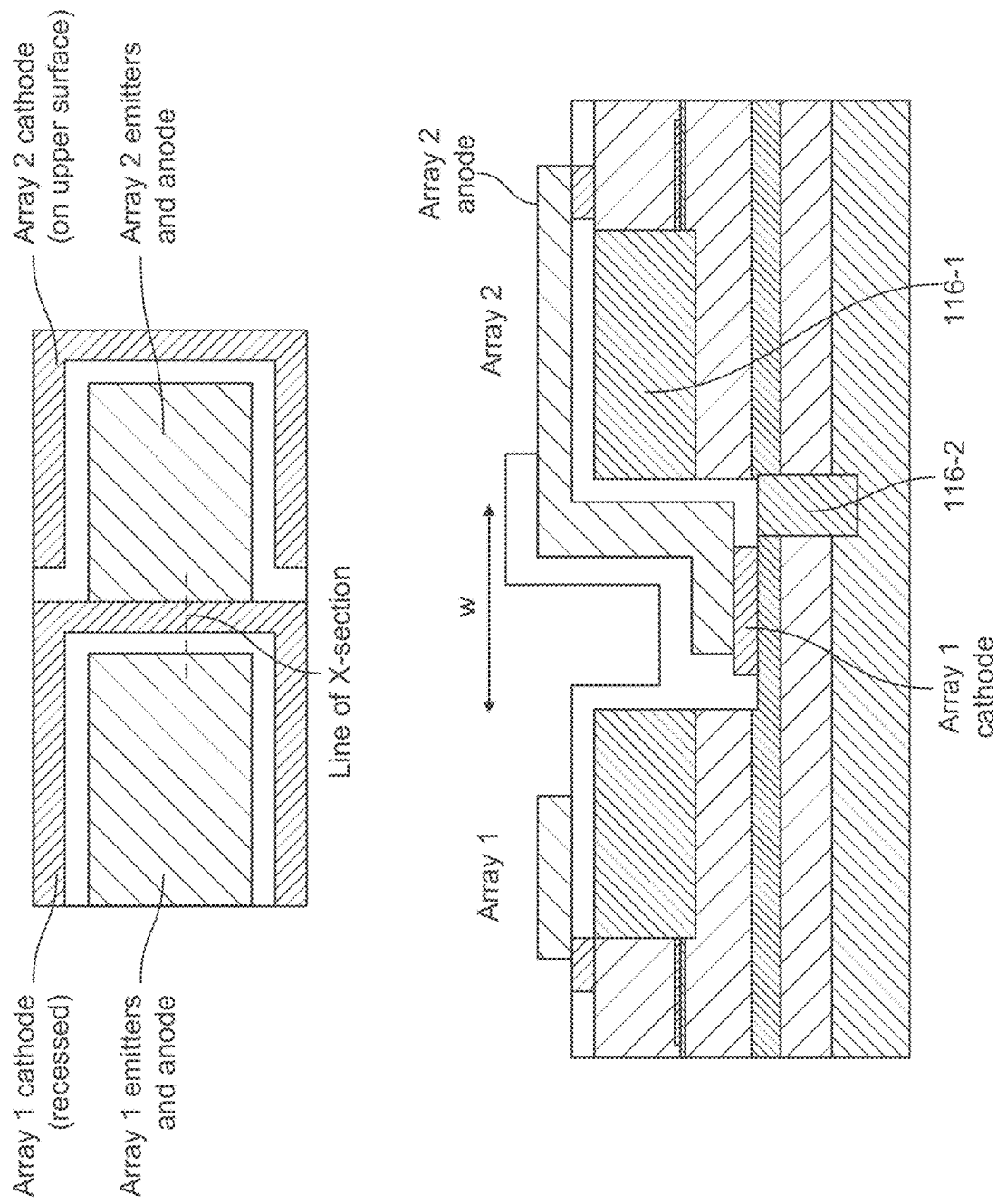

The series connection of arrays of VCSELs 100 shown in FIGS. 18 and 19 provides advantages over monolithically interconnected series arrays without dense epi-side contacts. FIG. 20 is a diagram illustrating an example of monolithically interconnected series VCSEL arrays without dense epi-side electrical contacts for both cathode and anode. In this example, a pair of arrays comprising VCSELs without dense epi-side electrical contacts are formed with a cathode contact around a perimeter of the arrays (as described above). In the example shown in FIG. 20, a cathode for a first array of VCSELs without dense epi-side electrical contacts is recessed entirely in a trench other than where the cathode is connected to an anode of a second array of VCSELs without dense epi-side electrical contacts. Additionally, an isolation implant is made in n-doped conductive layers between the first and second arrays of VCSELs without dense epi-side electrical contacts. In this approach, power conversion efficiency is degraded by lateral semiconductor resistance encountered by current flowing from VCSELs to a perimeter of each array. This degradation may be 10% or more as compared to an array of VCSELs 100 having dense epi-side electrical contacts.

Another disadvantage of the design in FIG. 20 is that a gap w between the first and second arrays of VCSELs without dense epi-side electrical contacts may need to be at least 30 μm. This wider gap is needed (1) because the n-contact around the perimeter carries the entire current for one of the arrays and needs to be sufficiently wide for low n-contact resistance, and (2) to allow for photolithographic features to be defined within the trench. Therefore, there is less flexibility to bring the first and second arrays of VCSELs without dense epi-side electrical contacts close together as compared to the series connection between first and second arrays of VCSELs 100 having dense epi-side contacts shown in FIGS. 18 and 19.

Another disadvantage of the design shown in FIG. 20 is that implantation required between the first and second arrays of VCSELs without dense epi-side electrical contacts may need to be done separately from implantation performed within each array in order to define openings within each VCSEL and at a bottom of a trench below (e.g., 8 μm to 12 μm below) a surface of the epitaxial layers. This challenge is not present when forming series connected arrays of VCSELs 100, as described above.

Another disadvantage of the design shown in FIG. 20 is that optical output power will be highly non-uniform across a given array of VCSELs without dense epi-side electrical contacts. For example, even for a modest size array (e.g., including 10×10 emitters of typical aperture size, such as 10 μm), due to lateral resistance alone, power per emitter may range from as low as 15% of average in a center of a given array to greater than 200% of the average power per emitter at an edge of the given array. In comparison, low lateral resistance for series connected arrays of VCSELs 100 having dense epi-side contacts to each emitter may contribute a small amount (e.g., less than approximately 3%) to non-uniformity in optical power per emitter.

In some implementations, concentric arrays of VCSELs 100 can be monolithically interconnected in series for improved uniformity and reliability. One challenge encountered as VCSEL arrays become larger and operate at higher temperatures is non-uniform heating. Typically, a center of a VCSEL array is hotter than edges of the VCSEL array. At higher temperatures, resistance of a VCSEL tends to drop because carriers can more easily jump over electrical potential barriers both at the interfaces of reflectors and at an active region. When VCSELs of an array are driven in parallel (as is common for 3D sensing applications), a hotter emitter tends to draw more current. The higher current sometimes leads to VCSELs nearer to the center of the VCSEL array emitting more optical power than VCSELs nearer to edges of the VCSEL array. Often, VCSELs nearer to the center of the VCSEL array are hot enough relative to VCSELs nearer to an edge of the VCSEL array that their optical power is lower. Additionally, the higher current drawn by VCSELs in the hotter (i.e., nearer to center) region of the VCSEL array will further heat those VCSELs, thereby reducing their resistance and causing them to draw more current. In some cases, at high temperatures and currents, this can lead to thermal runaway. More commonly, the increased temperature and current in VCSELs nearer to the center of the VCSEL array lead to non-uniform wear-out of the VCSEL array (with VCSELs nearer to the center aging faster than VCSELs nearer to edges of the VCSEL array). Occasionally, aging itself may reduce VCSEL resistance, which further accelerates this process.

One technique for addressing this issue is to cause current to VCSELs nearer to a center of a VCSEL array to be approximately equal to current to VCSELs nearer to edges of the VCSEL array. This can be readily achieved using VCSELs 100 having dense epi-side electrical contacts and using the techniques for series connection as described above in association with FIGS. 18 and 19.

The number and arrangement of layers shown in FIGS. 17-20 are provided as examples. In practice, VCSEL 100 and/or a connection between arrays of VCSELs 100 may include additional layers, fewer layers, different layers, differently arranged layers, layers of different thickness, layers of different relative thickness, layers having different patterning, and/or the like, than those shown in FIGS. 17-20. Further, the number and arrangement of arrays of VCSELs 100 shown in FIGS. 17-20 are provided as examples. In practice, an array of VCSELs 100 may include additional VCSELs 100, fewer VCSELs 100, a different number of VCSELs 100, differently arranged VCSELs 100, differently arranged contact pads, and/or the like, than those shown in FIGS. 17-20.

Figure 21:
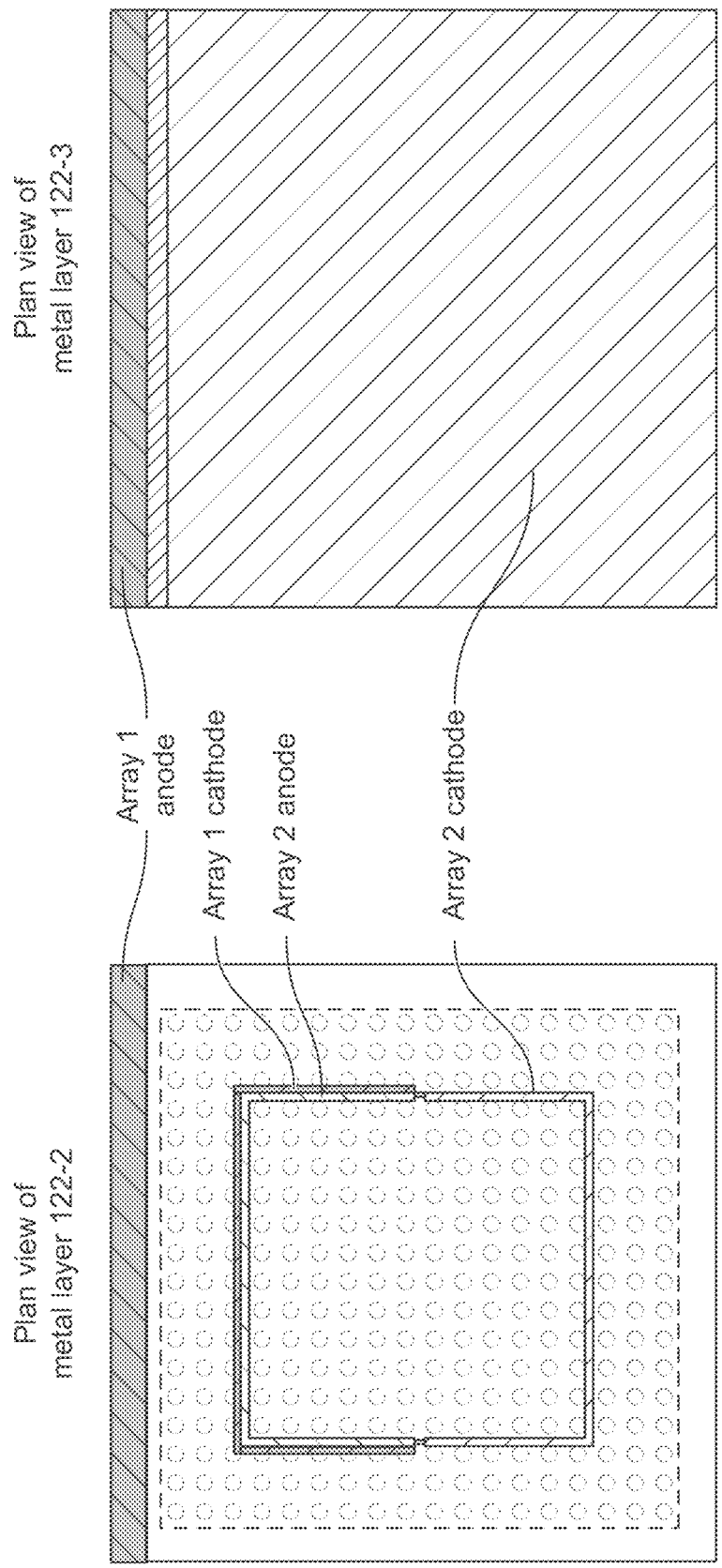
FIGS. 21-23 are diagrams illustrating examples associated with series connected concentric arrays of VCSELs having dense electrical contacts on an epitaxial side of a substrate, as described herein.

FIG. 21 is a diagram of an example array of VCSELs 100 in which the array is divided into two concentric regions connected in series. In some implementations, each region may have approximately the same number of emitters. In some implementations, using VCSELs 100 having dense epi-side contacts allows a large array of VCSELs 100 to be segmented into multiple concentric regions of VCSELs 100 with minimal disruption to an optical pattern and without suffering the resistance penalty of a cathode contact that has conduction paths through a semiconductor from a perimeter of the array (or sub-array). Here, each region of the array of VCSELs 100 can be thought of as a separate array of VCSELs 100. As shown on the left portion of FIG. 21, in some implementations, a portion of second metal layer 122-2 with a cathode of an outer region of VCSELs 100 (an array of VCSELs 100 nearer to edges of a chip, identified as Array 1) may be connected to an anode of an inner region of VCSELs 100 (an array of VCSELs 100 nearer to a center of the chip, identified as Array 2). In some implementations, this series connection can be formed using the techniques described above in association with FIGS. 18 and 19.

In some implementations, to permit flip-chip bonding without shorting of the outer and inner regions of VCSELs 100, second metal layer 122-2 may be covered with a third isolation layer 124-3 (not shown). Here, a via may be formed in third isolation layer 124-3 to the cathode of the inner region of VCSELs 100. As shown in the right portion of FIG. 21, third metal layer 122-3 may be formed on third isolation layer 124-3 such that third metal layer 122-3 covers both the outer and inner regions of VCSELs 100 (e.g., to permit acceptable heatsinking of all VCSELs 100 and to provide a cathode contact).

In some implementations, when a number of VCSELs 100 in an inner region of VCSELs 100 is approximately equal to a number of VCSELs 100 in an outer region of VCSELs 100 (or, more generally, when the inner and outer arrays of VCSELs 100 have approximately the same total active area), current per emitter in both the inner and outer regions of VCSELs 100 (or, more generally, average current density) is approximately equal for the inner and outer regions of VCSELs 100. Thus, the concentric series connection facilitated by using VCSELs 100 may cause current to VCSELs nearer to a center of a VCSEL array to be approximately equal to current to VCSELs nearer to edges of the VCSEL array. Notably, while FIG. 21 shows an example for two concentric regions (i.e., two concentric arrays) of VCSELs 100 connected in series, this design can be extended to three or more concentric regions of VCSELs 100.

Further, the design described in association with FIG. 21 may not prevent VCSELs 100 nearer to the center of the array of VCSELs 100 from being hotter than VCSELs 100 nearer to edges of the array of VCSELs 100. However, additional heating will not cause the VCSELs 100 nearer to the center of the array of VCSELs 100 to draw more current and heat further (e.g., as happens in a case when all VCSELs in an array are driven in parallel and VCSELs nearer to a center of the array draw more current as they become hotter and their resistance is lower; the higher current will cause emitters near the center to heat further as compared to when the current is uniformly injected).

In some implementations, VCSELs 100 having dense epi-side contacts may be used for forming concentric isolated monolithic VCSEL arrays. An additional technique for causing current to VCSELs nearer to a center of a VCSEL array to be approximately equal to current to VCSELs nearer to edges of the VCSEL array is to have independent control of current to inner and outer regions of a VCSEL array. In some implementations, this may be achieved using two drivers to a VCSEL having two anodes (e.g., an inner anode and an outer anode) and a common cathode. However, in some cases, it may be desirable to have multiple VCSEL arrays that are spread apart in a same package (e.g., for thermal reasons) and to permit the VCSEL arrays to be driven in series (e.g., to reduce the number of drivers). Typically, doing so is not possible with a common cathode on VCSEL arrays with two (or more) independent anodes because the common cathode would short together anodes of the second (and subsequent) VCSEL array when connected in series. Rather, inner and outer VCSEL regions need to be electrically isolated and have individual electrical contacts (i.e., anodes and cathodes).

Figure 22:
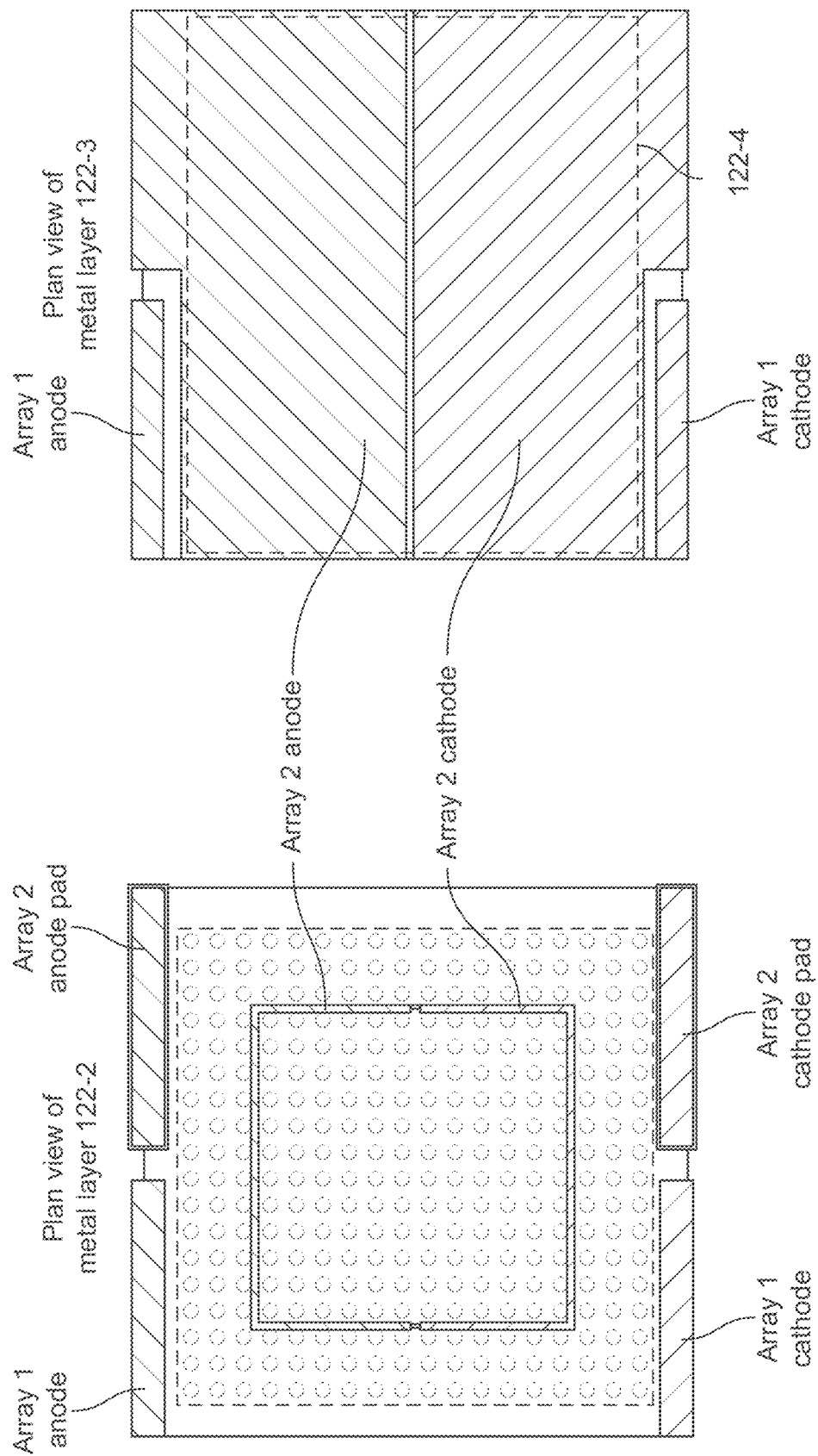

FIG. 22 is a diagram of an example array of VCSELs 100 having a dense epi-side electrical contacts design such that inner and outer regions of VCSELs 100 are electrically isolated and have individual electrical contacts. In some implementations, as shown in the left portion of FIG. 22, second metal layer 122-2 may expose a cathode of an outer region of VCSELs 100 (e.g., a first array of VCSELs 100 nearer to edges of the array of VCSELs 100) and an inner region of VCSELs 100 (e.g., a second array of VCSELs 100 nearer to a center of the array of VCSELs 100) and may include anode connections for both the outer and inner regions of VCSELs 100. As further shown, in some implementations, separate contact pads for the anode of the inner region of VCSELs 100 and the cathode of the outer region of VCSELs 100 may be formed but, on first metal layer 122-1, these contact pads serve only to planarize a surface and are not electrically connected to the arrays of VCSELs 100. As shown in the right portion of FIG. 22, third metal layer 122-3 may be formed to connect the anode and the cathode of the inner region of VCSELs 100 (i.e., the second array of VCSELs 100) to contact pads on a perimeter of the chip. In some implementations, a fourth isolation layer 124-4 may be formed on third metal layer 122-3 in the region with VCSELs 100, and fourth metal layer 122-4 may be formed to cover VCSELs and, in that region, serve as a thermal contact. In some implementations, fourth metal layer 122-4 may also be used to bring anode and cathode contact pads of the array of VCSELs 100 closer to a surface of the chip.

Figure 23:
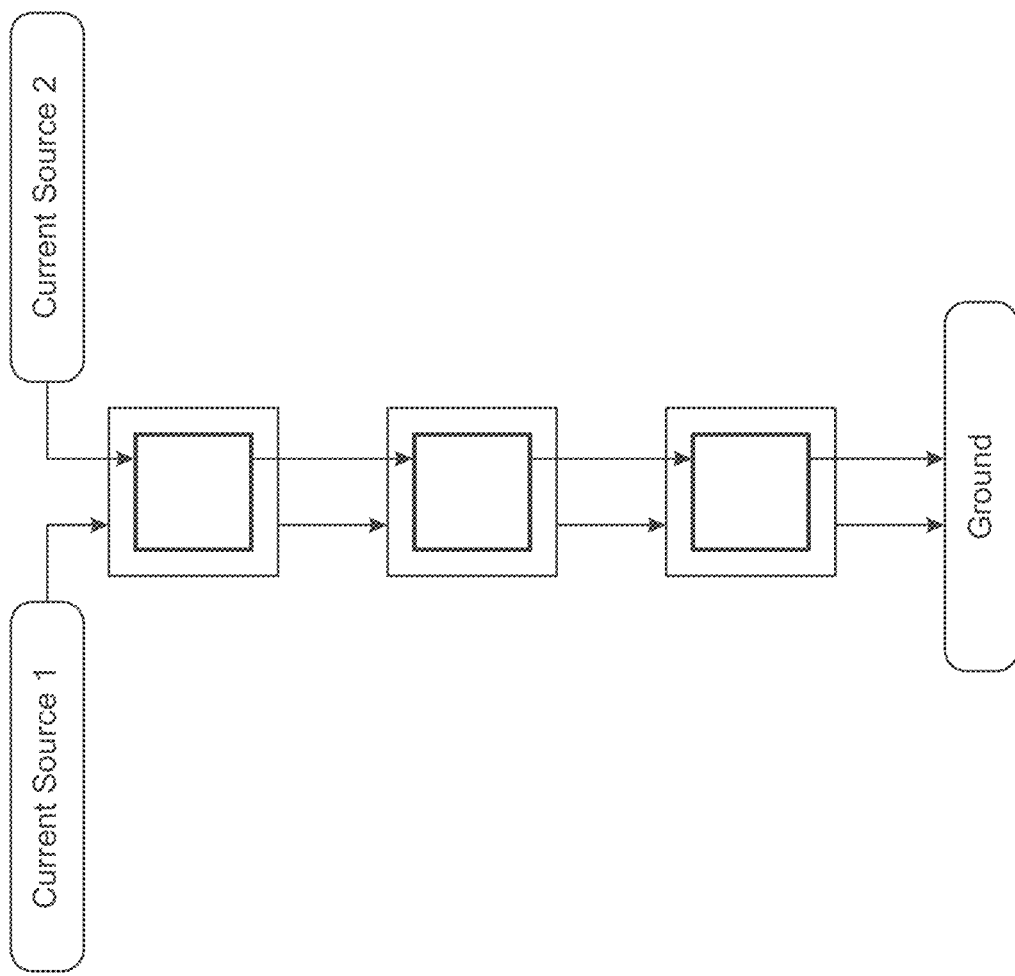

FIG. 23 is a schematic diagram illustrating a manner in which inner and outer regions of VCSELs 100 on multiple chips may be connected in series at a packaging level and independently controlled by two drivers. Notably, while the above-described implementation is shown for two concentric regions of VCSELs 100, this technique may also be applied to three or more concentric regions of VCSELs 100. In some implementations, there may also be non-concentric regions of VCSELs 100 that are driven in parallel on each chip, but connected in series chip-to-chip.

The number and arrangement of layers shown in FIGS. 21-23 are provided as examples. In practice, VCSEL 100 and/or a connection between arrays of VCSELs 100 may include additional layers, fewer layers, different layers, differently arranged layers, layers of different thicknesses, layers of different relative thicknesses, layers having different patterning, and/or the like, than those shown in FIGS. 21-23. Further, the number and arrangement of arrays of VCSELs 100 shown in FIGS. 21-23 are provided as examples. In practice, an array of VCSELs 100 may include additional VCSELs 100, fewer VCSELs 100, a different number of VCSELs 100, differently arranged VCSELs 100, differently arranged contact pads, and/or the like, than those shown in FIGS. 21-23.

In some implementations, VCSELs 100 may be used to form a row-column addressable (or alternatively called, matrix addressable) VCSEL array. In some implementations, VCSELs 100 having dense epi-side contacts can be used for forming an array with first groups of isolated first electrical contacts and second groups of isolated second electrical contacts. For example, VCSELs 100 having dense epi-side contacts can be used for forming an array with rows of isolated cathodes and columns of isolated anodes. One advantage of such an array of VCSELs 100 is that a pattern may be more compact (e.g., as compared to a design which requires lithography in trenches and uses a separate trench to deposit an n-metal contact). This is similar to the advantage described above for density, comparing the approach for monolithic series arrays without dense epi-side contacts to those with dense epi-side contacts. Another advantage of the dense epi-side contact design for row-column addressable arrays is the processing steps are the same as for the monolithic series arrays; so only the mask layout needs to be changed. The processing steps for a bottom emitting row-column addressable array are also the same as for the single section array shown in FIGS. 13 and 14 only the mask layout needs to change.

Figure 24:
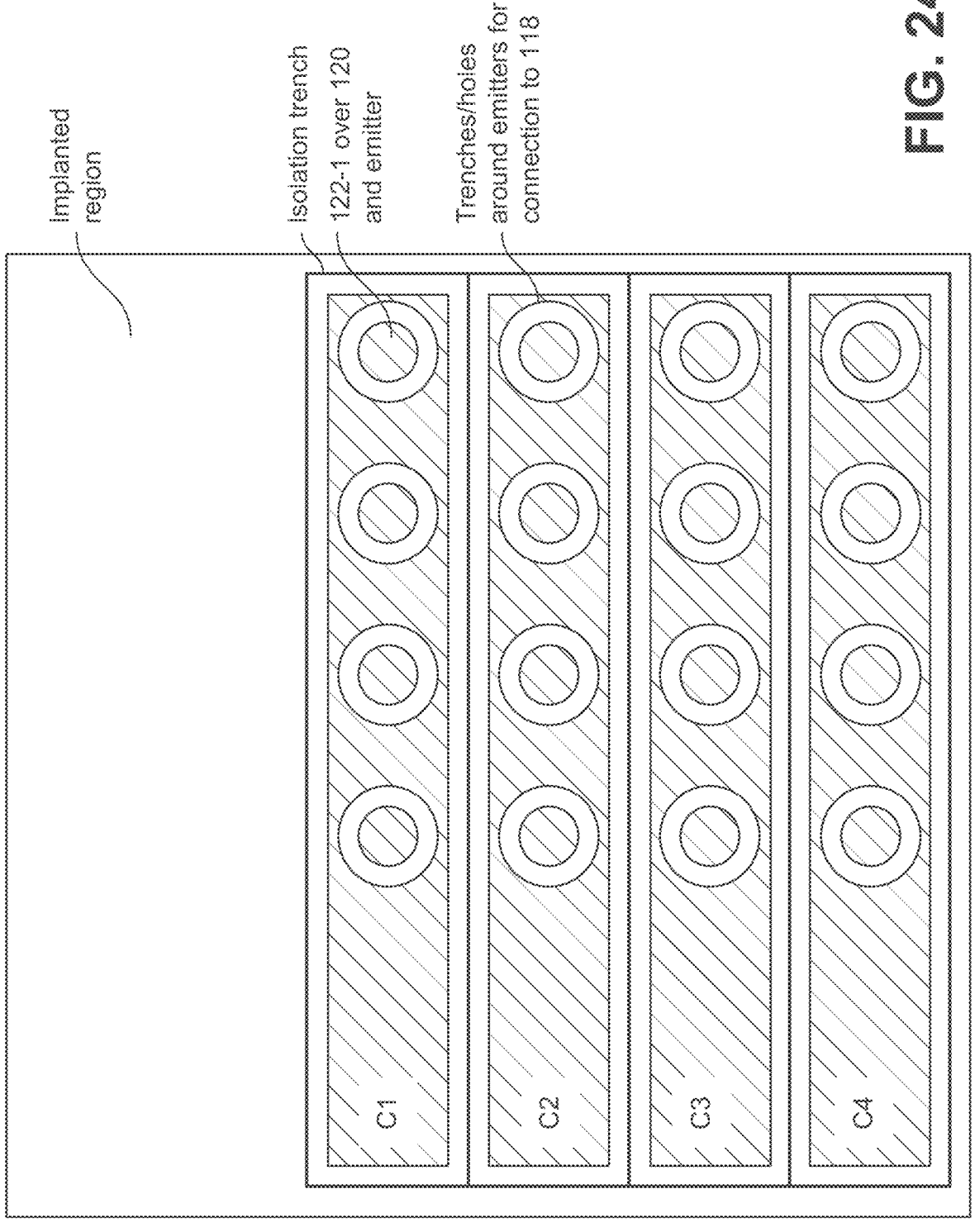
Figure 25:
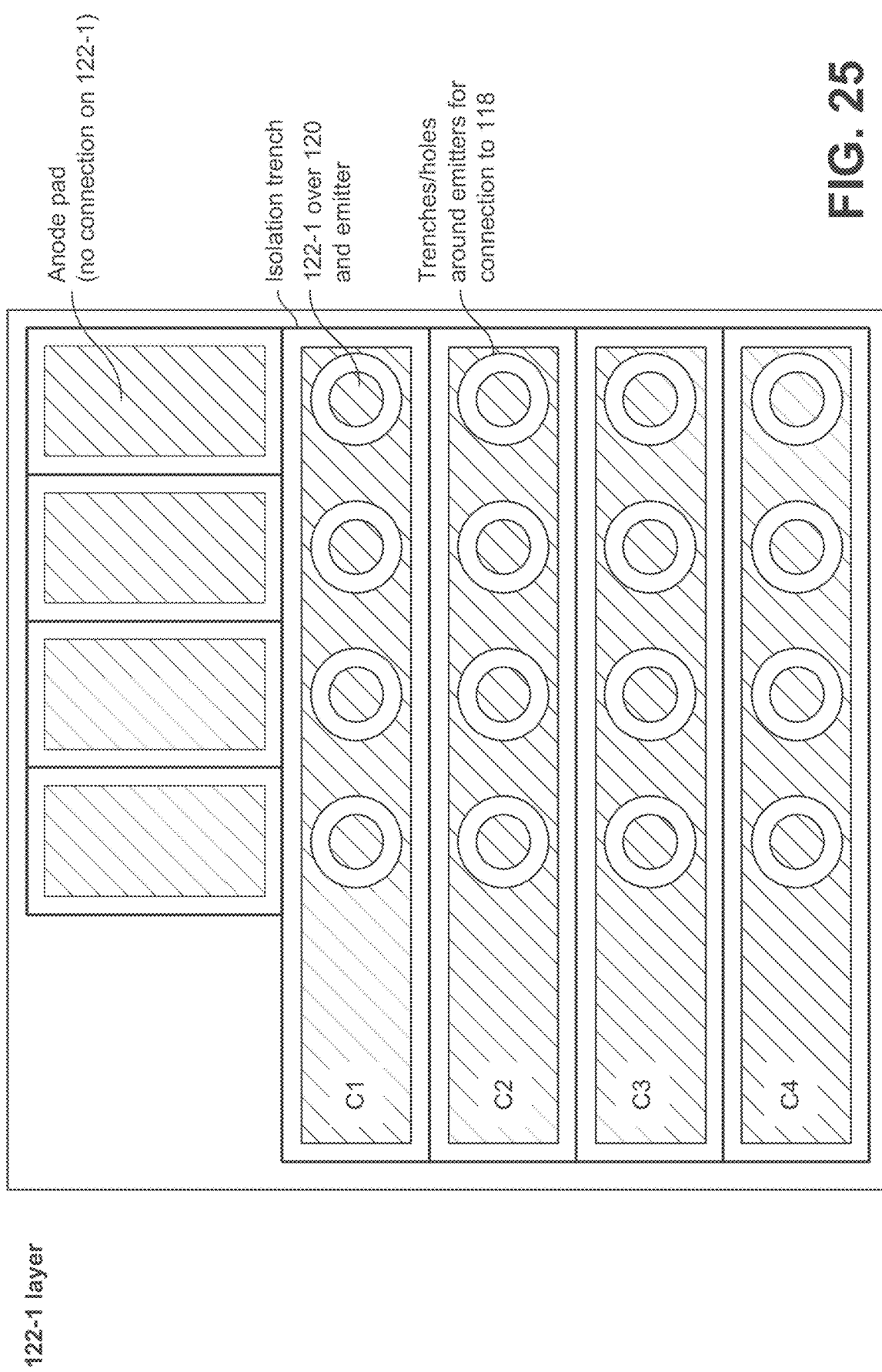
Figure 26:
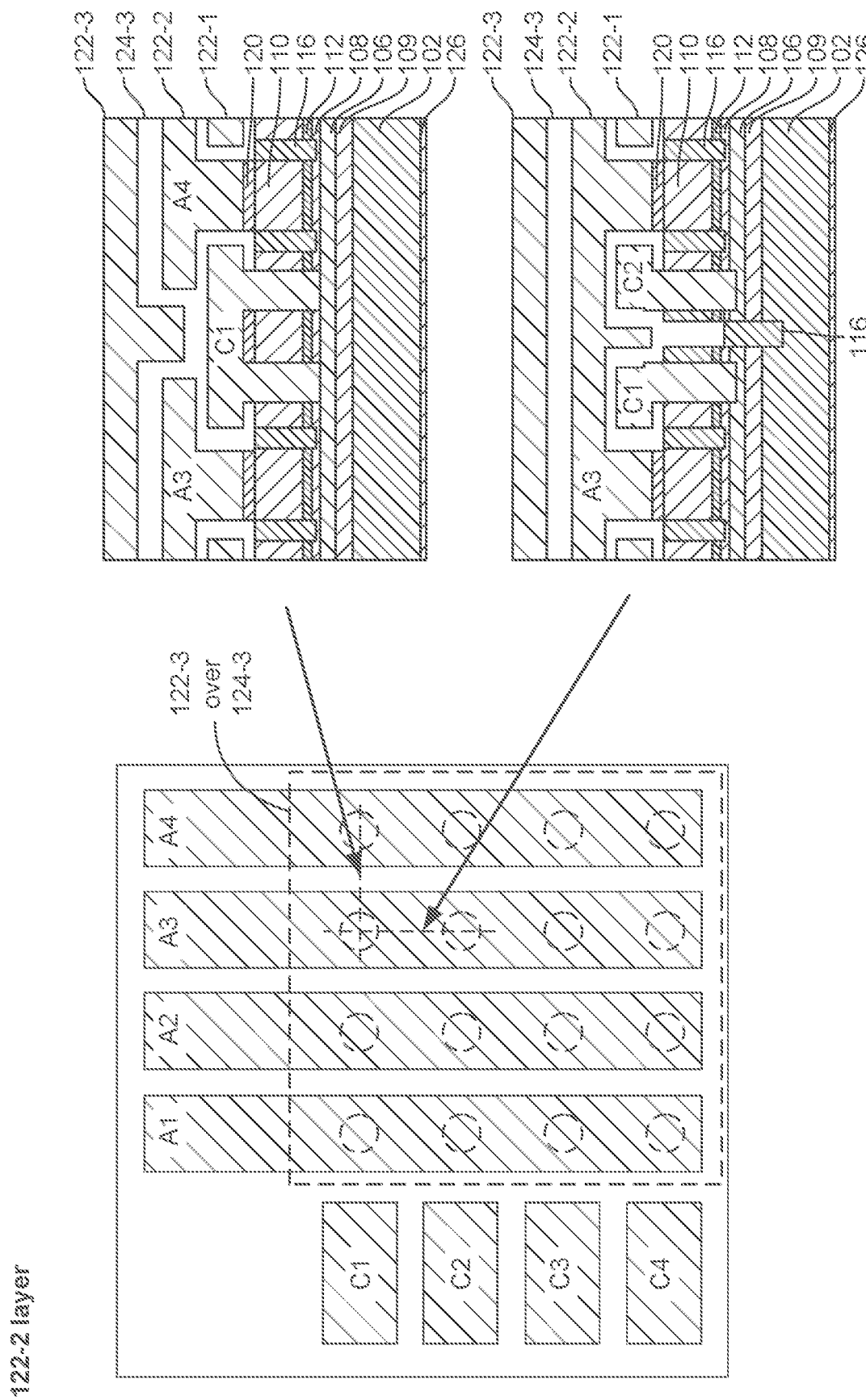

FIGS. 24 and 25 are diagrams illustrating example patterns for first metal layer 122-1 that may be used for forming an array of VCSELs 100 with rows of isolated first electrical contacts and columns of isolated second electrical contacts. As shown in the example in FIGS. 24 and 25, first metal layer 122-1 may be formed to connect cathodes along rows of VCSELs 100, and isolation trenches may be formed around each row to provide isolation (e.g., by isolating a conductive n-type portion of substrate 102). In some implementations, substrate 102 may be semi-insulating and/or may be isolated from lower conductive layers of bottom mirror 108. As indicated by FIG. 24, in some implementations, anode pads may be formed from second metal layer 122-2 in order for isolation implantation to occur below the anode pads and reduce anode-to-substrate capacitance. Alternatively, as shown in FIG. 25, in the case of a semi-insulating substrate 102, isolation trenches may be formed around the anode pads to isolate the regions beneath from one another (e.g., to reduce parasitic capacitance from anode to anode through the epitaxial layers of epitaxial structure 104). For simplicity, FIGS. 24 and 25 do not show trenches 128 around each VCSEL 100 for connecting to bottom conductive layer 118 to first metal layer 122-1. The left portion of FIG. 26 shows a plan view of second metal layer 122-2 formed over first metal layer 122-1 to connect the anodes in the columns of the array of VCSELs 100. In FIG. 26, a dashed box indicates where a thermal contact pad overlays the array of VCSELs 100. In some implementations, as indicated in FIG. 26, the thermal contact pad is formed using third metal layer 122-3, and may be formed on third isolation layer 124-3 (formed on second metal layer 122-2). For purposes of clarity, layers below metal layer 122-1 are not labeled in FIG. 26.

Notably, spacing between rows and columns of VCSELs 100 may be narrow, such that contact pads for the cathodes (identified as C1 through C4) and contact pads for the anodes (identified as A1 through A4) may be fanned out to a wider pitch (e.g., to permit greater spacing for the purposes of flip-chip bonding). The right portion of FIG. 26 also shows an example cross-section between two columns of anodes (A3 and A4) and a cross-section between two rows of cathodes (C1 and C2). As described above, and as shown in the cross-section between cathodes C1 and C2, isolation trenches can be formed between rows of VCSELs 100. Without photolithography being required in the isolation trench and using the oxide trenches for the n-contact, tight spacing (e.g., less than approximately 40 μm) between rows is permitted. Further, because each row has a cathode along it, there will be little difference in power conversion efficiency (e.g., as compared to designs using VCSELs without dense epi-side contacts). However, the use of VCSELs 100 having dense epi-side contacts for such an array of VCSELs 100 permits a comparatively more compact and easier to fabricate array.

In some implementations, as illustrated in FIG. 27, a row-column addressable array of VCSELs 100 may be used to power any single VCSEL 100 or group of VCSELs 100 along selected columns and rows. Notably, arbitrary patterns are not possible to power, but a limited set of patterns may be helpful in some applications, such as a 3D sensing application. For example, in a ToF 3D sensing system, it may be desirable to illuminate smaller sub-arrays of VCSELs 100 to reduce an amount of current required (e.g., as compared to illuminating all VCSELs 100 at once). One example partitioning of an array of VCSELs 100 into sub-arrays is to divide the array into different rows (or columns). Such partitioning may be achieved by patterning the anode layer and having all the rows share a common cathode. Notably, such a design may not require some features of row-column addressable arrays outlined above. However, as the number of emitters in a row (or column) increases, resistance to reaching an end of a given row (or column) becomes higher. To reduce voltage drop, it may therefore be useful to further sub-divide the VCSELs energized at once into segments of rows or segments of columns. The individually addressable row-column scheme described above makes such a sub-division possible.

The number and arrangement of layers shown in FIGS. 24-27 are provided as examples. In practice, VCSEL 100 and/or a connection between arrays of VCSELs 100 may include additional layers, fewer layers, different layers, differently arranged layers, layers of different thicknesses, layers of different relative thicknesses, layers having different patterning, and/or the like, than those shown in FIGS. 24-27. Further, the number and arrangement of arrays of VCSELs 100 shown in FIGS. 24-27 are provided as examples. In practice, an array of VCSELs 100 may include additional VCSELs 100, fewer VCSELs 100, a different number of VCSELs 100, differently arranged VCSELs 100, differently arranged contact pads, and/or the like, than those shown in FIGS. 24-27.

In some implementations, as noted above, VCSEL 100 having dense epi-side contact may be a top-emitting VCSEL. In some implementations, use of a top-emitting VCSEL 100 having dense epi-side contacts may also provide for lower lateral resistance for monolithically interconnected series arrays or isolated monolithic arrays, in a similar manner as described above. Additionally, efficiency improvements from VCSELs 100 having dense epi-side contacts for arrays with long cavities (and higher power per emitter) may benefit top-emitting arrays of the same type.

Figure 28:
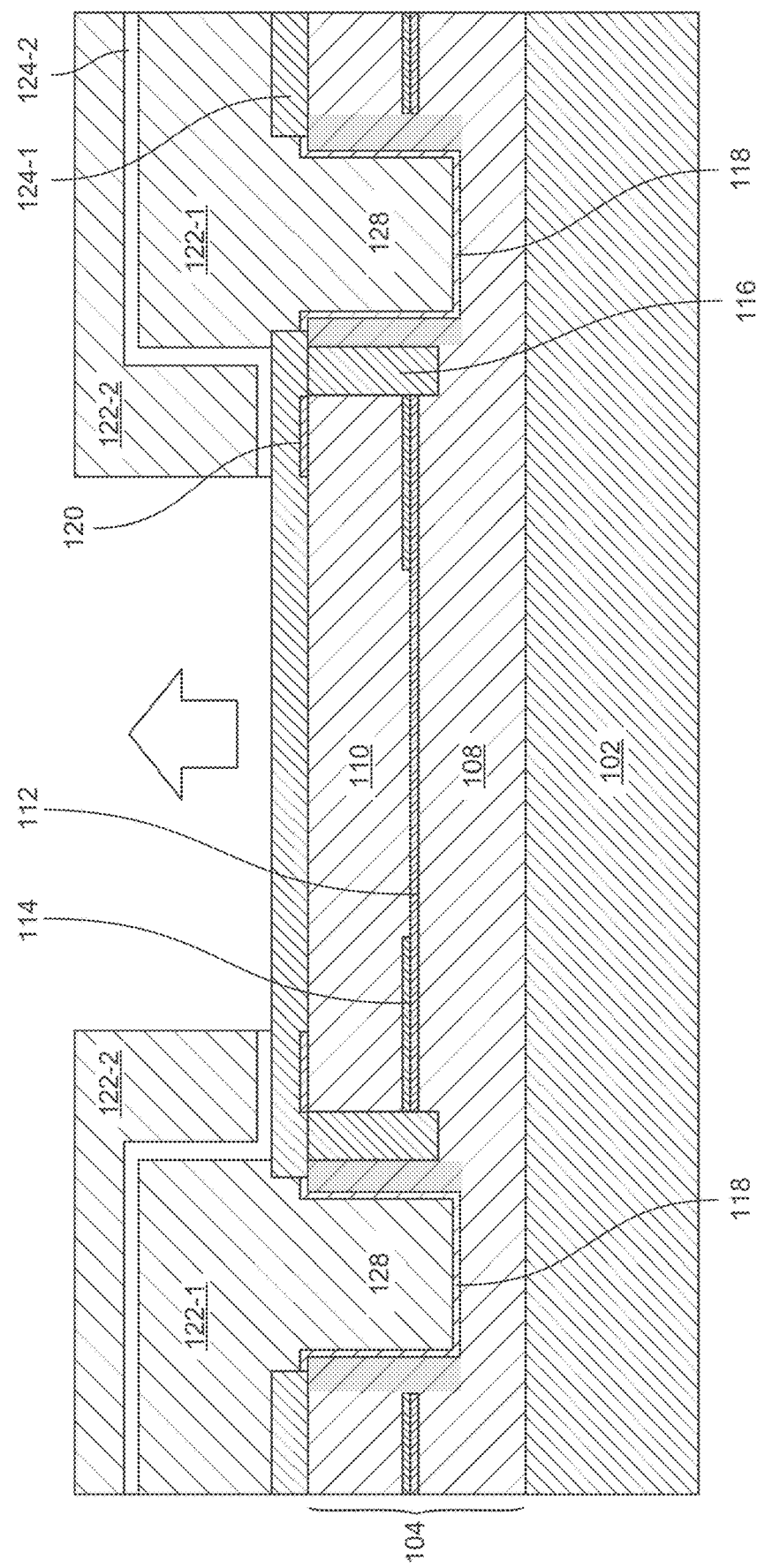
FIGS. 28-32.5 are diagrams illustrating examples associated with a top-emitting VCSEL having dense electrical contacts on an epitaxial side of a substrate, as described herein.

FIG. 28 is a diagram of an example cross-section of a design for a top-emitting VCSEL 100 having epi-side electrical contacts (e.g., anode and cathode contacts). In some implementations, an array of top-emitting VCSELs 100 can be formed using the design shown in FIG. 28. In some implementations, as shown in FIG. 28 and similar to bottom-emitting implementations described herein, a first electrical contact (e.g., a cathode) may be formed in a bottom of a trench 128 used for oxidation. In some implementations, as shown in FIG. 28 and similar to bottom-emitting implementations described herein, a conductive layer (e.g., bottom conductive layer 118 or a seed metal for first metal layer 122-1) may be formed directly against epitaxial structure 104 along a sidewall of trench 128, which permits deposition of the conductive layer without any photolithographic features within trench 128. In some implementations, as shown in FIG. 28, bottom conductive layer 118 may lie against both a bottom of trench 128 and the sidewall. Alternatively, bottom conductive layer may be deposited by evaporation and liftoff such that bottom conductive layer 118 lies against the bottom of trench 128 (and in a ring around trench 128 at a surface of trench 128) but with little or no deposition on the sidewall of trench 128. Notably, such a method does not require formation of photolithographic features in trench 128.

Figure 29:
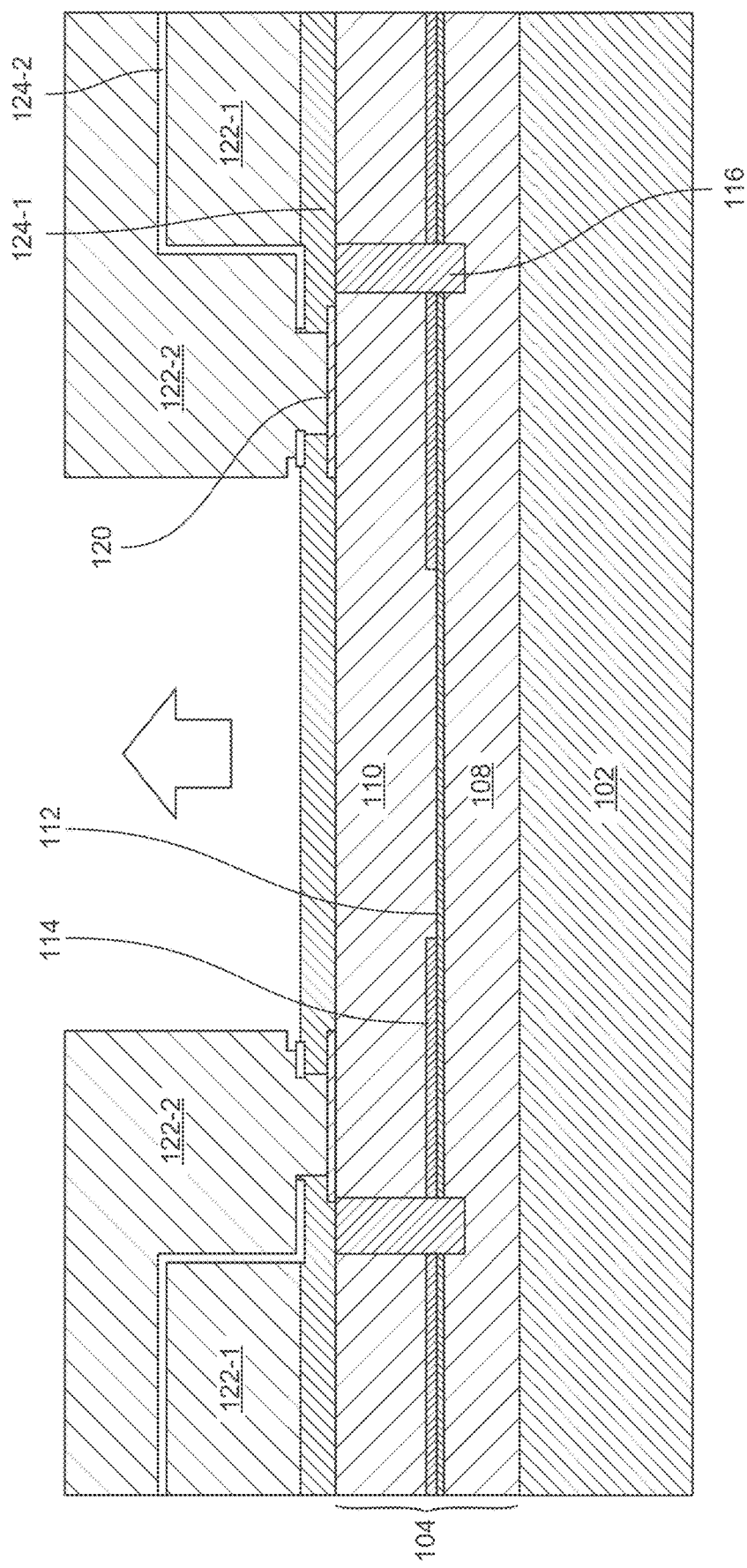
Figure 30:
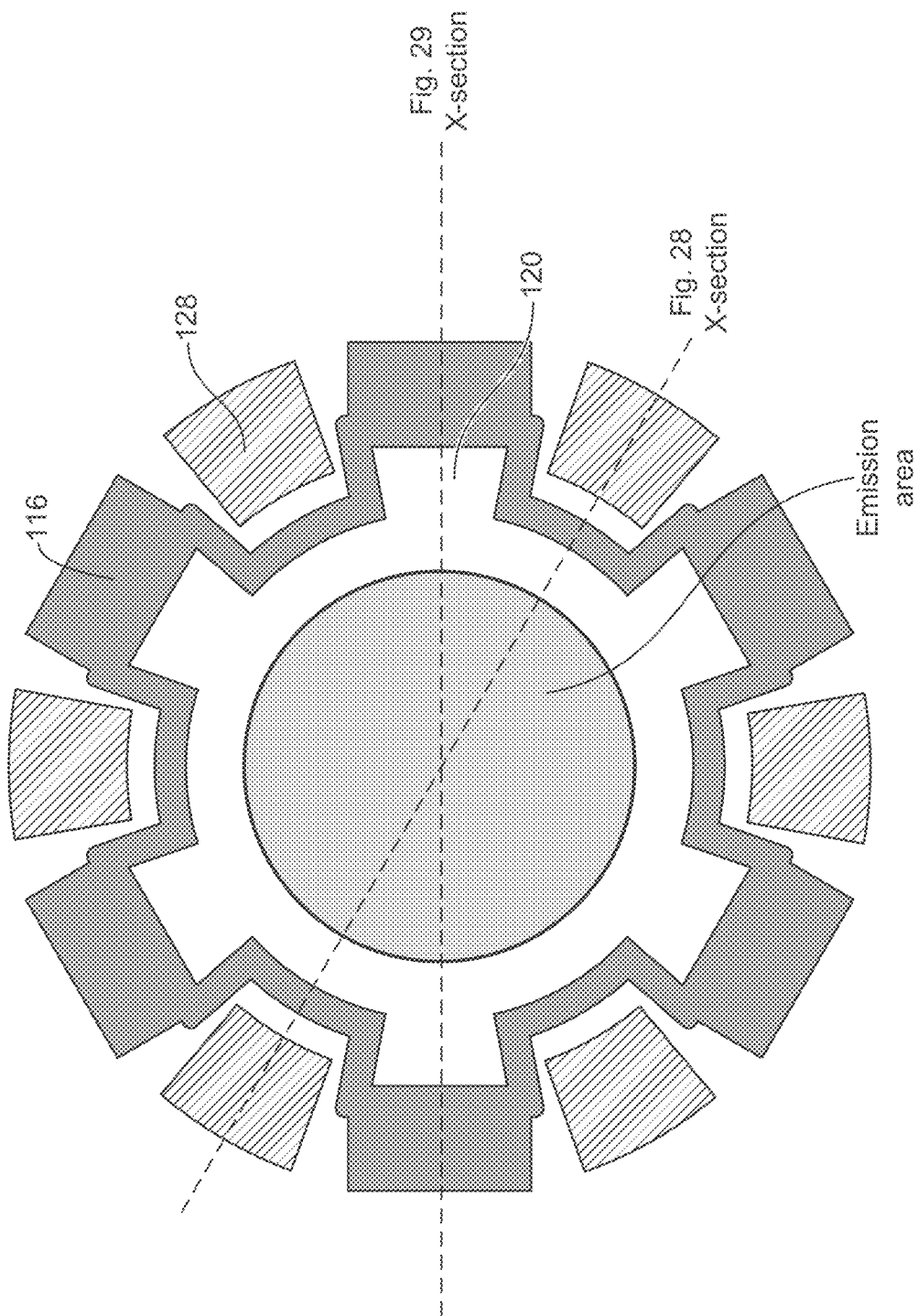

In some implementations, as shown in FIG. 28, isolation implant 116 may be formed around an oxide aperture of VCSEL 100 (e.g., as defined by oxidation layer 114) but within the inner radius of trenches 128. Second metal layer 122-2 (e.g., associated with providing an anode connection) is shown in FIG. 28, but does not connect to top conductive layer 120 in this cross-section. FIG. 29 shows a cross-section of a top-emitting VCSEL 100 in which second metal layer 122-2 connects to top conductive layer 120. FIG. 30 is a diagram illustrating a plan view of the example top-emitting VCSEL 100 shown in FIGS. 28 and 29, including lines corresponding to the cross-sections shown in FIGS. 28 and 29.

For purposes of clarity, the plan view shown in FIG. 30 does not show first metal layer 122-1 or second metal layer 122-2. Rather, FIG. 30 shows a plan view illustrating a ring formed by top conductive layer 120, trenches 128, and a region of isolation implant 116. In this example, isolation implant 116 does not isolate regions under top conductive layer 120, an emission area, or trenches 128 (in which bottom conductive layer 118 is formed). In this design, regions that are not implanted may be rather narrow (e.g., less than approximately 4 μm, and possibly less than approximately 2 μm) in regions between trenches 128 and top conductive layer 120. Notably, features of such narrow width would be difficult to define with a thick photoresist layer (e.g., which may be greater than 6 μm thick to protect the semiconductor from a deep isolation implant).

Figure 31:
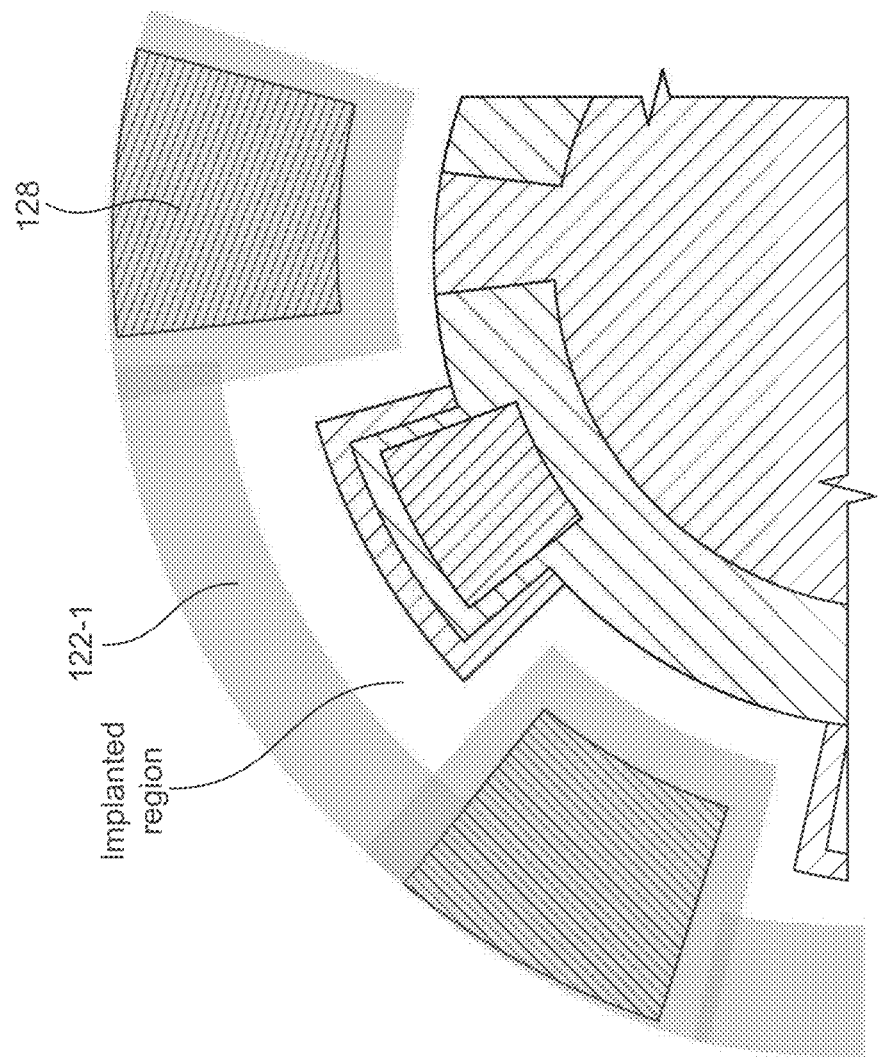

However, in some implementations, first metal layer 122-1 (e.g., which serves as an interconnect for the cathode) may be used to protect trenches 128 from ion implantation. FIG. 31 is a diagram of an example layout of first metal layer 122-1 around a top-emitting VCSEL 100. Notably, although not shown in FIG. 31, first metal layer 122-1 may extend into a field region (i.e., a region beyond an outer radius of trench 128), in some implementations. In some implementations, as illustrated in FIG. 31, first metal layer 122-1 may link bottom conductive layer 118 from one trench 128 to an adjacent trench 128 (e.g., in order for current to traverse the array of top-emitting VCSELs 100 through metal rather than semiconductor). In some implementations, if top-emitting VCSELs 100 are closely spaced, there may not be sufficient space in the field region to link adjacent trenches, and a pattern for first metal layer 122-1 may use an arc between trenches 128 within each VCSEL 100 area.

Figure 32:
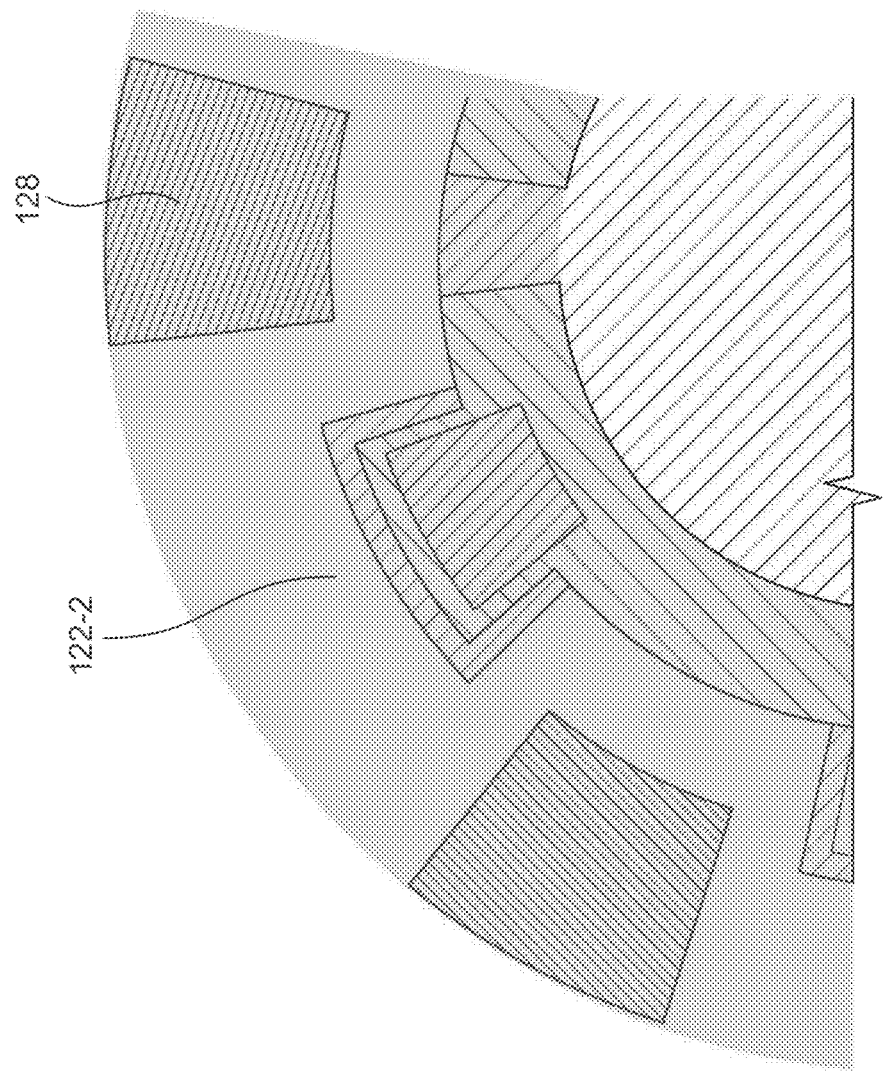

Returning to the discussion of the implantation mask—when first metal layer 122-1 protects trenches 128 as described above, photoresist may be used to protect the emission area and top conductive layer 120 of the top-emitting VCSEL 100 from implantation without a need to define narrow gaps in the photoresist. Here, the implantation is then masked by photoresist in the region of the emission area and top conductive layer 120, and first metal layer 122-1 masks regions beneath first metal layer 122-1. Thus, implantation only occurs within a gap between these two regions. In FIG. 31, the implantation region is a shown as a white space between the patterned first metal layer 122-1 and the inner hatched areas shown in FIG. 31. In some implementations, an isolation layer 124-2 may be formed on first metal layer 122-1 to isolate first metal layer 122-1 and second metal layer 122-2, as needed. FIG. 32 is a diagram of an example layout of second metal layer 122-2 around a top-emitting VCSEL 100. In some implementations, as indicated in the cross-section of FIG. 29, second metal layer 122-2 may connect to top conductive layer 120 through a via in first isolation layer 124-1.

As shown previously in FIGS. 18 and 19, monolithic series arrays may be constructed by patterning metal layers 122-1 and 122-2 appropriately to link cathodes of one array to anodes of another array. In the case of arrays of top emitting VCSELs 100, metal layer 122-3 may be omitted (e.g., as in FIG. 18) in the case of sub-arrays arranged in a line although for other (e.g., concentric) arrangements, metal layer 122-3 may be needed, as discussed below. Without metal layer 122-3, fabrication for a top-emitting emitter may have the same number of steps as fabrication of sub arrays arranged side-by-side and connected electrically in series.

As described above in association with FIG. 21 for bottom-emitting VCSELs 100, fabrication of concentric arrays monolithically interconnected in series may utilize third isolation layer 124-3 and third metal layer 122-3 to bring a first electrical contact (e.g., a cathode) of a first array of VCSELs 100 to a contact pad. This technique is also applicable to such connection of arrays of top-emitting VCSELs 100, although the connect pad may need to be outside of a region including the VCSELs 100 (e.g., in order for wirebonds not to block the light).

In the case of concentric isolated monolithic arrays, third isolation layer 124-3 and third metal layer 122-3 may be needed in order for an array of top-emitting VCSELs 100 to bring the electrical contacts for an inner region of VCSELs to respective bond pads. However, fourth isolation layer 124-4 and fourth metal layer 122-4 shown in FIG. 22 are not required for concentric isolated monolithic arrays of top-emitting VCSELs 100.

In some implementations for an array of top-emitting VCSELs 100, third isolation layer 124-3 and third metal layer 122-3 may be deposited to permit interconnections described above without blocking emitter openings. However, third isolation layer 124-3 may be a conformal layer (e.g., deposited as a blanket film) and may be non-uniform over an emission area when a relatively thick metal layer 122 (e.g., first metal layer 122-1 or second metal layer 122-2) is present. In such a case, third isolation layer 124-3 may be selectively removed from the emission area.

Top emitting arrays with dense epi-side contacts may also be laid out as row-column addressable sub-arrays as those described for bottom emitting VCSELs with dense epi-side contacts. In some implementations, a similar configuration to those shown in FIGS. 24, 25, and 26 are applicable. However, metal layers 122-1, 122-2, and 122-3 (if applied) need openings over emission regions through which light can pass. In some implementations, isolation layer 124-3 and metal layer 122-3 may not be necessary for a top-emitting array because such chips are generally bonded to the chip backside and wire-bonded to the contacts on the top side. However, the anode to cathode traces may traverse a long length (e.g., one millimeter or more) and it may be desired to have a ground plane in close proximity to reduce inductance when driving the array with short (e.g., few nanosecond or shorter) pulses. For such purpose, isolation layer 124-3 and metal layer 122-3 may be helpful. Furthermore, as shown in FIG. 32.5, the layout of metal layer 122-3 may extend to edges of the chip near other contact pads to facilitate wire-bonding to this RF ground plane. For even lower inductance, additional contacts to the ground plane may be laid out between the anode contacts (e.g., A1 to A4) and between cathode contacts (e.g., C1 to C4), at the cost of increased die area.

The number and arrangement of layers shown in FIGS. 28-32.5 are provided as examples. In practice, VCSEL 100 may include additional layers, fewer layers, different layers, differently arranged layers, layers of different thicknesses, layers of different relative thicknesses, layers having different patterning, and/or the like, than those shown in FIGS. 28-32.5.

Figure 33:
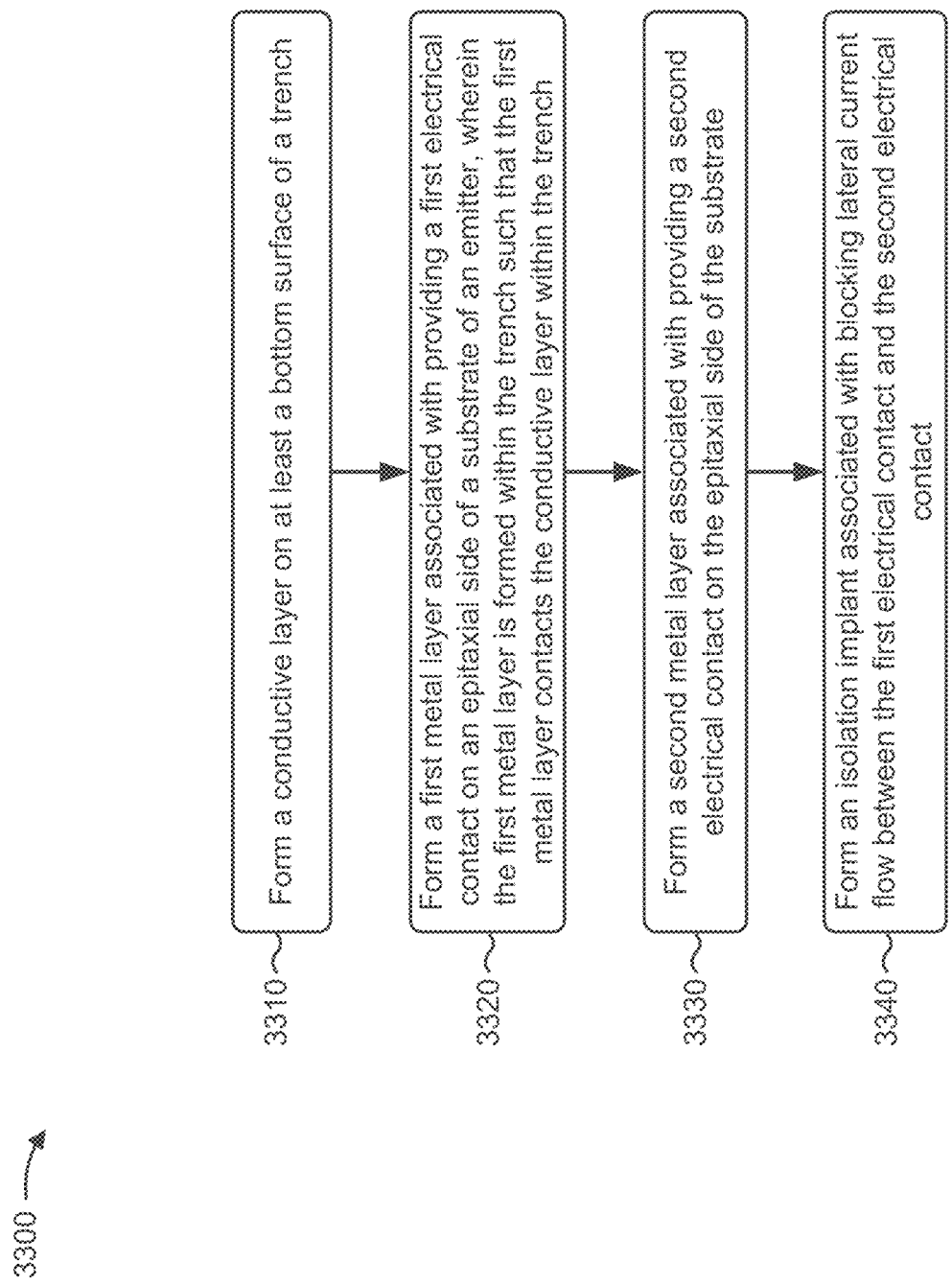
FIG. 33 is a flowchart of an example process for forming a VCSEL including dense electrical contacts on an epitaxial side of a substrate, as described herein.

FIG. 33 is a flowchart of an example process 3300 for forming VCSEL 100 including dense electrical contacts on an epitaxial side of substrate 102, as described herein.

As shown in FIG. 33, process 3300 may include forming a conductive layer on at least a bottom surface of a trench (block 3310). For example, a conductive layer (e.g., bottom conductive layer 118 or a seed metal of first metal layer 122-1) may be formed on a bottom surface of trench 128, as described above.

As further shown in FIG. 33, process 3300 may include forming a first metal layer associated with providing a first electrical contact on an epitaxial side of a substrate of an emitter (block 3320). For example, first metal layer 122-1, associated with providing a first electrical contact (e.g., a cathode) on an epitaxial side of substrate 102 of VCSEL 100 may be formed, as described above. In some implementations, first metal layer 122-1 may be formed within trench 128 such that first metal layer 122-1 contacts the conductive layer within trench 128.

As further shown in FIG. 33, process 3300 may include forming a second metal layer associated with providing a second electrical contact on the epitaxial side of the substrate (block 3330). For example, second metal layer 122-2 associated with providing a second electrical contact (e.g., an anode) on the epitaxial side of substrate 102 may be formed, as described above.

As further shown in FIG. 33, process 3300 may include forming an isolation implant associated with blocking lateral current flow between the first electrical contact and the second electrical contact (block 3340). For example, isolation implant 116 associated with blocking lateral current flow between the first electrical contact and the second electrical contact may be formed, as described above.

Process 3300 may include additional implementations, such as any single implementation or any combination of implementations described below and/or in connection with one or more other processes described elsewhere herein.

In some implementations, the conductive layer, a seed metal for first metal layer 122-1, and first metal layer 122-1 are formed without any photolithographic features within trench 128.

In some implementations, during the forming of isolation implant 116, first metal layer 122-1 serves as a mask over an area surrounding an aperture of VCSEL 100 (e.g., an aperture defined by oxidation layer 114).

In some implementations, during the forming of isolation implant 116, first metal layer 122-1 serves as a mask over an emission area of VCSEL 100.

In some implementations, during the forming of isolation implant 116, a photoresist serves as a mask over an emission area of VCSEL 100.

In some implementations, isolation implant 116 surrounds an aperture of VCSEL 100 (e.g., an aperture defined by oxidation layer 114) and is between the aperture and an interior sidewall of trench 128.

In some implementations, a bottom of trench 128 is within contact layer 106 of VCSEL 100.

In some implementations, a width of trench 128 is less than or equal to approximately 10 microns. In some implementations, a width of trench 128 is smaller than a depth of trench 128.

In some implementations, a portion of first metal layer 122-1 contacts a portion of second metal layer 122-2 over an emission area of VCSEL 100. In some implementations, first metal layer 122-1 is not present over an emission area of VCSEL 100.

In some implementations, the conductive layer includes bottom conductive layer 118 (e.g., an ohmic contact layer) or a seed layer of first metal layer 122-1.

In some implementations, VCSEL 100 is a bottom-emitting VCSEL. In some implementations, VCSEL 100 is a top-emitting VCSEL.

In some implementations, VCSEL 100 is included in an emitter array in which a center-to-center distance between a given pair of VCSELs 100 is less than approximately 50 microns.

In some implementations, VCSEL 100 is included in an emitter array in which the first electrical contact and the second electrical contact are shared among a group of VCSELs 100 including VCSEL 100.

In some implementations, VCSEL 100 is included in an emitter array in which VCSEL 100 is connected in parallel with another VCSEL 100.

In some implementations, VCSEL 100 is included in an emitter array comprising a thermal contact that is present over an emission area of VCSEL 100. In some implementations, a contact pad associated with the second electrical contact serves as the thermal contact. In some implementations, a contact pad associated with the first electrical contact serves as the thermal contact. In some implementations, the thermal contact is provided by a contact pad that is separate from the second electrical contact and the first electrical contact.

In some implementations, the second electrical contact is an anode contact, and VCSEL 100 is included in an emitter array comprising more than one anode contact.

Although FIG. 33 shows example blocks of process 3300, in some implementations, process 3300 may include additional blocks, fewer blocks, different blocks, or differently arranged blocks than those depicted in FIG. 33. Additionally, or alternatively, two or more of the blocks of process 3300 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An emitter array, comprising:
   a substrate;
   a plurality of emitters on an epitaxial side of the substrate, the plurality of emitters including a first emitter and a second emitter in a column of the emitter array;
   a first metal layer to provide a first lower electrode of the first emitter in the epitaxial side of the substrate
   a second metal layer to provide a second lower electrode of the second emitter in the epitaxial side of the substrate;
   an isolation trench in the epitaxial side of the substrate separating the first emitter and the second emitter;
   an isolation implant in the substrate through a bottom of the isolation trench, the isolation implant configured to electrically isolate the first lower electrode from the second lower electrode; and
   a third metal layer to provide an upper electrode on the epitaxial side of the substrate,
      wherein the upper electrode is shared among the first emitter and the second emitter, and
      wherein a center-to-center distance between the first emitter and the second emitter is less than approximately 90 micrometers.

2. The emitter array of claim 1, wherein a width of the isolation trench is less than or equal to approximately 10 micrometers.

3. The emitter array of claim 1, wherein a width of the isolation trench is less than a depth of the isolation trench.

4. The emitter array of claim 1, wherein the first emitter is connected in parallel with the second emitter.

5. The emitter array of claim 1, further comprising:
   a third emitter of the plurality of emitters; and
   a fourth metal layer to provide a second upper electrode of the third emitter on the epitaxial side of the substrate,
      wherein the first lower electrode is shared among the first emitter and the third emitter, and the second upper electrode is isolated from the upper electrode.

6. The emitter array of claim 5, wherein the third emitter is in a second column of the emitter array,
   wherein the first emitter and the third emitter are in a first row of the emitter array, and
   wherein the second emitter is in a second row of the emitter array.

7. The emitter array of claim 6, wherein the column and the second column are orthogonal to the first row and the second row.

8. The emitter array of claim 5, wherein a center-to-center distance between the first emitter and the third emitter is equal to the center-to-center distance between the first emitter and the second emitter.

9. The emitter array of claim 5, wherein the first lower electrode extends over the epitaxial side of the substrate between the first and third emitters.

10. The emitter array of claim 1, wherein the isolation implant extends along sides of the isolation trench separating the first emitter and the second emitter.

11. The emitter array of claim 10, wherein the isolation implant is configured to electrically isolate the first lower electrode from the upper electrode with respect to the first emitter,
    wherein the isolation implant is configured to electrically isolate the second lower electrode from the upper electrode with respect to the second emitter.

12. The emitter array of claim 1, wherein the center-to-center distance between the first emitter and the second emitter spans the isolation trench.

13. The emitter array of claim 1, wherein the first lower electrode and the second lower electrode are cathodes, and wherein the upper electrode is an anode.

14. A method comprising:
    forming a first metal layer associated with providing a first lower electrode of a first emitter in an epitaxial side of a substrate of an emitter array
    forming a second metal layer associated with providing a second lower electrode of a second emitter in the epitaxial side of the substrate;
    forming an isolation trench in the epitaxial side of the substrate associated with separating the first emitter and the second emitter;
    forming an isolation implant in the substrate through a bottom of the isolation trench, the isolation implant associated with electrically isolating the first lower electrode from the second lower electrode; and
    forming a third metal layer associated with providing an upper electrode on the epitaxial side of the substrate,
       wherein the upper electrode is shared among the first emitter and the second emitter, and
       wherein a center-to-center distance between the first emitter and the second emitter is less than approximately 90 micrometers.

15. The method of claim 14, further comprising:
    forming a fourth metal layer associated with providing a second upper electrode of a third emitter on the epitaxial side of the substrate,
       wherein the first lower electrode is shared among the first emitter and the third emitter, and the second upper electrode is isolated from the upper electrode.

16. The method of claim 14, wherein forming the isolation implant comprises:
    forming the isolation implant along sides of the isolation trench separating the first emitter and the second emitter.

17. The method of claim 16, wherein the isolation implant is associated with electrically isolating the first lower electrode from the upper electrode with respect to the first emitter,
    wherein the isolation implant is associated with electrically isolating the second lower electrode from the upper electrode with respect to the second emitter.

18. The method of claim 14, wherein a width of the isolation trench is less than or equal to approximately 10 micrometers.

19. The method of claim 14, wherein a width of the isolation trench is less than a depth of the isolation trench.

20. The method of claim 14, wherein the center-to-center distance between the first emitter and the second emitter spans the isolation trench.

* * * * *